United States Patent [19]

Shimizu et al.

[11] 4,409,308

[45] Oct. 11, 1983

[54] PHOTOCONDUCTIVE MEMBER WITH TWO AMORPHOUS SILICON LAYERS

[75] Inventors: Isamu Shimizu, Yokohama; Shigeru Shirai, Yamato; Eiichi Inoue, Tokyo, all of Japan

[73] Assignee: Canon Kabuskiki Kaisha, Tokyo, Japan

[21] Appl. No.: 308,238

[22] Filed: Oct. 2, 1981

[30] Foreign Application Priority Data

| Oct. 3, 1980 | [JP] | Japan | 55-138980 |
| Oct. 3, 1980 | [JP] | Japan | 55-138981 |
| Oct. 8, 1980 | [JP] | Japan | 55-140960 |
| Oct. 8, 1980 | [JP] | Japan | 55-140961 |
| Oct. 8, 1980 | [JP] | Japan | 55-140962 |

[51] Int. Cl.$^3$ .......................... G03G 5/14; G03G 5/04
[52] U.S. Cl. ..................................... 430/60; 430/63; 430/65; 430/84
[58] Field of Search .................. 430/84, 62, 64, 66, 430/95, 60

[56] References Cited

U.S. PATENT DOCUMENTS

| 3,041,166 | 6/1962 | Bardeen . | |
| 4,217,374 | 8/1980 | Ovshinsky et al. . | |
| 4,225,222 | 9/1980 | Kempter . | |
| 4,226,898 | 10/1980 | Ovshinsky et al. | 427/39 |
| 4,265,991 | 5/1981 | Hirai . | |

*Primary Examiner*—John E. Kittle
*Assistant Examiner*—John L. Goodrow
*Attorney, Agent, or Firm*—Fitzpatrick, Cella, Harper & Scinto

[57] ABSTRACT

A photoconductive member comprises a support, a photoconductive layer constituted of an amorphous material containing silicon atoms as matrix and containing hydrogen atoms or halogen atoms, and an intermediate layer provided between them, said intermediate layer having a function to bar penetration of carriers from the side of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and oxygen atoms as constituents. A photoconductive member having a support, a photoconductive layer constituted of an amorphous material containing silicon atoms as matrix and containing hdyrogen atoms or halogen atoms as a constituent, and an intermediate layer provided between said support and said photoconductive layer, is characterized in that said intermediate layer is constituted of an amorphous material containing silicon atoms and oxygen atoms as constituent. A photoconductive member having a support a photoconductive layer constituted of an amorphous material containing silicon atoms as matrix and containing hydrogen atoms or halogen atoms as a constituent, and an intermediate layer provided between said support and said photoconductive layer, characterized in that said intermediate layer is constituted of an amorphous material containing silicon atoms and oxygen atoms as constituent.

98 Claims, 15 Drawing Figures

PHOTOCONDUCTIVE MEMBER WITH TWO AMORPHOUS SILICON LAYERS

BACKGROUND OF THE INVENTION

1. Field of the Invention

This invention relates to a photoconductive member having a sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute solid state image pickup devices, image forming members for electrophotography in the field of image formation, or photoconductive layers in manuscript reading devices, are required to have a high sensitivity, a high SN ratio [photo-current($I_P$)/dark current ($I_D$)], spectral characteristics corresponding to those of electromagnetic waves to be projected, a good light-response, a desired dark resistance value as well as no harm to human bodies during usage. Further, in an image pickup device, it is also required that the residual image should easily be treated within a predetermined time. In particular, in the case of image forming members for electrophotography to be assembled into an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German Laid-open Patent Publication Nos. 2,746,967 and 2,855,718 disclose applications of a-Si for use in image forming members for electrophotography, and British Laid-open Patent Publication No. 2,029,642 an application of a-Si for use in a photoelectric conversion reading device. However, the photoconductive members having photoconductive layers constituted of a-Si of prior art have various electrical, optical and photoconductive characteristics such as dark resistivity, photosensitivity and light-response as well as environmental characteristics in use such as weathering resistance and humidity resistance, which should further be improved. Thus, in a practical solid state image pickup device, reading device, an image forming member for electrophotography, and the like, they cannot effectively used also in view of their productivity and possibility of their mass production.

For instance, when applied in an image forming member for electrophotography or an image pickup device, residual potential is frequently observed to be remained during use thereof. When such a photoconductive member is repeatedly used for a long time, there will be caused various inconveniences such as accumulation of fatigues by repeated use or so called ghost phenomenon wherein residual images are formed.

Further, according to a number of experiments by the present inventors, a-Si material constituting the photoconductive layer of an image forming member for electrophotography, while it has a number of advantages, as compared with Se, ZnO or organic photoconductive materials such as PVCz, TNF, and the like of prior art, is also found to have several problems to be solved. Namely, even if charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional photographic process. This tendency is further pronounced under a humid atmosphere to such an extent in some cases that no charge is retained at all before development.

Thus, it is required upon designing a photoconductive material to make efforts to obtain desirable electrical, optical, and photoconductive characteristics along with the improvement of a-Si materials per se.

The present invention was accomplished to solve the above-mentioned problems. The followings have been found as a result of extensive studies made comprehensively from the standpoints of applicability and utility of a-Si as a photoconductive member for image forming member for electrophotography, image pickup devices or reading devices. It has now been found that a photoconductive member manufactured to have a layer structure comprising a photoconductive layer of a so called hydrogenated amorphous silicon (hereinafter referred to as a-Si:H), which is an amorphous material containing hydrogen in a matrix of silicon, or a so called halogenated amorphous silicon (hereinafter referred to as a-Si:X), which is an amorphous material containing halogen atoms (X) in a matrix of silicon atoms, and a specific intermediate layer interposed between said photoconductive layer and a support which supports said photoconductive layer, is not only actually useful but also superior in substantially all in comparison with of photoconductive members of prior art, especially markedly excellent characteristics as a photoconductive member for electrophotography. The present invention is based on this finding.

SUMMARY OF THE INVENTION

The primary object of the present invention is to provide a photoconductive member having constantly stable electrical, optical and photoconductive characteristics, which is an all-environment type substantially without limitations with respect to the environment under which it is used, being markedly resistant to light-fatigue without deterioration after repeated use and free entirely or substantially from residual potentials observed.

Another object of the present invention is to provide a photoconductive member, having a high photosensitivity with a spectral sensitive region covering substantially all over the region of visible light, and having also a rapid light-response.

Still another object of the present invention is to provide a photoconductive member, which is sufficiently capable of bearing charges at the time of charging treatment for formation of electrostatic images to the extent such that a conventional electrophotographic process can be applied when it is provided for use as an image forming member for electrophotography, and which has excellent electrophotographic characteristics of which substantially no deterioration is observed even under a highly humid atmosphere.

Further, still another object of the present invention is to provide a photoconductive member for electrophotography capable of providing easily a high quality image which is high in density, clear in halftone and high in resolution.

According to one aspect of the present invention, there is provided a photoconductive member having a support, a photoconductive layer constituted of an amorphous material containing silicon atoms as matrix and containing hydrogen atoms or halogen atoms as a constituent, and an intermediate layer provided between said support and said photoconductive layer, characterized in that said intermediate layer is constituted of an amorphous material containing silicon atoms and oxygen atoms as constituents.

According to another aspect of the present invention is provided a photoconductive member comprising a support, a photoconductive layer constituted of an amorphous material containing silicon atoms as matrix and containing hydrogen atoms or halogen atoms, and an intermediate layer provided between them, said intermediate layer having a function to bar penetration of carriers from the side of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and oxygen atoms as constituents.

DETAILED DESCRIPTION OF THE PREFERRED EMBODIMENTS

Figure 1:
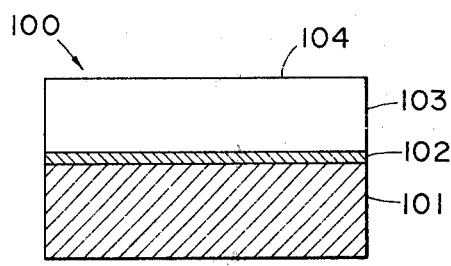
FIGS. 1 through 12 show schematic sectional views of the embodiment of the photoconductive members according to the present invention, respectively.

Referring now to the drawings, the photoconductive members according to the present invention are to be described in detail below.

FIG. 1 shows a schematic sectional view for illustration of the basic embodiment of the photoconductive member of this invention.

The photoconductive member 100 as shown in FIG. 1 is one of the most basic embodiment, having a layer structure comprising a support 101 for photoconductive member, an intermediate layer 102 provided on said support and a photoconductive layer 103 provided in direct contact with said intermediate layer 102.

The support 101 may be either electroconductive or insulating. As the electroconductive material, there may be mentioned metals such as NiCr, stainless steel, Al, Cr, Mo, Au, Ir, Nb, V, Ti, Pt, Pd, etc. or alloys thereof.

As insulating supports, there may be usually used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating supports may suitably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) thereon. Alternatively, a synthetic resin film such as polyester film can be subjected to the electroconductive treatment on its surface by vapor deposition, electron-beam deposition or sputtering of a metal such as NiCr, Al, Ag, Pb, Zn, Ni, Au, Cr, Mo, Ir, Nb, Ta, V, Ti, Pt, and the like or by laminating treatment with said metal. The support may be shaped in any form such as cylinders, belts, plates, and the like, and its form may be determined as desired. For example, when the photoconductive member 100 is to be used as an image forming member for electrophotography, it may desirably be formed into an endless belt or a cylinder for use in continuous high speed copying. The support may have a thickness, which is suitably determined so that a photoconductive member is desired may be formed. When the photoconductive member is required to have a flexibility, the support is made as thin as possible, so far as the function of a support can be sufficiently exhibited. However, in such a case, the thickness is generally 10μ or more from the points of fabrication and handling of the support as well as its mechanical strength.

The intermediate layer 102 is constituted of a non-photoconductive amorphous material containing silicon atoms (Si) and oxygen atoms (O) (hereinafter referred to as a-$Si_xO_{1-x}$, wherein, $0<x<1$), which has the function of a so called barrier layer capable of barring effectively penetration of carriers into the photoconductive layer 103 from the side of the support 101 and permitting easily the photocarriers, which are generated by projection of electromagnetic waves in the photoconductive layer 103 and migrate toward the support 101 to pass therethrough from the side of the photoconductive layer 103 to the side of the support 101.

The intermediate layer 102 constituted of a-$Si_xO_{1-x}$ may be formed by a sputtering method, an ion implantation method, an ion plating method, an electron-beam method or the like. These production methods are suitably selected depending on the factors such as production conditions, the degree of loading of installation capital investment, production scale, the desirable characteristics of the photoconductive members to be prepared, and the like. On the base of the advantages of relatively easy control of the conditions for preparation of photoconductive members having desired characteristics as well as easy feasibleness of introduction of oxygen atoms together with silicon atoms into the intermediate layer 102 to be prepared, it is preferred to use the sputtering method, the electron-beam method or the ion plating method.

For formation of the intermediate layer 102 by the sputtering method, a single crystalline or polycrystalline Si wafer or $SiO_2$ wafer or a wafer containing Si and $SiO_2$ mixed therein is used as target and subjected to sputtering in an atmosphere of various gases containing oxygen atoms, if necessary.

For example, when Si wafer is used as target, a gas for sputtering with a diluting gas such as He, Ne, Ar, and the like is introduced into a deposition chamber for sputtering to form a gas plasma therein and effect sputtering of the Si wafer. Alternatively, when Si wafer and $SiO_2$ wafer are used as target, a gas for diluting such as He, Ne, Ar and the like is introduced into a deposition chamber for sputtering to form a gas plasma therein and effect sputtering of the Si wafer and $SiO_2$ wafer. Still another, one sheet target of a molded mixture of Si and $SiO_2$ or $SiO_2$ wafer can be used and by introducing a gas for sputtering into a device system, sputtering may be effected in an atmosphere of the gas.

When the electron-beam method is used, there are placed respectively single crystalline or polycrystalline high purity silicon and high purity $SiO_2$ in two boats for deposition, and each may independently be irradiated by an electron beam to effect concurrently vapor deposition of both materials. Alternatively, crystalline silicon (Si) and SiO$_2$ or SiO$_2$ alone placed in the same single boat for deposition may be irradiated by a single electron beam to effect vapor deposition. The ratio of silicon atoms to oxygen atoms to be contained in the intermediate layer 102 is controlled in the former case by varying the acceleration voltage for electron beams applied on the crystalline silicon and SiO$_2$, respectively, and by the predetermined mixing ratio of crystalline silicon to SiO$_2$ in the latter.

When the ion plating method is used, various gases are introduced into a deposition tank and a high frequency electric field is applied on the coil previously rolled around the tank to effect a glow discharge, under such state Si and SiO$_2$ or SiO$_2$ are vapor deposited by utilizing the electron beam method.

The intermediate layer 102 of the present invention is formed carefully so that the characteristics required may be given exactly as desired.

In other words, a substance constituted of silicon atoms (Si) and oxygen atoms (O) can structurally take a form from a crystalline to amorphous state depending on the conditions for preparing thereof, exhibiting as electrical properties from electroconductive through semi-conductive to insulating, and from photoconductive to non-photoconductive, respectively. Hence, in the present invention, the conditions are severely selected for preparation of an a-Si$_x$O$_{1-x}$ non-photoconductive in so-called visible region.

Since the function of the intermediate layer 102 of this invention is to bar penetration of carriers from the side of the support 101 into the photoconductive layer 103, while the photocarriers generated in the photoconductive layer 103 are easily permitted to be migrated and passed therethrough to the side of the support 101, it is desirable that a-Si$_x$O$_{1-x}$ constituting the intermediate layer 102 is formed so as to exhibit insulating behaviors in the visible region.

As another critical element in the conditions for preparing a-Si$_x$O$_{1-x}$ so as to have a mobility value with respect to passing carriers to the extent that passing of photocarriers generated in the photoconductive layer 103 may be passed smoothly through the intermediate layer 102, there may be mentioned the support temperature during preparation thereof.

In other words, upon forming an intermediate layer 102 constituted of a-Si$_x$O$_{1-x}$ on the surface of the support 101, the support temperature during the layer formation is an important factor affecting the structure and characteristics of the layer formed. In the present invention, the support temperature during the layer formation is severely controlled so that the a-Si$_x$O$_{1-x}$ having the desired characteristics may be prepared exactly as desired.

In order that the objects of the present invention may be achieved effectively, the support temperature during formation of the intermediate layer 102, which is suitably selected within an optimum range depending on the method employed for formation of the intermediate layer 102 is generally 20° to 200° C., preferably 20° to 150° C.

For formation of the intermediate layer 102, it is advantageous to adopt a sputtering method or an electron beam method, since these methods can afford severe controlling of the atomic ratios constituting each layer or layer thicknesses with relative ease as compared with other methods and it is possible to form continuously the photoconductive layer 103 on the intermediate layer 102 and further a third layer to be formed on the photoconductive layer 103 in the same system, if desired. In case of forming the intermediate layer 102 according to these layer forming methods, the discharging power during layer formation may also be mentioned, similarly to the support temperature as described above, as an important factor influencing the characteristics of a-Si$_x$O$_{1-x}$ to be prepared.

In such methods for preparation of the intermediate layer, the discharging power condition for preparing effectively a-Si$_x$O$_{1-x}$ having characteristics for accomplishment of the object of this invention is generally 50 W to 250 W, preferably 80 W to 150 W.

The content of the oxygen atoms (O) in the intermediate layer 102 in the photoconductive member of this invention is also one of the important factor for forming the intermediate layer 102 with desired characteristics to achieve the object of this invention, similarly to the condition for preparation of the intermediate layer 102. The content of oxygen atoms (O) in the intermediate layer is, generally 60 to 67 atomic %, preferably 63 to 67 atomic %. As expressed alternatively, in terms of the previous representation a-Si$_x$O$_{1-x}$, x is generally 0.33 to 0.40, preferably 0.33 to 0.37.

The numerical range of the layer thickness of the intermediate layer 102 is also another important factors to achieve effectively the object of this invention.

In other words, if the layer thickness of the intermediate layer is too thin, the function of barring penetration of carriers from the side of the support 101 into the photoconductive layer 103 cannot sufficiently be fulfilled. On the contrary, if the thickness is too thick, the probability of the photocarriers generated in the photoconductive layer 103 to pass to the side of the support 101 is very small. Thus, in any of the cases, the objects of this invention cannot effectively be achieved.

The layer thickness to achieve effectively the objects of this invention is generally in the range of from 30 to 1000 Å, preferably from 50 to 600 Å, most preferably from 50 to 300 Å.

In the present invention, in order to achieve its objects effectively, the photoconductive layer 103 overlaid on the intermediate layer is constituted of a-Si:H having the semiconductor characteristics as shown below.

① p-type a-Si:H . . . Containing only acceptor or containing both donor and acceptor with higher concentration of acceptor (Na).

② p$^-$-type a-Si:H . . . A type of ① which contains acceptor at low concentration (Na), for example, being doped with an appropriate quantity of p-type impurities.

③ n-type a-Si:H . . . Containing only donor or containing both donor and acceptor with higher concentration of donor (Nd).

④ n$^-$-type a-Si:H . . . A type of ③ which contains donor at low concentration (Nd), for example, being doped lightly with n-type impurities or non-doped.

⑤ i-type a-Si:H . . . Where Na≈Nd≈0 or Na≈Nd.

In the present invention, a-Si:H constituting the photoconductive layer 103, since it is provided through the intermediate layer 102 on the support, can be one having relatively lower electric resistivity, but for obtaining better results, the photoconductive layer is preferably produced, so that the dark resistivity of the photoconductive layer formed may preferably be $5 \times 10^9 \Omega$ cm or more, most preferably $10^{10} \Omega$ cm or more.

In particular, the numerical condition for the dark resistivity values is an important factor when using the prepared photoconductive member as an image forming member for electrophotography, as a high sensitive reading device or an image pickup device to be used under low illuminance regions, or as a photoelectric converter.

In the present invention, for providing a photoconductive layer constituted of a-Si:H, hydrogen atoms (H) are incorporated during formation of such a layer in the following process.

The expression "H is contained or incorporated in a layer" herein mentioned means the state, in which "H is bonded to Si", or in which "H is ionized to be incorporated in the layer", or in which "H is incorporated in a form of $H_2$ in the layer".

As the method for incorporating hydrogen atoms (H) into the photoconductive layer, for example, silanes such as $SiH_4$, $Si_2H_6$, $Si_3H_8$, $Si_3H_{10}$ and so on is introduced in a gaseous state into a diposition device system when forming a layer, and decomposing these compounds by the glow discharge decomposition method to be incorporated in the layer simultaneously with the growth of the layer.

In forming the photoconductive layer by the glow discharge decomposition method, when a silicon hydride such as $SiH_4$, $Si_2H_6$, $Si_3H_8$, $Si_4H_{10}$ and the like is used as the starting material for supplying silicon atoms (Si), hydrogen atoms (H) are automatically incorporated in the layer when it is formed by decomposition of gases of these compounds.

When the reaction sputtering method is used, $H_2$ gas is introduced into the system wherein sputtering is effected in an atmosphere of an inert gas such as He, Ar, and a gas mixture containing these gases as the base, using Si as target, or alternatively a gas of silanes such as $SiH_4$, $Si_2H_6$, $Si_3H_8$, $Si_4H_{10}$ and the like or a gas such as $B_2H_6$, $PH_3$ to concurrently effect doping, may be introduced thereinto.

According to the experience by the present inventors, it has been found that the content of hydrogen atoms (H) in the photoconductive layer constituted of a-Si:H is one of the great factors which determine whether the photoconductive layer formed is actually useful.

In the present invention, in order that the photoconductive layer formed is sufficiently useful in practical applications, the content of hydrogen atoms (H) in the photoconductive layer is generally 1 to 40 atomic %, preferably 5 to 30 atomic %. The content of H in the layer can be controlled by the deposition support temperature or/and the quantity of the starting material to be introduced into the deposition device for incorporation of H, discharging power or others.

In order to make the photoconductive layer n-type, p-type or i-type, n-type impurity, p-type impurity or both can be added into the layer in a controlled amount during formation of the layer by the glow discharge method or the reaction sputtering method.

As the impurity to be added into the photoconductive layer to make it p-type, there may be mentioned preferably elements in Group III A of the periodic table, for example, B, Al, Ga, In, Tl, etc.

On the other hand, for obtaining a n-type, there may preferably be used elements in the Group VA of the periodic table, such as N, P, As, Sb, Bi, etc.

In case of a-Si:H, the so called non-doped a-Si:H, which is formed without addition of the n-type impurity or the p-type impurity, generally shows slightly the tendency of n-type ($n^-$-type). Accordingly, in order to obtain an i-type a-Si:H, it is necessary to add an appropriate, although very small, quantity of p-type impurity into the non-doped a-Si:H. Since a photoconductive member for electrophotography is required to have a sufficiently large dark resistivity, it is desirable to constitute a photoconductive layer of non-doped a-Si:H or an i-type a-Si:H in which a p-type impurity such as B is added in a small quantity.

The impurities as described above are contained in the layer in an amount in an order of ppm. so that it is not necessary to pay such a great attention to the pollution caused thereby as in the case of the principal ingredients constituting the photoconductive layer, but it is also preferable to use a substance which is as less pollutive as possible. From such a standpoint, also in view of the electrical and optical characteristics of the layer formed, a material such as B, As, P, Sb and the like is most preferred. In addition, for example, it is also possible to control the layer to n-type by interstitial doping of Li or others through thermal diffusion or implantation.

The amount of the impurity to be added into the photoconductive layer, which is determined suitably depending on the electrical and optical characteristics desired, but in the range of, in case of an impurity in Group III of the periodic table, generally from $10^{-6}$ to $10^{-3}$ atomic ratio, preferably from $10^{-5}$ to $10^{-4}$ atomic ratio based on silicon atoms, and, in case of an impurity in the Group V of the periodic table, generally from $10^{-8}$ to $10^{-3}$ atomic ratio based on silicon atoms, preferably from $10^{-8}$ to $10^{-4}$ atomic ratio.

Figure 2:
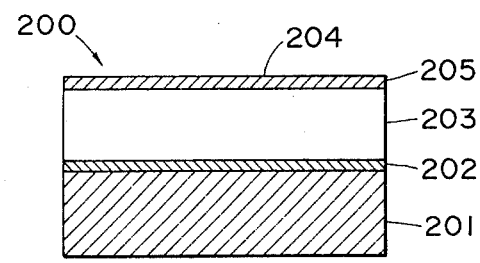

FIG. 2 shows a schematic sectional view of another embodiment of the photoconductive member of this invention. The photoconductive member 200 as shown in FIG. 2 has the same layer structure as that of the photoconductive member 100 shown in FIG. 1, except that the upper layer 205 having the same function as the intermediate layer 202 is provided on the photoconductive layer 203.

The photoconductive member 200 is provided with an intermediate layer 202 a-$Si_xO_{1-x}$ formed of the same material as that of the intermediate layer 102 so as to have the same function that of the layer 102, a photoconductive layer 203 constituted of a-Si:H similar to the photoconductive layer 103, and the upper layer 205 having the free surface 204 which is provided on said photoconductive layer 203.

The upper layer 205 has the following functions. For example, when the photoconductive member 200 is used in a manner so as to form charge images by applying charging treatment on the free surface 204, the upper layer functions to bar penetration of charges to be retained on the free surface 204 into the photoconductive layer 203, and, when projecting electromagnetic waves, also to permit easily passage of the photocarriers generated in the photoconductive layer 203 so that the carriers may be recombined with the charges at portions projected by electromagnetic waves.

The upper layer 205 may be constituted of a-$Si_xO_{1-x}$ having the same characteristics as that of the intermediate layer 202. Moreover, the upper layer may be constituted of an amorphous material comprising silicon atoms (Si) and any one of carbon atoms (C), nitrogen atoms (N), and oxygen atoms (O), which are the matrix atoms constituting the photoconductive layer 203, or the amorphous material containing further at least one of hydrogen atoms (H) and halogen atoms (X); for example, a-$Si_cO_{1-c}$ containing at least one of hydrogen atoms (H) and halogen atoms (X), a-$Si_yN_{1-y}$, a-$Si_zN_{1-z}$ containing at least one of hydrogen atoms (H) and halogen atoms (X), a-$Si_aC_{1-a}$, a-$Si_bC_{1-b}$ containing at least one of hydrogen atoms (H) and halogen atoms (X). Further, the upper layer may also be constituted of an inorganic insulating material such as $Al_2O_3$ or organic insulating materials such as polyesters, poly-p-xylylene, polyurethanes, and the like. However, in view of the productivity, mass productivity as well as the electrical and environmental stabilities during use, the material constituting the upper layer 205 is desirably a-$Si_xO_{1-x}$ having the same characteristics as that of the intermediate layer 202, a-$Si_xO_{1-x}$ containing at least one of hydrogen atoms (H) and halogen atoms (X), a-$Si_aC_{1-a}$, a-$Si_bC_{1-b}$ containing at least one of hydrogen atoms (H) and halogen atoms (X), a-$Si_yN_{1-y}$, a-$Si_zN_{1-z}$ containing at least one of hydrogen atoms (H) and halogen atoms (X).

Among these materials for forming the upper layer, proper materials may include a-$Si_aC_{1-a}$, a-$Si_bC_{1-b}$ containing at least one of hydrogen atoms (H) and halogen atoms (X), and a-$Si_zN_{1-z}$. In addition to those mentioned above, other materials suitable for constituting the upper layer 205 may include amorphous materials containing as matrix at least two of C, N and O together with silicon atoms (Si), and also containing halogen atoms and hydrogen atoms. As the halogen atom, there may be mentioned F, Cl, Br, etc.; but an amorphous material containing F is effective with respect to thermal stability.

The upper layer 205 may be formed by use of the same method and the same material as those in preparation of the intermediate layer 202. It is also possible to use the glow discharge method similarly as in formation of the photoconductive layer 103 or 203. Further, it can be formed according to the reaction sputtering method, using a gas for introduction of hydrogen atoms, a gas for introduction of halogen atoms or both thereof. Alternatively, the upper layer 205 may be formed by an ion implantation, ion plating, electron-beam method, or the like.

Among the above-mentioned methods for preparing the upper layer 205, a glow discharge method and a reaction sputtering method are preferably employed on the following ground. In these methods, the conditions for preparing photoconductive members having desirable characteristics are relatively easily controlled, and it is easily carried out to introduce atoms such as oxygen atoms, nitrogen atoms, carbon atoms, hydrogen atoms, and halogen atoms together with silicon atoms (Si) into the upper layer to be prepared.

In forming the upper layer 205 according to the glow discharge method, the procedure comprises feeding starting gases for forming the upper layer, if necessary, with a dilution gas into the vacuum deposition chamber, followed by excitation of glow discharge to form a plasma atmosphere of these gases, thereby forming an upper layer 205 on the photoconductive layer 203.

As starting materials to be used for forming the upper layer 205, there may be employed most of gaseous or gassible materials containing at least one of Si, C, N, O, H, and X as constituent atoms.

In the present invention, the starting gas to be effectively used for formation of the upper layer 205 is silanes gas such as $SiH_4$, $Si_2H_6$, $Si_3H_8$, $Si_4H_{10}$ and the like and a gas having C and H as constituent atoms, such as saturated hydrocarbons having 1 to 5 carbon atoms, ethylenic carbon atoms having 2 to 5 carbon atoms and acetylenic hydrocarbons having 2 to 4 carbon atoms.

Typical examples are saturated hydrocarbons such as methane ($CH_4$), ethane ($C_2H_6$), propane ($C_3H_8$), n-butane (n-$C_4H_{10}$), pentane ($C_5H_{12}$) and the like; ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$) and the like; and acetylenic hydrocarbons such as acetylene ($C_2H_2$), methylacetylene ($C_3H_4$), butyne ($C_4H_6$) and the like.

Typical examples of the starting gas having Si, C and H as constituent atoms are alkyl silanes such as $Si(CH_3)_4$, $Si(C_2H_5)_4$ and the like. In addition to these starting gases for formation of the upper layer, $H_2$ can of course be effectively used as the starting gas for introduction of hydrogen atoms (H).

Starting materials for incorporating halogen atoms (X) may include halogen, hydrogen halides, interhalogen compounds, silicon halides, halogen-substituted silicon hydrides, and the like. More specifically, there may be included halogen elements such as halogenic gases of fluorine, chlorine, bromine and iodine; hydrogen halides such as HF, HI, HCl, HBr, etc.; interhalogen compounds such as BrF, ClF, $ClF_3$, $ClF_5$, $BrF_5$, $BrF_3$, $IF_7$, ICl, IBr, etc.; silicon halides such as $SiF_4$, $Si_2F_6$, $SiCl_4$, $SiCl_3Br$, $SiCl_2Br_2$, $SiClBr_3$, $SiCl_3I$, $SiBr_4$, etc.; halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$; and the like.

Starting materials for incorporating nitrogen atoms may include, for example, nitrogen ($N_2$), ammonia ($NH_3$), hydrazine ($NH_2NH_2$), hydrogen azide ($HN_3$), ammonia azide ($NH_4N_3$), and the like.

Effective starting materials for incorporating oxygen atoms may include, for example, oxygen ($O_2$), ozone ($O_3$), disiloxane ($H_3SiOSiH_3$), trisiloxane ($H_3SiOSiH_2OSiH_3$), and the like.

Besides the above-mentioned starting materials for preparing the upper layer, there may include carbon monoxide (CO), carbon dioxide ($CO_2$), dinitrogen oxide ($N_2O$), nitrogen monoxide (NO), dinitrogen trioxide ($N_2O_3$), nitrogen dioxide ($NO_2$), dinitrogen tetroxide ($N_2O_4$), dinitrogen pentoxide ($N_2O_5$), nitrogen trioxide ($NO_3$), and the like.

For example, when using the glow discharge method, there may be employed a single gas such as $Si(CH_3)_4$, $SiCl_2(CH_3)_2$, and the like, or a gas mixture such as $SiH_4$-$N_2O$ system, $SiH_4$-$O_2$ (-Ar) system, $SiH_4$-$NO_2$ system, $SiH_4$-$O_2$-$N_2$ system, $SiCl_4$-NO-$H_2$ system, $SiH_4$-$NH_3$ system, $SiCl_4$-$NH_4$ system, $SiH_4$-$N_2$ system, $SiH_4$-$NH_3$-NO system, $Si(CH_3)_4$-$SiH_4$ system, $SiCl_2(CH_3)_2$-$SiH_4$ system, and the like, as starting materials for formation of the upper layer 205.

Alternatively, the upper layer 205 can be formed according to the sputtering method by using a single crystalline or polycrystalline Si wafer with carbon wafer, silicon dioxide wafer, or $Si_3N_4$ wafer, or a wafer containing Si and C, $SiO_2$ or $Si_3N_4$ mixed therein as target, and effecting sputtering of these in various gas atmospheres.

For example, when Si wafer is used as target, the starting gas for incorporating of carbon atoms (C), nitrogen atoms (N), or oxygen atoms (O), if necessary, further hydrogen atoms (H) or halogen atoms (X), for example, $H_2$ and $N_2$, $H_2$ and $NH_3$, $NH_3$, $H_2$ and $C_2H_6$, or the like, which may optionally be diluted with a diluting gas such as Ar and the like, are introduced into the deposition chamber for sputtering to form a gas plasma of these gases and effect sputtering of the aforesaid Si wafer. As other methods, by use of separate targets of Si and C, $SiO_2$, or $Si_3N_4$ or one sheet of a mixture of Si and C, $SiO_2$, or $Si_3N_4$, sputtering can be effected in an atmosphere of gas for sputtering.

In this case, for incorporating hydrogen atoms (H) or/and halogen atoms (X) in an upper layer to be formed, the above-mentioned gases for the starting materials may be introduced into a deposition chamber for sputtering for incorporation of hydrogen atoms (H) or/and halogen atoms (X) upon sputtering.

When the photoconductive member 200 is used in such a way that projection of electromagnetic waves to which the photoconductive layer 203 is sensitive is conducted from the side of the upper layer 205, selection of the material constituting the upper layer 205 and determination of its layer thickness are conducted carefully so that a sufficient amount of the electromagnetic waves projected may reach the photoconductive layer 203 to cause generation of photocarriers with good efficiency.

A layer thickness of the upper layer 205 in the present invention is suitably determined by following materials constituting the layer, conditions preparing the layer, and the like so that the above-mentioned functions can be sufficiently displayed.

Figure 3:
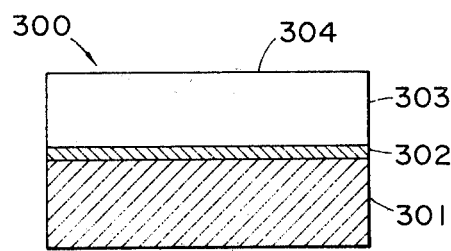

FIG. 3 shows a schematic sectional view for illustration of another basic embodiment of the photoconductive member of this invention.

The photoconductive member 300 as shown in FIG. 3 is one of the most basic embodiment, having a layer structure comprising a support 301 for photoconductive member, an intermediate layer 302 provided on said support, and a photoconductive layer 303 provided in direct contact with said intermediate layer 302. The support 301 and the photoconductive layer 303 are constituted of the same materials as described for the support 101 and the photoconductive layer 103 in FIG. 1, respectively.

The intermediate layer 302 is constituted of a non-photoconductive amorphous material containing as a matrix silicon atoms (Si) and oxygen atoms (O), and containing hydrogen atoms (H) [hereinafter referred to as a-$(Si_xO_{1-x})_y$: $H_{1-y}$, where $0<x<1$, $0<y<1$], and has the same function as the intermediate layer 102 as described in FIG. 1.

The intermediate layer 302 constituted of a-$(Si_xO_{1-x})_y$: $H_{1-y}$ may be formed by a glow discharge method, a sputtering method, an ion implantation method, an ion plating method, an electron-beam method, or the like. These production methods are suitably selected, but it is preferred to use the glow discharge method or the reaction sputtering method for the advantages of relatively easy control of the conditions for preparation of photoconductive members having desired characteristics as well as easy feasibleness of introduction of oxygen atoms (O) and hydrogen atoms (H) together with silicon atoms (Si) into the intermediate layer 302 to be prepared.

Further, in the present invention, the glow discharge method and the sputtering method can be used in combination in the same apparatus system to form the intermediate layer 302.

For formation of the intermediate layer 302 according to the glow discharge method, starting gases for formation of a-$(Si_xO_{1-x})_y$:$H_{1-y}$, which may optionally be mixed with a diluting gas at a predetermined ratio, are introduced into the deposition chamber for vacuum deposition in which the support 301 is placed, whereupon gas plasma is formed by exciting glow discharge of the gases introduced thereby to effect deposition of a-$(Si_xO_{1-x})_y$:$H_{1-y}$ on the aforesaid support 301.

As the starting gas to be used for formation of a-$(Si_xO_{1-x})_y$:$H_{1-y}$, most of gaseous substances of gassified products of gassifiable substances containing at least one of Si, O and H as constituent atoms may be available.

When a starting gas having Si as constituent atoms is to be used, it is possible to use a mixture of a starting gas having Si as constituent atom, a starting gas having O as constituent atom, and a gas having H as constituent atom at a desired mixing ratio. Alternatively, a mixture of a starting gas having Si as constituent atom and a starting gas having O and H as constituent atoms at a desired mixing ratio can also be used. Further it is also possible to use a mixture of starting gas having Si as constituent atom and a starting gas having the three kinds of atoms of Si, O and H as constituent atoms.

As another method, it is also possible to use a mixture of a starting gas having Si and H as constituent atoms and a starting gas having O as constituent atom.

In the present invention, the typical starting gas to be effectively used for starting material for forming the intermediate layer 302 includes silanes gas such as $SiH_4$, $Si_2H_6$, $Si_3H_8$, $Si_4H_{10}$, and the like; lower siloxanes, which are constituted of Si, O and H, such as disiloxane $H_3SiOSiH_3$, trisiloxane $H_3SiOSiH_2OSiH_3$, and the like; oxygen and ozone, which are constituted of O; $H_2$ constituted H; and the like.

For formation of the intermediate layer 302 by a sputtering method, there may be used a single crystalline or polycrystalline Si wafer, $SiO_2$ wafer or a wafer containing Si and $SiO_2$ mixed therein as target, and effecting sputtering of these in various gas atmospheres so that desired intermediate layer may be formed.

For example, when Si wafer is used as target, the starting gas for introduction of O and H, which may optionally be diluted with a diluting gas, if desired, are introduced into the deposition chamber for sputtering to form a gas plasma of these gases and effect sputtering of the aforesaid Si wafer. As other methods, by use of separate targets of Si and $SiO_2$ or one sheet of a molded mixture of Si and $SiO_2$, sputtering can be effected in a gas atmosphere containing at least hydrogen atoms (H) as a constituent.

As the starting gases for introduction of silicon atoms (Si), oxygen atoms (O) and hydrogen atoms (H), there may be employed the starting gases exemplified in the glow discharge method as effective gases also in the sputtering.

In the present invention, the diluting gas to be used in forming the intermediate layer 302 by the glow discharge method or the sputtering method is preferably a so-called rare gas such as He, Ne, Ar, and the like.

The intermediate layer 302 in the present invention is formed carefully so that the characteristics required may be given exactly as desired.

A substance constituted of silicon atoms (Si), oxygen atoms (O) and hydrogen atoms (H) can structurally take a form from a crystalline to amorphous state depending on the preparation conditions, exhibiting as electrical properties from electroconductive through semi-conductive to insulating, and from photoconductive to non-conductive, respectively. Hence, in the present invention, the conditions are severely selected for preparation of an a-$(Si_xO_{1-x})_y:H_{1-y}$ non-photoconductive to so-called visible region.

Since the function of a-$(Si_xO_{1-x})_y:H_{1-y}$ constituting the intermediate layer 302 of this invention is to bar penetration of carriers from the side of the support 301 into the photoconductive layer 303, while permitting easily the photocarriers generated in the photoconductive layer 303 to be migrated and passed therethrough to the side of the support 301, it is desirable that the intermediate layer 302 is formed so as to exhibit insulating behaviors in the visible region.

As another critical element in the conditions for preparing a-$(Si_xO_{1-x})_y:H_{1-y}$ so as to have a mobility value with respect to passing carriers to the extent that passing of photocarriers generated in the photoconductive layer 303 may be passed smoothly through the intermediate layer 302, there may be mentioned the support temperature during preparation thereof.

In other words, upon forming an intermediate layer 302 constituted of a-$(Si_xO_{1-x})_y:H_{1-y}$ on the surface of the support 301, the support temperature during the layer formation is an important factor affecting the structure and characteristics of the layer formed. In the present invention, the support temperature during the layer formation is severely controlled so that a-$(Si_xO_{1-x})_y:H_{1-y}$ having the desired characteristics may be prepared exactly as desired.

In order that the objects of the present invention may be achieved effectively, the support temperature during formation of the intermediate layer 302, which is suitably selected within an optimum range depending on the method employed for formation of the intermediate layer 302, is generally 100° to 300° C., preferably 150° to 250° C.

For formation of the intermediate layer 302, it is advantageous to adopt a glow discharge method or a reaction sputtering method, since these methods can afford severe controlling of the atomic ratios constituting each layer or layer thicknesses with relative ease as compared with other methods and it is possible to form continuously the photoconductive layer 303 on the intermediate layer 302 and further a third layer to be formed on the photoconductive layer 303 in the same system, if desired. In case of forming the intermediate layer 302 according to these layer forming methods, the discharging power and gas pressure during layer formation may also be mentioned, similarly as the support temperature as described above, as an important factor influencing the characteristics of a-$(Si_xO_{1-x})_y:H_{1-y}$ to be prepared.

In such methods for preparation of the intermediate layer, the discharging power condition for preparing effectively with good productivity a-$(Si_xO_{1-x})_y:H_{1-y}$ having characteristics for accomplishment of the object of this invention is generally 1 W through 300 W, preferably 2 W to 150 W. The gas pressure in the deposition chamber is generally in the range of from $3 \times 10^{-3}$ to 5 Torr, preferably from $8 \times 10^{-3}$ to 0.5 Torr.

The contents of the oxygen atoms and hydrogen atoms in the intermediate layer 302 in the photoconductive member 300 of this invention are also important factors for forming the intermediate layer 302 with desired characteristics to achieve the objects of this invention, similarly to the condition for preparation of the intermediate layer 302.

The content of oxygen atoms (O) in the intermediate layer 302 of this invention is generally 39 to 66 atomic %, preferably 42 to 64 atomic %. As for the content of the hydrogen atoms (H), it is generally 2 to 35 atomic %, preferably 5 to 30 atomic %. The photoconductive member with the content of hydrogen atoms within the specified range can be sufficiently useful in practical applications.

In terms of the representation a-$(Si_xO_{1-x})_y:H_{1-y}$ as previously indicated, x is generally 0.33 to 0.40, preferably 0.33 to 0.37, and y is generally 0.98 to 0.65, preferably 0.95 to 0.70.

The layer thickness of the intermediate layer 302 in the present invention is also another important factor to achieve effectively the objects of the present invention and it is desired to be within the same numerical range as specified with respect to the intermediate layer 102 in FIG. 1.

Figure 4:
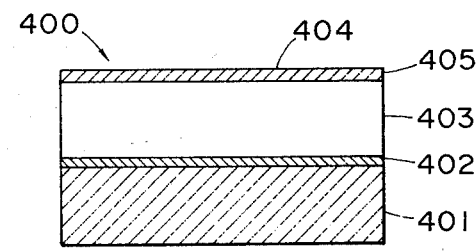

FIG. 4 shows a schematic sectional view of another embodiment in which the layer constitution of the photoconductive member as shown in FIG. 3 is modified.

The photoconductive member 400 as shown in FIG. 4 has the same layer structure as that of the photoconductive member 300 shown in FIG. 3, except that the upper layer 405 having the same function as the intermediate layer 402 is provided on the photoconductive layer 403.

In other words the photoconductive member 400 has an intermediate layer 402, which is made of the same material a-$(Si_xO_{1-x})_y:H_{1-y}$ as that of the intermediate layer 302 so as to have the same function, as that of the intermediate layer 302, on the support 401 similar to the support 101, a photoconductive layer 403 constituted of a-Si:H similar to the photoconductive layers 103 and 203, and the upper layer 405 having the free surface 404 which is provided on said photoconductive layer 402.

The upper layer 405 has the same function as that of the upper layer 205 shown in FIG. 2.

The upper layer 405 may be constituted of a-$(Si_xO_{1-x})_y:H_{1-y}$ having the same characteristics as that of the intermediate layer 402. Alternatively, the upper layer 405 may be constituted of an amorphous material comprising silicon atoms (Si) and nitrogen atoms (N) or oxygen atoms (O), which are the matrix atoms constituting the photoconductive layer or comprising these matrix atoms containing further hydrogen atoms; such as a-$Si_aN_{1-a}$, (a-$Si_aN_{1-a}$)$_b:H_{1-b}$, a-$Si_cC_{1-c}$, (a-$Si_cC_{1-c}$)$_d:H_{1-d}$ and the like; an inorganic insulating material such as $Al_2O_3$, and the like; or organic insulating materials such as polyesters, poly-p-xylylene, polyurethanes, and the like. However, in view of the productivity, mass productivity as well as the electrical and environmental stabilities during use, the material constituting the upper layer 405 is desirably a-$(Si_aN_{1-a})_b:H_{1-b}$, a-$(Si_cC_{1-c})_d:H_{1-d}$, a-$Si_aN_{1-a}$ containing no hydrogen atoms, or a-$Si_xC_{1-x}$ containing no hydrogen atom.

In addition to those mentioned above, other materials suitable for constituting the upper layer 405 may include amorphous materials containing as matrix at least two of C, N and O together with silicon atoms, and also containing halogen atoms or halogen atoms and hydrogen atoms.

As the halogen atom, there may be mentioned F, Cl, Br, etc., but an amorphous material containing F is effective with respect to thermal stability.

Figure 5:
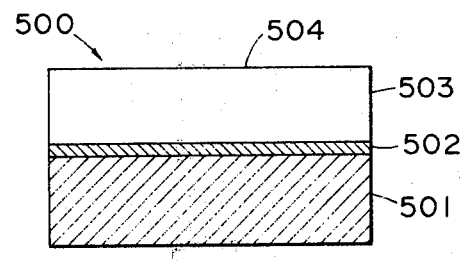

FIG. 5 shows a schematic sectional view of still another embodiment of the photoconductive member of this invention.

The photoconductive member 500 shown in FIG. 5 has a layer structure comprising a support 501 for photoconductive member, an intermediate layer 502 provided on said support and a photoconductive layer 503 provided in direct contact with said intermediate layer 502.

The support 501 and the photoconductive layer 503 are constituted of the same materials as described for the support 101 and the photoconductive layer 103 in FIG. 1, respectively.

The intermediate layer 502 is constituted of a non-photoconductive amorphous material contains as matrix silicon atoms and oxygen atoms, and also containing halogen atoms (X) [hereinafter referred to as a-$(Si_xO_{1-x})_y$:$X_{1-y}$], where $0<x<1$, $0<y<1$.

The intermediate layer 502 constituted of a-$(Si_xO_{1-x})_y$:$X_{1-y}$ may be formed according to the same method as described in formation of the intermediate layer 302 in FIG. 3, for example, a glow discharge method, a sputtering method, an ion-implantation method, ion-plating method, an electron-beam method and the like.

For formation of the intermediate layer 502 according to the glow discharge method, a starting gas for formation of a-$(Si_xO_{1-x})_y$:$X_{1-y}$, which may optionally be mixed with a diluting gas at a predetermined ratio, is introduced into the deposition chamber for vacuum deposition in which the support 501 is placed, whereupon gas plasma is formed by exciting glow discharge of the gas introduced thereby to effect deposition of a-$(Si_xO_{1-x})_y$:$X_{1-y}$ on the aforesaid support 501.

As the starting gas to be used for the starting gas for formation of a-$(Si_xO_{1-x})_y$:$X_{1-y}$, most of gaseous substances or gasified products of gasifiable substances containing at least one of Si, O and X as constituent atoms may be available.

When a starting gas having Si as constituent atoms is to be used, it is possible to use a mixture of starting gas having Si as constituent atom, a starting gas having O as constituent atom, and a gas having X as constituent atom at a desired mixing ratio. Alternatively, a mixture of a starting gas having Si as constituent atom and a starting gas having O and X as constituent atoms at a desired mixing ratio can also be used. Further it is also possible to use a mixture of a starting gas having Si as constituent atom and a starting gas having the three atoms of Si, O and X as constituent atoms.

As another method, it is also possible to use a mixture of a starting gas having Si and X as constituent atoms and a starting gas having O as constituent atom.

In the present invention, preferably halogen atoms (X) are F, Cl, Br and I, especially F and Cl.

In the present invention, the intermediate layer 502, which is constituted of a-$(Si_xO_{1-x})_y$:$X_{1-y}$, may further contain hydrogen atoms (H) incorporated therein. In the case of such a system of layer structure containing hydrogen atoms incorporated in the intermediate layer 502, it is advantageous in the production cost that a part of the starting gases can commonly by used in continuous formation of layers subsequent to the formation of the photoconductive layer 503.

In the present invention, the starting gases which can effectively be used in formation of the intermediate layer 502 are those which are gaseous at normal temperature under normal pressure or which can readily be gasified.

Such materials for formation of the intermediate layer may include, for example, oxygen ($O_2$), ozone ($O_3$), lower alkyl siloxanes, halogen, hydrogen halides, interhalogen compounds, silicon halides, halogen-substituted silicon hydrides, and the like.

More specifically, there may be included lower alkylsiloxanes such as disiloxane ($H_3SiOSiH_3$) and trisiloxane ($H_3SiOSiH_2OSiH_3$), halogen such as halogenic gases of fluorine, chlorine, bromine and iodine; hydrogen halides such as HF, HI, HCl, HBr, etc.; interhalogen compounds such as BrF, ClF, $ClF_3$, $ClF_5$, $BrF_5$, $BrF_3$, $IF_7$, $IF_5$, ICl, IBr, etc.; silicon halides such as $SiF_4$, $Si_2F_6$, $SiCl_4$, $SiCl_3Br$, $SiCl_2Br_2$, $SiClBr_3$, $SiCl_3I$, $SiBr_4$, etc.; halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$; and silanes such as $SiH_4$, $Si_2H_6$, $Si_3H_8$, $Si_4H_{10}$, and the like.

The starting materials for formation of these intermediate layers are selected and used in formation of the intermediate layers so that the silicon atoms (Si), oxygen atoms (O) and halogen atoms (X), and, if necessary, hydrogen atoms (H) may be contained at a predetermined ratio in the intermediate layer to be formed.

For example, an intermediate layer comprising a-$Si_x$-$O_{1-x}$:Cl:H can be formed by introducing $H_3SiOSiH_3$, which can form readily the intermediate layer with desired characteristics containing silicon atoms, oxygen atoms and hydrogen atoms, and a gas such as $SiHCl_3$, $SiCl_4$, $SiH_2Cl_2$, $SiH_3Cl$ and the like for incorporation of halogen atoms at a predetermined mixing ratio in a gaseous state into the device for formation of the intermediate layer, followed by excitation of glow discharge therein.

For formation of the intermediate layer 502 by a reaction sputtering method, there may be used a single crystalline or polycrystalline Si wafer, $SiO_2$ wafer or a wafer containing Si and $SiO_2$ mixed therein as target, and effecting sputtering of these in various gas atmospheres, containing halogen atoms (X) and, if necessary, hydrogens as constituent elements.

For example, when Si wafer is used as target, the starting gas for introduction of oxygen atoms (O) and halogen atoms (X), which may optionally be diluted with a diluting gas, if desired, are introduced into the deposition chamber for sputtering to form a gas plasma of these gases and effect sputtering of the aforesaid Si wafer. As other methods, by use of separate targets of Si and $SiO_2$ or one sheet of a molded mixture of Si and $SiO_2$, sputtering can be effected in a gas atmosphere containing at least halogen atoms.

As the starting gases for introduction of oxygen atoms (O) and halogen atoms (X), if necessary, and hydrogen atoms (H), there may be employed the starting gases exemplified in the above-mentioned glow discharge method as effective gases also in the sputtering.

In the present invention, the diluting gas to be used in forming the intermediate layer 502 by the glow discharge method or the sputtering method is preferably a so-called rare gas such as He, Ne, Ar, and the like.

The intermediate layer 502 in the present invention is formed carefully so that the characteristics required may be given exactly as desired.

A substance constituted of silicon atoms (Si), oxygen atoms (O) and halogen atoms (X), if necessary, and hydrogen atoms (H) can structurally take a form from a crystalline to amorphous state depending on the preparation conditions, exhibiting as electrical properties from electroconductive through semi-conductive to insulating, and from photoconductive to non-conductive, respectively. Hence, in the present invention, the conditions are severely selected for preparation of an a-$(Si_xO_{1-x})_y$:$H_{1-y}$ non-photoconductive under conditions to be used, for obtaining the objects.

Since the functions of the intermediate layer 502 is same as that of the above-mentioned intermediate layer, it is desirable that a-$(Si_xO_{1-x})_y$:$X_{1-y}$ constituting the intermediate layer 502 of the present invention is prepared so as to display electrically insulating performance.

a-$(Si_xO_{1-x})_y$:$X_{1-y}$ is prepared so that the a-$(Si_xO_{1-x})_y$:$X_{1-y}$ can possess a mobility value with respect to passing carriers to the extent that passing of photocarriers generated in the photoconductive layer 503 may be passed smoothly through the intermediate 502. As an important element in the conditions for preparing a-$(Si_xO_{1-x})_y$:$X_{1-y}$ having the above-mentioned characteristics, there may be mentioned the support temperature during preparation thereof. In the present invention, the support temperature during the layer formation, is severely controlled so that the a-$(Si_xO_{1-z})_y$:$X_{1-y}$ having the desired characteristics may be prepared exactly as desired.

In order that the objects of the present invention may be achieved effectively, the support temperature during formation of the intermediate layer 502, which is suitably selected conveniently within an optimum range depending on the method employed for formation of the intermediate layer 502, is generally 100° to 300° C., preferably 150° to 250° C.

For formation of the intermediate layer 502, it is advantageous to adopt a glow discharge method or a sputtering method, since these methods can afford severe controlling of the atomic ratios constituting each layer or layer thicknesses with relative ease as compared with other methods and it is possible to form continuously the photoconductive layer 503 on the intermediate layer 502 and further a third layer to be formed on the photoconductive layer 503 in the same system, if desired. In case of forming the intermediate layer 502 according to these layer forming methods, the discharging power and the gas pressure during layer formation may also be mentioned, similarly to the support temperature as described above, as an important factor influencing the characteristics of a-$(Si_xO_{1-x})_y$:$X_{1-y}$ to be prepared.

In such methods for preparation of the intermediate layer, the discharging power condition for preparing effectively with good productivity a-$(Si_xO_{1-x})_y$:$X_{1-y}$ having characteristics for accomplishment of the object of this invention is generally 10 W to 300 W, preferably 20 W to 150 W. The gas pressure in the deposition chamber is generally in the range of from $3 \times 10^{-3}$ to 5 Torr, preferably from $8 \times 10^{-3}$ to 0.5 Torr.

The contents of the oxygen atoms (O) and halogen atoms (X) in the intermediate layer 502 in the photoconductive member of this invention are also important factors for forming the intermediate layer 502 with desired characteristics to achieve the objects of this invention, similarly to the condition for preparation of the intermediate layer 502.

The content of oxygen atoms (O) in the intermediate layer 502 of this invention is generally 48 to 66 atomic %, preferably 51 to 66 atomic %. As for the content of the halogen atoms (X), it is generally 1 to 20 atomic %, preferably 2 to 15 atomic %. The photoconductive member formed with the content of halogen atoms (X) within the specified range can be sufficiently useful in practical applications. As the content of hydrogen atoms (H) contained, if necessary, it is generally 19 atomic % or less, preferably 13 atomic % or less.

In terms of the representation a-$(Si_xO_{1-x})_y$:$X_{1-y}$ as previously indicated, x is generally 0.33 to 0.40, preferably 0.33 to 0.37, and y is generally 0.99 to 0.80, preferably 0.98 to 0.85.

When both of halogen atoms and hydrogen atoms are contained, the numerical ranges for x and y in terms of representation of a-$(Si_xO_{1-x})_y$:$(H+X)_{1-y}$ are substantially the same as in the case of a-$(Si_xO_{1-x})_y$:$X_{1-y}$.

The layer thickness of the intermediate layer 502 in the present invention is also another important factor to achieve effectively the objects of the present invention and it is desired to be within the same numerical range as specified with respect to the intermediate layers previously described.

Figure 6:
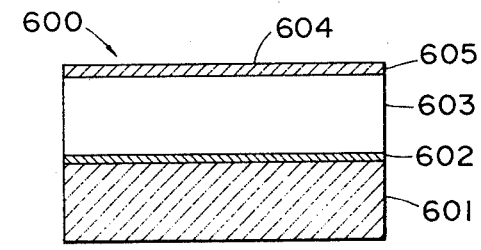

FIG. 6 shows a schematic view of another embodiment in which the layer constitution of the photoconductive member as shown in FIG. 5 is modified.

The photoconductive member 600 shown in FIG. 6 has the same layer structure as that of the photoconductive member 500 shown in FIG. 5, except that the upper layer 605 having the same function as the intermediate layer 602 is provided on the photoconductive layer 603.

In other words, the photoconductive member 600 has an intermediate layer 602, which is made of the same material as that of the intermediate layer 502 so as to have the same function as that of the layer 502, on the support 601, a photoconductive layer 603 constituted of a-Si:H similar to the photoconductive layer 503, and the upper layer 605 having the free surface 604 which is provided on said photoconductive layer 603.

The upper layer 605 has the same function as that of the upper layer 205 shown in FIG. 2 or the upper layer 405 shown in FIG. 4.

The upper layer 605 has the same characteristics as that of the intermediate layer 602, and is constituted of a-$(Si_xO_{1-x})_y$:$X_{1-y}$ which may contain hydrogen atoms, if necessary. Alternatively, the upper layer 605 may be constituted of an amorphous material comprising silicon atoms (Si), carbon atoms (C) and nitrogen atoms (N) or oxygen atoms (O), which are matrix atoms constituting the photoconductive layer 603 or constituted of these matrix atoms containing further hydrogen atoms or/and halogen atoms, such as a-$Si_aN_{1-a}$, a-$(Si_aN_{1-a})_b$:$H_{1-b}$, a-$(Si_aN_{1-a})_b$:$(H+X)_{1-b}$, a-$Si_cC_{1-c}$, a-$(Si_cC_{1-c})_d$:$H_{1-d}$, a-$(Si_cC_{1-c})_d$:$(H+X)_{1-d}$, a-$Si_zO_{1-z}$, a-$(Si_eN_{1-e})_f$:$X_{1-f}$, (a-$Si_gC_{1-g}$):$X_{1-h}$, and the like; an amorphous material containing these atoms as matrix and containing hydrogen atoms or/and halogen atoms; an inorganic insulating material such as $Al_2O_3$, and the like; or organic insulating materials such as polyesters, poly-p-xylylene and polyurethanes and the like.

However, in view of the productivity, mass productivity as well as the electrical and environmental stabilities during use, the material constituting the upper layer 605 is desirably composed of a-$(Si_xO_{1-x})_y$:$X_{1-y}$, a-$(Si_aN_{1-a})_b$:$H_{1-b}$, a-$(Si_aN_{1-a})_b$:$(H+X)_{1-b}$, a-$(Si_cO_{1-c})_d$:$H_{1-d}$, a-$(Si_cC_{1-c})_d$:$(H+X)_{1-d}$, a-$(Si_eN_{1-e})_f$:$X_{1-f}$, or a-$(Si_gC_{1-g})_h$:$X_{1-h}$, or a-$Si_cC_{1-c}$ containing no halogen atoms and hydrogen atoms or a-$Si_aN_{1-a}$ containing no halogen atoms and hydrogen atoms. As the materials constituting the upper layer 605 in addition to those as mentioned above, there may preferably be used amorphous materials having silicon atom and at least two atoms of C, N and O as matrix atoms, and containing halogen atoms (X), or halogen atoms (X) and hydrogen atoms (H). As the halogen atoms (X), there may be mentioned F, Cl, Br, and the like, but among the amorphous materials as mentioned above, those containing F are effective from standpoint of thermal stability.

Figure 7:
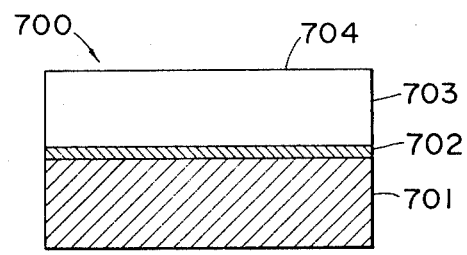

FIG. 7 shows a schematic view for illustration of still another basic embodiment of the photoconductive member of this invention.

The photoconductive member 700 shown in FIG. 7 have a layer structure comprising a support 701 for photoconductive member, an intermediate layer 702 provided on said support, said intermediate layer 702 being similar to intermediate layer described previously, and a photoconductive layer 703 provided in direct contact with said intermediate layer 702.

The support 701 and the intermediate layer 702 are made of the same materials as that of the support 101 and the intermediate layer 102 shown in FIG. 1, respectively, and can be prepared by the same method and under the same conditions as those, respectively.

In the present invention, in order to achieve its objects effectively, the photoconductive layer 703 overlaid on the intermediate layer 702 is constituted of a-Si:X having the semi-conductor characteristics as shown below.

⑥ p-type a-Si:X . . . Containing only acceptor or containing both donor and acceptor with higher concentration of acceptor (Na).

⑦ p⁻-type a-Si:X . . . A type of ⑥, that containing acceptor at low concentration (Na), for example, being doped very lightly with so-called p-type impurities.

⑧ n-type a-Si:X . . . Containing only donor or containing both donor and acceptor with higher concentration of donor (Nd).

⑨ n⁻-type a-Si:X . . . A type of ⑧ which contains donor at low concentration (Nd), for example, being doped very lightly with n-type impurities or non-doped.

⑩ i-type a-si:X . . . Wherein Na≃Nd≃0 or Na≃Nd.

In the present invention, a-Si:X constituting the photoconductive layer 703, since it is provided through the intermediate layer 702 on the support, one having relatively lower electric resistivity can be used, but for obtaining better results, the dark resistivity of the photoconductive layer 703 formed may preferably be $5 \times 10^9$ Ωcm or more, most preferably $10^{10}$ Ωcm or more.

In particular, the numerical condition for the dark resistivity values is an important factor when using the prepared photoconductive member as an image forming member for electrophotography, as a high sensitive reading device or an image pickup device to be used under low illuminance regions, or as a photoelectric converter.

In the present invention, typical examples of halogen atoms (X) incorporated in the photoconductive layer 703 may include fluorine, chlorine, bromine and iodine. Among them, fluorine and chlorine are particularly preferred.

The expression "X contained or incorporated in the layer" herein mentioned means the state, in which "X is bonded to Si", or in which "X is ionized to be incorporated in the layer", or in which "X is incorporated in a form of $X_2$ in the layer", or the state combining the above-mentioned states.

In the present invention, the layer constituted of a-Si:X is formed by the vacuum deposition method, utilizing discharging phenomenon, such as the glow discharge method, the sputtering method, the ion plating method, and the like. For example, in order to form a-Si:X layer according to the glow discharge method, a starting gas for introduction of halogen atoms together with a Si-supplying starting gas capable of supplying Si atoms (Si) are introduced into a deposition chamber, which can be brought internally to reduced pressure, and glow discharging is excited in said deposition chamber thereby to form a layer of a-Si:X on the surface of the intermediate layer formed on the support previously placed at a predetermined position therein. When the layer is formed according to the sputtering method, a gas for introduction of halogen atoms may be introduced into the deposition chamber for sputtering when effecting sputtering of Si target in an atmosphere of an inert gas such as Ar or He, or a gas mixture principally composed of these gases.

The starting gas for supplying Si to be used in the present invention may include those as described above for formation of the photoconductive layer 103 shown in FIG. 1.

In the present invention, the effective starting gases for introduction of halogen atoms may include a number of halogen compounds, preferably gaseous or gasifiable halogen compounds, such as, for example, halogen gases, halides, interhalogen compounds and halogen-substituted silane derivatives.

Further it is also possible to use effectively a silicon compound containing halogen atoms, which is capable of supplying silicon atoms (Si) and halogen atoms (X) in the same time.

The halogen compounds preferably used in the present invention are halogenic gases such as fluorine, chlorine, bromine and iodine; interhalogen compounds such as BrF, ClF, ClF$_3$, BrF$_5$, BrF$_3$, IF$_7$, IF$_5$, ICl, IBr, and the like.

As a silicon compound containing halogen atoms, namely so called halogen-substituted silane derivative, silicon halides such as SiF$_4$, Si$_2$F$_6$, SiCl$_4$, SiBr$_4$, and the like are preferred.

When the photoconductive layer 703 is formed according to a glow discharge method by use of such a halogen-containing silicon compound, a photoconductive layer of a-Si$_x$:X can be formed on a predetermined support without use of silane gas as a starting gas capable of supplying Si.

In forming the photoconductive layer of a-Si:X according to a glow discharge method, the basic procedures comprises feeding a starting silicon halide gas for supplying Si together with a gas such as Ar, H$_2$, He, and the like at a predetermined mixing ratio in a suitable gas flow amount into the deposition chamber for formation of the photoconductive layer of a-Si:X, followed by excitation of glow discharge to form a plasma atmosphere of these gases, thereby forming photoconductive layer of a-Si:X in contact with the intermediate layer formed on a support. It is also possible to mix further a gas of a silicon compound containing hydrogen atoms together with these gases in a suitable amount.

Each of these gases may be used not only alone a single species but with mixing of plural species at a predetermined ratio. In forming the photoconductive layer of a-Si:X by a reaction sputtering method or an ion plating method, for example, in case of the sputtering method, sputtering can be effected by using a target of Si in a plasma atmosphere. In case of the ion plating method, a polycrystalline silicon or a single crystalline silicon is placed as a source in a vapor deposition boat, which silicon source is vaporized by heating according to a resistance heating method or an electron beam (EB) method, thereby permitting the vapors dissipated from the boat to pass through a gas plasma atmosphere.

In either of the sputtering method and the ion plating method, halogen atoms can be introduced into the layer to be formed by feeding a gas of the aforesaid halogen compound or the aforesaid halogen-containing silicon compound into the deposition chamber to form a plasma atmosphere of said gas therein.

In the present invention, the above halogen compounds or halogen-containing silicon compounds can effectively be used as a starting material for incorporation of halogen atoms. Additionally, it is also possible to use as effective substance for formation of the photoconductive layer a gaseous or a gasifiable halide containing hydrogen as one of the constituent elements, as exemplified by hydrogen halides such as HF, HCl, HBr, HI, and the like; halogen-substituted silanes such as $SiH_2F_2$, $SiH_2Cl_2$, $SiHCl_3$, $SiH_2Br_2$, $SiHBr_3$, and the like.

In the present invention, these halides containing hydrogen atoms may preferably be used as starting gases for introduction of halogen atoms, since they can also introduce hydrogen atoms, which can very effectively control the electrical or photoconductive characteristics, simultaneously with introduction of halogen atoms into the photoconductive layer.

Alternatively, in order to incorporate hydrogen atoms structurally into the photoconductive layer of a-Si:X, it is also possible to use materials outside those as mentioned above, such as $H_2$ or silane gases such as $SiH_4$, $Si_2H_6$, $Si_3H_8$, $Si_4H_{10}$, and the like. Such gases can be permitted to co-exist with a silicon compound for formation of Si in the deposition chamber for conducting dishcarge.

For example, in a reaction sputtering method, Si target is used, and a gas for introduction of halogen atoms and $H_2$ gas together with, if necessary, an inert gas such as He, Ar, and the like are introduced into the deposition chamber to form a plasma atmosphere, thereby effecting sputtering of the aforesaid Si target, to form on the surface of a support a photoconductive layer of a-Si:X having desired characteristics with hydrogen atoms incorporated therein.

Further, it is also possible to introduce a gas such as $B_2H_6$, $PH_3$, $PF_3$, and the like so that addition of impurities may also concurrently be effected.

In the present invention, the content of halogen atoms or the total contents of halogen atoms (X) and hydrogen atoms (H) in the photoconductive layer is generally 1 to 40 atomic %, preferably 5 to 30 atomic %.

The content of hydrogen atoms (H) in the layer can be controlled by the depositing support temperature or/and the quantity of the starting material for incorporation of hydrogen atoms (H) to be introduced into the deposition device, discharging power and the like.

In order to make the photoconductive layer of n-type or p-type, p-type or n-type impurity, or both may be added into the layer in a controlled amount during formation of the layer by the glow discharge method, the reaction sputtering method, or the like.

As the impurity to be doped into the photoconductive layer to make it p-type, there may be mentioned preferably an elements in Group III A of the periodic table, for example, B, Al, Ga, In, Tl, and the like.

On the other hand, for obtaining a n-type, there may preferably be used elements in Group V A, of the periodic table, such as N, P, As, Sb, Bi, and the like.

In addition, for example, it is also possible to control the layer to n-type by interstitial addition of Li or others through thermal diffusion or implantation. The amount of the impurity to be added into the photoconductive layer, which is determined suitably depending on the electrical and optical characteristics desired, but in the range of, in the case of elements in Group III A of the periodic table, generally from $10^{-6}$ to $10^{-3}$ atomic ratio, preferably from $10^{-5}$ to $10^{-4}$ atomic ratio, and, in the case of elements in Group V A of the periodic table, generally from $10^{-8}$ to $10^{-3}$ atomic ratio, preferably from $10^{-8}$ to $10^{-4}$ atomic ratio.

Figure 8:
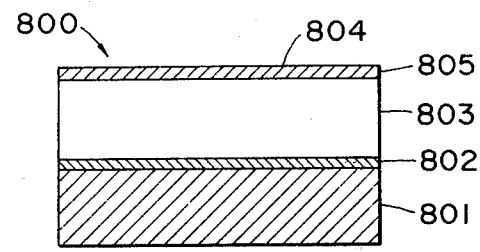

FIG. 8 shows a schematic sectional view of another embodiment of the photoconductive member of this invention in which the layer structure shown in FIG. 7 is modified. The photoconductive member 800 as shown in FIG. 8 has the same layer structure as that of the photoconductive member 700 shown in FIG. 7, except that the upper layer 805 having the same function as that of the intermediate layer 802 is provided on the photoconductive layer 803.

In other words, the photoconductive member 800 has an intermediate layer 802, which is made of the same material, a-$Si_xO_{1-x}$, as that of the intermediate layer 702 so as to have the same function as that of the layer 702, on the support 801, a photoconductive layer 803 constituted of a-Si:X to which H may be optionally introduced in a similar manner to described in the case of the photoconductive layer 703 shown in FIG. 7, and the upper layer 805 having the free surface 804, which is provided on the photoconductive layer 803.

The upper layer 805 has the same functions as described above for the embodiments as shown above and is constituted of the same materials.

Figure 9:
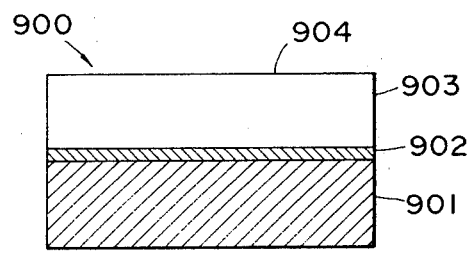

FIG. 9 shows a schematic sectional view of still another embodiment of the photoconductive member of this invention.

The photoconductive member 900 shown in FIG. 9 has a layer structure comprising a support 901 for photoconductive member, an intermediate layer 902 similar to the intermediate layer shown in FIG. 3 provided on said support, and a photoconductive layer 903 similar to the photoconductive layer 703 shown in FIG. 7 provided in direct contact with said intermediate layer 902.

The support 901 may be either electroconductive, or insulating as previously described for the support in the embodiments set forth above.

Figure 10:
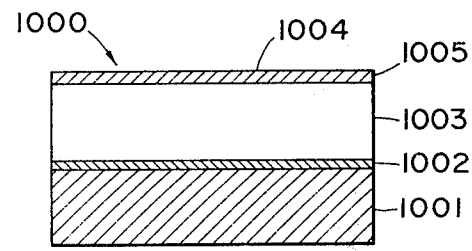

The photoconductive member 1000 shown in FIG. 10 has the same layer structure as the photoconductive member 900 shown in FIG. 9, except that the upper layer 1005 having the same function as that of the intermediate layer 1002 is provided on the photoconductive layer 1003.

In other words, the photoconductive member 1000 has an intermediate layer 1002, which is made of the same material a-$(Si_xO_{1-x})_y$:$H_{1-y}$ as that of the intermediate layer 902 so as to have the same function as that of the layer 902, on the support 1001 of the same material as that of the supports in the previous embodiments, a photoconductive layer 1003 constituted of a-Si:X similar to the photoconductive layer 703 further containing hydrogen atoms (H) if desired, and the upper layer 1005 having the free surface 1004, which is provided on said photoconductive layer 1003.

The upper layer 1005 may be constituted of a-$(Si_xO_{1-x})_y$:$H_{1-y}$ having the same characteristic as that of the intermediate layer 1002. Alternatively, it may be constituted of the same material as those of the upper layers in the embodiments as set forth above.

Figure 11:
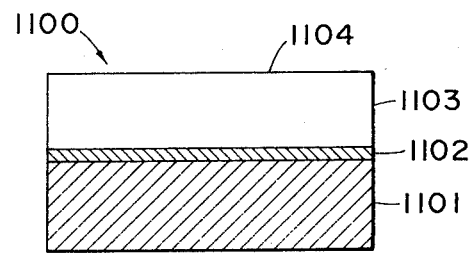

FIG. 11 shows a schematic sectional view of still further another embodiment of the photoconductive member of this invention.

The photoconductive member 1100 shown in FIG. 11 has a layer structure comprising a support 1101 for photoconductive member, an intermediate layer 1102 similar to the intermediate layer 502 shown in FIG. 5 provided on said support, and a photoconductive layer 1103 similar to the intermediate layer 703 shown in FIG. 7 provided in direct contact with said intermediate layer 1102.

Figure 12:
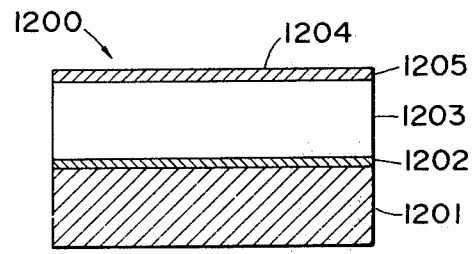

FIG. 12 shows a schematic sectional view of another embodiment in which the layer structure of the photoconductive member shown in FIG. 11 is modified.

The photoconductive member 1200 shown in FIG. 12 has the same structure as that of the photoconductive member 1100 shown in FIG. 11 except that the upper layer having the same function as that of the intermediate layer 1202 is provided on the photoconductive layer 1203.

In other words, the photoconductive member 1200 has an intermediate layer 1202, which is made of the same material as in the intermediate layer 1102 so as to have the same function on the support 1201, a photoconductive layer 1203 constituted of a-Si:X similar to in the photoconductive layer 703 shown in FIG. 7, further containing hydrogen atoms if desired, and the upper layer 1205 having the free surface 1204, which is provided on said photoconductive layer 1203.

The upper layer 1205 has the same characteristics as that of the intermediate layer 1202, similarly in the upper layers shown in the above embodiments, and is constituted of a-$(Si_xO_{1-x})_y$:$X_{1-y}$ which may further contain hydrogen atoms (H) if necessary. Alternatively, the upper layer 1205 may be constituted of an amorphous material comprising silicon atoms (Si), carbon atoms (C) and nitrogen atoms (N) or oxygen atoms (O), which are matrix atoms constituting the photoconductive layer, or comprising these matrix atoms containing further hydrogen atoms or/and halogen atoms; such as, a-$Si_aN_{1-a}$, a-$(Si_aN_{1-a})_b$:$H_{1-b}$, a-$(Si_aN_{1-a})_b$:$(H+X)_{1-b}$, a-$Si_cC_{1-c}$, a-$(Si_cC_{1-c})_d$: $H_{1-d}$, a-$(Si_cC_{1-c})_d$:$(H+X)_{1-d}$, a-$Si_zO_{1-z}$, a-$(Si_eN_{1-e})_f$:$X_{1-f}$, a-$(Si_gC_{1-g})_h$:$X_{1-h}$, and the like; an inorganic insulating material such as $Al_2O_3$ and the like; or organic insulating materials such as polyesters, poly-p-xylylene and polyurethanes.

The layer thickness of the photoconductive member in this invention is determined suitably depending on the purpose of application such as reading devices, image pickup devices, image forming members for electrophotography, and the like.

In the present invention, the layer thickness of the photoconductive member may be determined suitably in connection with the relation to the thickness of the intermediate layer so that the functions of both photoconductive layer and intermediate layer can effectively be exhibited. Ordinarily, the thickness of the photoconductive layer is preferably some hundred to some thousand times as thick as the intermediate layer. More specifically, it is generally in the range of from 1 to 100μ, preferably from 2 to 50μ.

The material constituting the upper layer provided on the photoconductive layer as well as its thickness may be determined carefully so that generation of photocarriers may be effected with good efficiency by permitting the electromagnetic waves projected to reach the photoconductive layer in a sufficient quantity, when the photoconductive member is to be employed such that the electromagnetic waves to which the photoconductive layer is sensitive is projected from the side of the upper layer.

The thickness of the upper layer may suitably be determined depending on the material constituting the layer and the conditions for forming the layer so that the function as described above may be sufficiently exhibited. Ordinarily, it is in the range of 30 to 1000 Å, preferably from 50 to 600 Å.

When a certain kind of electrophotographic process is to be employed in using the photoconductive member of this invention as an image forming member for photography, it is also required to provide further a surface coating layer on the free surface of the photoconductive member according to the layer structure as shown in any of FIG. 1 to FIG. 12. Such surface coating layer is required to be insulating and have a sufficient ability to hold electrostatic charges when subjected to charging treatment and also a thickness to some extent, when applied in an electrophotographic process like NP-system as disclosed in U.S. Pat. Nos. 3,666,363 and 3,734,609. On the other hand, when applied in an electrophotographic process such as Carlson process, the surface coating layer is required to have a very thin thickness, since the potential at the light portions after formation of electrostatic charges is desired to be very small. The surface coating layer is required to have, in addition to satisfactory electrical characteristics, no bad influence, both physically and chemically on the photoconductive layer or the upper layer as well as good electrical contact and adhesion to the photoconductive layer or the upper layer. Further, humidity resistance, abrasion resistance, cleaning characteristics, etc. are also taken into consideration in forming the surface coating layer.

Typical examples of materials effectively used for formation of the surface coating layer may include polyethylene terephthalate, polycarbonates, polypropylene, polyvinyl chloride, polyvinylidene chloride, polyvinyl alcohol, polystyrene, polyamides, polytetrafluoroethylene, polytrifluorochloroethylene, polyvinyl fluoride, polyvinylidene fluoride, hexafluoropropylene-tetrafluoroethylene copolymer, trifluoroethylene-vinylidene fluoride copolymer, polybutene, polyvinyl butyral, polyurethanes, poly-p-xylylene and other organic insulating materials; and silicon nitrides, silicon oxides and other inorganic insulating materials. Among these material, synthetic resins or cellulose derivatives may be formed into a film which is in turn laminated on the photoconductive layer or the upper layer. Alternatively, coating solutions of such materials may be prepared and coated on the photoconductive layer or the upper layer to form a layer. The thickness of the surface coating layer, which may be determined suitably depending on the characteristics desired or the material selected, may generally be about 0.5 to 70μ. In particular, when the protective function as described above is required of the surface coating layer, the thickness is usually 10μ or less. On the contrary, when a function as an insulating layer is required, a thickness of 10μ or more is usually used. However, a line of demarcation between thickness values distinguishing the protective layer from the electrical insulating layer is variable depending on the electrophotographic process to be applied and the structure of the image forming member for electrography designed. Therefore, the value of $10\mu$ above-mentioned should not be appreciated as absolute.

The surface coating layer may also be endowed with a role as a reflection preventive layer by suitable selection of materials, whereby its function can further be enlarged.

EXAMPLE 1

Figure 13:
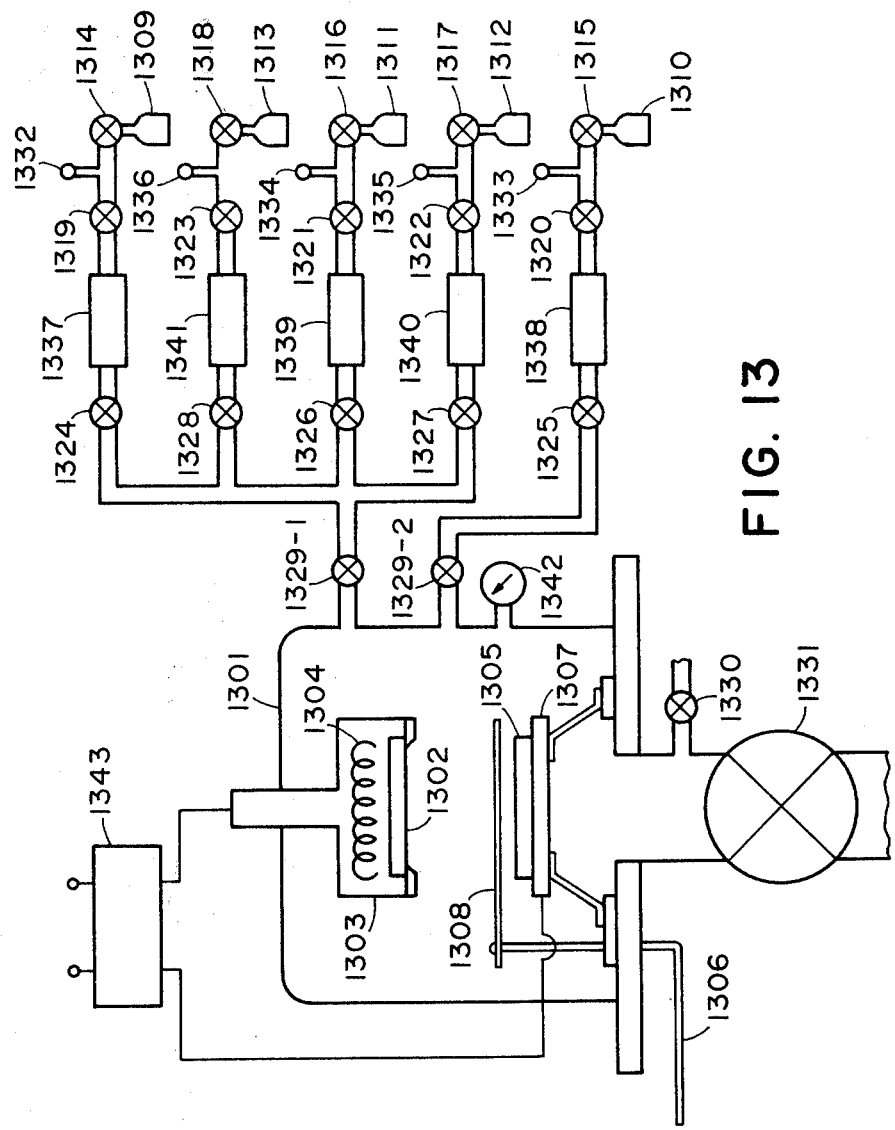
FIGS. 13 through 15 show schematic flow charts for illustration of the devices for preparation of the photoconductive members according to the present invention, respectively.

Using a device shown in FIG. 13 placed in a clean room which had been completely shielded, an image forming member for electrography was prepared according to the following procedures.

A substrate 1302 of molybdenum of 10 cm square having a thickness of 0.5 mm, whose surface had been cleaned, was fixed firmly on a fixing member 1303 disposed at a predetermined position in a deposition chamber 1301. The targets 1305 was formed high purity $SiO_2$. The substrate 1302 was heated by a heater 1304 within the fixing member 1303 with a precision of $\pm 0.5°$ C. The temperature was measured directly at the backside of the substrate by an alumel-chromel thermocouple. Then, after confirming that all the valves in the system were closed, the main valve 1331 was fully opened, and evacuation was effected once to $5 \times 10^{-7}$ torr (during the evacuation, all the other valves in the system are closed). Thereafter, the input voltage for the heater 1304 was elevated by varying the input voltage while detecting the substrate temperature until the temperature was stabilized constantly at 100° C. This step was followed by opening the auxiliary valves 1329-1, 1329-2 and the outflow valves 1324, 1325, 1326 and 1328 to remove sufficiently the gases in the flowmeters 1337, 1338, 1339 and 1341, and thereafter the outflow valves 1324, 1325, 1326 and 1328 were closed. The valve 1318 of the bomb 1313 containing argon gas (purity: 99.999%) was opened until the reading on the outlet pressure gauge 1336 was adjusted to 1 kg/cm², and then the inlet valve 1323 was opened, followed by gradual opening of the outflow valve 1328. On the other hand, the valve 1315 of the bomb 1310 containing oxygen gas (purity: 99.999%) was opened until the reading on the outlet pressure gage 1333 was adjusted to 1 kg/cm², and then the inlet valve 1320 was opened, followed by gradual opening of the outlet valve 1325. At this time, the flow amount ratio of the oxygen gas to argon gas was adjusted to 3:7 by using the inflow valves 1320 and 1323.

The auxiliary valves 1329-1 and 1329-2 were opened until the indication of the pirani gauge 1342 became $5 \times 10^{-4}$ torr, which state was maintained until the flow amount was steady. Thereafter, the main valve 1331 was gradually closed to narrow the opening to adjust the inner pressure in the chamber at $1 \times 10^{-2}$ torr. With the shutter 1308 opened by operation of the shutter bar 1306, the flowmeters 1338 and 1341 were confirmed to be stabilized, whereupon the high frequency power source 1343 was turned on to input an alternate current of 13.56 MHz, 100 W between the target 1305 and the fixing member 1303. Under these conditions, a layer was formed while taking matching so that stable discharging may be continued. In this manner, discharge was continued for one minute to form an intermediate layer of a thickness of 100 Å. Then, the high frequency power source 1343 was turned off for intermission of discharge. Subsequently, the outflow valves 1325 and 1328 was closed and the main valve 1331 fully opened to discharge the gas in the chamber 1301 until it was evacuated to $5 \times 10^{-7}$ torr. Thereafter, the input voltage for the heater 1304 was elevated by varying the input voltage while detecting the substrate temperature until the temperature was stabilized constantly at 200° C.

Then, valves 1315 and 1318 were closed, thereafter the auxiliary valves 1329-1 and 1329-2, subsequently the outflow valves 1325 and 1328 and the inflow valves 1320 and 1323, were opened fully to effect degassing sufficiently in the flowmeters 1338 and 1341 to vacuo. After closing the outflow valves 1325 and 1328, the valve 1314 of the bomb 1309 containing $SiH_4$ gas (purity: 99.999%) diluted with $H_2$ to 10 vol. % [hereinafter referred to as $SiH_4(10)/H_2$] and the valve 1316 of the bomb 1311 containing $B_2H_6$ gas diluted with $H_2$ to 50 vol. ppm [hereinafter referred to as $B_2H_6(50)/H_2$] were respectively opened to adjust the pressures at the outlet pressure gauges 1332 and 1334, respectively, at 1 kg/cm². whereupon the inflow valves 1319 and 1321 were gradually opened to permit $SiH_4(10)/H_2$ gas and $B_2H_6(50)/H_2$ gas to flow into the flowmeters 1337 and 1339, respectively. Subsequently, the outflow valves 1324 and 1326 were gradually opened. The inflow valves 1319 and 1321 were adjusted thereby so that the gas flow amount ratio of $SiH_4(10)/H_2$ to $B_2H_6(50)/H_2$ could become 50:1. Then, while carefully reading the Pirani gauge 1342, the opening of the auxiliary valve 1329 was adjusted and the auxiliary valve 1329 was opened to the extent until the inner pressure in the chamber 1301 became $1 \times 10^{-2}$ torr. After the inner pressure in the chamber 1301 was stabilized, the main valve 1331 was gradually closed to narrow its opening until the indication on the Pirani gauge 1342 became 0.5 torr. After confirming that the gas feeding and the inner pressure were stable, the shutter 1308 (serving also as an electrode) was closed by operation of the shutter bar 1306, followed by turning on the high frequency power source 1343, to input a high frequency power of 13.56 MHz between the electrodes 1303 and 1308, thereby generating glow discharge in the chamber 1301 to provide an input power of 10 W. After glow discharge was continued for 3 hours to form a photoconductive layer, the input of the heater 1304 was decreased with the high frequency power source 1343 being turned off, the substrate is left to cool to 100° C., whereupon the outflow valves 1324, 1326 and the inflow valves 1319, 1321 were closed, with the main valve 1331 fully opened, thereby to make the inner pressure in the chamber 1301 to $5 \times 10^{-7}$ torr. Therefore, the outflow valves 1325 and 1328 were re-opened, and the shutter 1308 was opened by operation of the shutter bar 1306 to make the conditions same as those in preparation of the intermediate layer. Subsequently, the high frequency power source was turned on to regenerate glow discharge. The input power was 100 W similarly to that in preparation of the intermediate layer. Under these conditions, the glow discharge was continued for two minutes to form an upper layer on the photoconductive layer. Thereafter, the heater 1304 was turned off with the high frequency power source 1343 being also turned off. Then, the outflow valves 1325 and 1328, and the inflow valves 1320 and 1323 were closed, with the main valve 1331 fully opened, thereby to make the inner pressure in the chamber to less than $10^{-5}$ torr. Then, the main valve 1331 was closed and the inner pressure in the chamber was made atmospheric through the leak valve 1330, and the substrate having formed each layer thereon was taken out.

In this case, the entire thickness of the layers was about 9μ. The thus prepared image forming member was placed in an experimental device for charge and exposure to light, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the image forming member to obtain a good toner image on the image forming member. When the toner image on the image forming member for electrography was copied on a copying paper by corona charge at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear image.

As apparently seen from the above results, in combination with the previous result, the image forming member for electrophotography obtained in the present Example has the characteristics of a both-polarity image forming member having no dependency on the charged polarity.

EXAMPLE 2

The image forming members shown by Sample No. A1 through A8 were prepared under the same conditions and procedures as in Example 1 except that the sputtering time in forming the intermediate layer on the molybdenum substrate was varied as shown below in Table 1, and image formation was effected by placing in entirely the same device as in Example 1 to obtain the results as shown in Table 1.

TABLE 1

| Sample No. | A1 | A2 | A3 | A4 | A5 | A6 | A7 | A8 |
|---|---|---|---|---|---|---|---|---|
| Time for formation of intermediate layer (sec.) | 10 | 30 | 50 | 150 | 300 | 500 | 1000 | 1200 |
| Image quality | | | | | | | | |
| Charge polarity ⊕ | Δ | ○ | ⊙ | ⊙ | ⊙ | ○ | Δ | X |
| Charge polarity ⊖ | X | Δ | ⊙ | ⊙ | ⊙ | ○ | Δ | X |

Ranks for evaluation:
⊙ excellent
○ good
Δ practically usable
X not good
Deposition speed of intermediate layer: 1 Å/sec.

As apparently seen from the results shown in Table 1, it is necessary to form the intermediate layer in a thickness within the range of from 30 Å to 1000 Å.

EXAMPLE 3

The image forming members as shown by Samples Nos. A9 through A15 were prepared under the same conditions and procedures as those in Example 1 except that the flow-amount ratio of Ar to $O_2$ was varied as shown below in Table 2, and image formation was effected by placing in the same device as that of Example 1 to obtain the results shown in Table 2. For only Samples Nos. A11 through A15, intermediate layers were analyzed by the electron microprobe method to give the results as shown in Table 3.

As apparently seen from the results shown in Tables 2 and 3, it is necessary to form an intermediate layer wherein the ratio of Si to O in $Si_xO_{1-x}$ constituting the intermediate layer ranges from 0.33 to 0.4 for attain the objects of the present invention.

TABLE 2

| Sample No. | A9 | A10 | A11 | A12 | A13 | A14 | A15 |
|---|---|---|---|---|---|---|---|
| Si/O (flow-amount ratio) | 10:0 | 99:1 | 95:5 | 9:1 | 8:2 | 7:3 | 5:5 |
| Copied image quality | | | | | | | |
| Charge polarity ⊕ | X | X | X | Δ | ○ | ⊙ | ⊙ |
| Charge polarity ⊖ | X | X | X | Δ | ○ | ⊙ | ⊙ |

TABLE 3

| | $Si_xO_{1-x}$ | | | | |
| Sample No. | A11 | A12 | A13 | A14 | A15 |
|---|---|---|---|---|---|
| x | 0.44 | 0.40 | 0.37 | 0.33 | 0.33 |

EXAMPLE 4

After an intermediate layer comprising a-$Si_xO_{1-x}$ was provided on a molybdenum substrate according to the same procedures as used in Example 1, the outflow valve 1325 and 1328 were closed. Then the input voltage for the heater 1304 was increased by varying the input voltage while detecting the substrate temperature, until it was constant at 200° C.

Thereafter, the outflow valve 1324 and the inflow valve 1319 were opened fully to effect evacuation to vacuum also in the flowmeter 1337.

After closing the inflow valve 1319 and the outflow valve 1324, the valve 1314 of the bomb 1309 containing $SiH_4(10)/H_2$ was opened and the pressure at the outlet pressure gauge 1332 was adjusted to 1 kg/cm², followed by opening gradually the inflow valve 1319 to introduce the $SiH_4(10)/H_2$ gas into the flowmeter 1337. Subsequently, the outflow valve was opened gradually and then the auxiliary valve 1329 gradually opened. Next, while reading carefully the Pirani gauge 1342, the opening of the auxiliary valve 1329 was adjusted and it was opened until the inner pressure in the chamber 1301 became $1 \times 10^{-2}$ torr. After the inner pressure in the chamber 1301 was stabilized, the main valve 1331 was gradually closed to narrow its opening until the indication on the Pirani gauge 1342 became 0.5 torr. Confirming stabilization of gas feeding and of inner pressure, the shutter 1308 was closed by using the shutter bar 1306, followed by turning on the high frequency power source 1343 to input a high frequency power of 13.56 MHz between the electrodes 1308 and 1303, thereby exciting glow discharge in the chamber 1301, to provide an input power of 10 W. Glow discharge was continued under the conditions for 3 hours to form a photoconductive layer, and thereafter the heater 1304 was decreased, and the high frequency power source 1343 turned off. Upon cooling of the substrate to a temperature to 100° C., the outflow valve 1324 and the inflow valve 1319 were closed, with full opening of the main valve 1331 to evacuate the chamber 1301 to $5 \times 10^{-7}$ torr or less. Thereafter, the outflow valves 1325 and 1328, and the shutter 1308 were re-opened, and an upper layer was formed in a similar way to that in formation of the intermediate layer. The image forming member thus prepared was taken out from the chamber 1301. In this case, the total thickness of the layers was found to be about $9\mu$. The thus prepared image forming member was subjected to image formation on a copying paper in a similar way to that described in Example 1. As a result, the image formed by $\ominus$ corona discharge was better in quality and very clear, as compared with that formed by $\oplus$ corona discharge. The results show that the image forming member prepared in this Examples is dependent on the charging polarity.

EXAMPLE 5

After an intermediate layer was formed for one minute on a molybdenum substrate using conditions and procedures similar to those of Example 1, the deposition chamber was evacuated to $5 \times 10^{-7}$ torr, whereupon SiH$_4$(10)/H$_2$ gas was introduced into the deposition chamber according to the same procedures as used in Example 1. Thereafter, under the gas pressure at 1 kg/cm$^2$ (reading on the outlet pressure gauge 1335) through the inflow valve 1322 from bomb 1312 containing PH$_3$ gas diluted to 25 vol. ppm with H$_2$ [hereinafter referred to as PH$_3$(25)/H$_2$], the inflow valve 1322 and the outflow valve 1327 were adjusted to determine the opening of the outflow valve 1327 so that the reading on the flowmeter 1340 might be 1/50 of the flow amount of SiH$_4$(10)/H$_2$, followed by stabilization.

Subsequently, with the shutter 1308 closed by operation of the shutter bar 1306 and the high frequency power source 1343 turned on, the glow discharge was recommenced. The input voltage applied thereby was 10 W. Thus, glow discharge was continued for additional 4 hours to form a photoconductive layer. The input power of the heater 1304 was decreased and the high frequency power source 1343 was then turned off, and, upon cooling of the substrate to 100° C., the outflow valves 1327 and 1324, and the inflow valves 1319 and 1322 were closed, with full opening of the main valve 1331 to evacuate the chamber 1301 to about $5 \times 10^{-7}$ torr. Thereafter, the outflow valves 1325 and 1328, and the shutter were re-opened, and an upper layer was formed in similar conditions and manner to those described in Example 1. Then the high frequency power source 1343 and the heater 1304 were turned off, and the outflow valves 1325 and 1328 were closed, with full opening of the main valve 1331 to evacuate the chamber 1301 to $10^{-5}$ torr, followed by leaking of the chamber 1301 to atmospheric through the leak valve 1330 with closing of the main valve 1331. Under such a state, the substrate having formed layers thereon was taken out. In this case, the total thickness of the layers formed was about $11\mu$.

The thus prepared image forming member was used for forming the image on a copying paper according to the same procedures under the same conditions as used in Example 1, whereby the image formed by $\ominus$ corona discharge was more excellent and clear, as compared with that formed by $\oplus$ corona discharge. From the results, the image forming member prepared in this Example was recognized to have a dependency on the charging polarity.

EXAMPLE 6

After an intermediate layer was formed for one minute on a molybdenum substrate according to the same procedures and under the same conditions as those in Example 1, the deposition chamber was evacuated to $5 \times 10^{-7}$ torr and SiH$_4$(10)/H$_2$ gas was introduced into the chamber 1301 according to the same procedures as those in Example 1. Then, under the pressure of B$_2$H$_6$(50)/H$_2$ gas from the bomb 1311 through the inflow valve 1321 at 1 kg/cm$^2$ (reading on the outlet pressure gauge), the inflow valve 1321 and the outflow valve 1326 were adjusted to determine the opening of the outflow valve 1326 so that the reading on the flowmeter 1339 might be 1/10 of the flow amount of SiH$_4$(10)/H$_2$ gas, followed by stabilization.

Subsequently, with the shutter 1308 closed by using the shutter bar 1306, the high frequency power source 1343 was turned on again to recommence glow discharge. The input voltage applied was 10 W. Thus, glow discharge was continued for additional 4 hours to form a photoconductive layer on the intermediate layer. The input power of the heater 1304 was decreased and the high frequency power source 1343 was turned off and, upon cooling of the substrate to 100° C., the outflow valves 1324 and 1326, and the feed valves 1319 and 1321 were closed, with full opening of the main valve 1331 to evacuate the chamber to about $5 \times 10^{-7}$ torr. Thereafter, the outflow valves 1325 and 1328, and the shutter 1308 were re-opened to form an upper layer in a similar manner to that described in Example 1. Then, the chamber 1301 was brought to atmospheric through the leak valve 1330 with closing of the main valve 1331, and the substrate having formed respective layers was taken out. In this case, the total thickness of the layers formed was about $10\mu$.

The thus prepared image forming member was used for forming an image on a copying paper according to the same procedures and under the same conditions as those in Example 1. As a result, the image formed by $\oplus$ corona discharge was more excellent in image quality and extremely clear, as compared with that formed by $\ominus$ corona discharge. The results show that the image forming member obtained in this Example has a dependency on charging polarity, however the dependency was opposite to those in the image forming members obtained in Examples 4 and 5.

EXAMPLE 7

Example 1 was repeated except that the Si$_2$H$_6$ gas bomb without dilution was used in place of SiH$_4$(10)/H$_2$ bomb 1309, and a B$_2$H$_6$ gas bomb diluted with H$_2$ to 500 vol. ppm [hereinafter referred to as B$_2$H$_6$(500)/H$_2$] in place of the B$_2$H$_6$(50)/H$_2$ bomb 1311, thereby to form an intermediate layer, a photoconductive layer and an upper layer on a molybdenum substrate. Then, taking out from the deposition chamber 1301, the image forming member prepared was subjected to the test for image formation by placing in the same experimental device for charging and exposure to light similarly to that of in Example 1. As a result, in case of the combination of $\ominus$5.5 KV corona discharge with a $\oplus$ charged developer, a toner image of very high quality with high contrast was obtained.

EXAMPLE 8

Formation of an intermediate layer was carried out for one minute on each of ten molybdenum substrates according to similar procedures and under similar conditions to those described in Example 1, and formation of a photoconductive layer was carried out for five hours on each above-mentioned intermediate layer. Thereafter, each upper layer shown in Table 4 was formed on each above-mentioned photoconductive layer.

In the case of Sample A16, the gas bomb 1312 of $PH_3(25)/H_2$ was previously changed to a bomb of $C_2H_4$ gas diluted with $H_2$ to 10 vol. % [hereinafter referred to as $C_2H_4(10)/H_2$]. After forming an intermediate layer and a photoconductive layer, the high frequency power source 1343 was turned off, the inflow valves 1324 and 1326 were closed, and the main valve 1331 was fully opened to evacuate in the device to $5 \times 10^{-7}$ torr. Then, the valve 1317, the inflow valves 1319 and 1322, and the outflow valves 1324 and 1327 were opened to introduce $SiH_4(10)/H_2$ gas and $C_2H_4(10)/H_2$ gas into the chamber. The inflow valves 1319 and 1322 were adjusted thereby so that the flow amount ratio of $SiH_4(10)/H_2$ gas to $C_2H_4(10)/H_2$ gas could be 1:9. Subsequently, the inner pressure in the chamber was adjusted to 0.5 torr by using the auxiliary valve 1329 and the main valve 1331. After confirming that the flow amount and the inner pressure in the chamber were stable and that the shutter was closed, the high frequency power source 1343 was turned on to input a high frequency power of 13.56 MHz and 3 W between the electrodes 1303 and 1308. After glow discharge was continued for 2 minutes, the high frequency power source 1343 and the heater 1304 were turned off. After the substrate was left to cool to 100° C., the outflow valves 1324 and 1327 were closed, and the main valve 1331 was fully opened to evacuate the chamber to $10^{-5}$ torr or below. Subsequently, the main valve 1331 was closed, followed by leaking of the chamber to atmospheric pressure through the leak valve 1330, and the substrate was taken out.

In the case of Sample A17, the bomb 1312 of $PH_3(25)/H_2$ was previously changed to a bomb of high purity nitrogen gas (purity: 99.999%). An upper layer was formed in a similar manner and under similar conditions to those in Sample A16 except that the flow amount ratio of $SiH_4(10)/H_2$ to the nitrogen gas was 1:10.

In the case of Sample A18, the gas bomb 1312 of $PH_3(25)/H_2$ was previously changed to a gas bomb containing $NH_3$ gas diluted with $H_2$ to 10 vol. % [hereinafter referred to as $NH_3(10)/H_2$]. An upper layer was formed in a similar procedure and under similar conditions to those in Sample A16 except that the flow amount ratio of $SiH_4(10)/H_2$ to $NH_3(10)H_2$ was 1:2.

In the cases of Samples 19, 20 and 21, after forming a photoconductive layer, the gas bomb 1309 of $SiH_4(10)/H_2$ was changed to a gas bomb of $SiF_4$ with $H_2$ content of 10 vol. % [hereinafer referred to as $SiF_4/H_2(10)$]. Further, in the case of Sample A19, the gas bomb 1312 of $PH_3(25)/H_2$ was changed to a gas bomb of $C_2H_4(10)/H_2$, and the flow amount ratio of $SiF_4/H_2(10)$ to $C_2H_4(10)/H_2$ was 1:9. In the case of Sample A20, the gas bomb 1312 of $PH_3(25)/H_2$ was changed to a gas bomb of high purity nitrogen gas (purity: 99.999%), and the flow amount ratio of $SiF_4(10)/H_2$ to nitrogen gas was 1:50. In the case of Sample A21, the gas bomb 1312 of $PH_3(25)/H_2$ was changed to a gas bomb of $NH_3$ gas diluted with $H_2$ to 10 vol. % [hereinafter referred to as $NH_3(10)/H_2$], and the flow amount ratio of $SiF_4(10)/H_2$ to $NH_3(10)/H_2$ was 1:20. In the cases of Samples A19, A20 and A21, each upper layer was formed in a similar procedure and under similar conditions to those of Sample A16, except that an alternate current input power was 60 W and for the above-mentioned conditions.

In the case of Sample A22, the bomb 1312 of $PH_3(25)/H_2$ was changed to a gas bomb containing $Si(CH_3)_4$ gas (purity: 99.999%) diluted with $H_2$ to 10 vol. % [hereinafter referred to as $Si(CH_3)_4(10)/H_2$]. After forming a photoconductive layer, the outflow valves 1324 and 1326 were closed, and the main valve 1331 was fully opened to evacuate the chamber to $5 \times 10^{-7}$ torr. Thereafter, $Si(CH_3)_4(10)/H_2$ gas was introduced into the chamber through the inflow valve 1322 and the outflow valve 1327 to adjust the inner pressure to 0.5 torr by the auxiliary valve 1329-1 and the main valve 1331. After confirming stabilization of the flow amount and the inner pressure, the high frequency power source 1343 was turned on to input a high frequency power of 13.56 MHz, 3 W between the electrodes 1303 and 1308. The glow discharge was continued for two minutes. After the heater 1304 was turned off with the high frequency power source 1343 being turned off, the substrate was left to 100° C., whereupon the outflow valve 1327 was closed, with the main valve 1331 fully opened, thereby to make the inner pressure in the chamber to less than $10^{-5}$ torr. Then, the main valve 1331 was closed and the inner pressure in the chamber was made atmospheric through the leak valve 1330, and the substrate was taken out.

In the cases of Samples A23 and A24, the gas bomb of $PH_3(25)/H_2$ was changed to a gas bomb of $N_2$ gas diluted with Ar to 50 vol. % [hereinafter referred to as $N_2(50)/Ar$]. Further, in the case of Sample A23, polycrystalline silicon (purity: 99.999%) was used as a target. In the case of Sample A24, high purity $Si_3N_4$ was used as a target. In each case, after forming a photoconductive layer, the inner pressure in the device was evacuated to $5 \times 10^{-7}$ torr, all valves were closed. Thereafer, the valve 1317 of the gas bomb 1312 containing $N_2/Ar$ was opened until the outlet pressure (the reading at the outlet pressure gauge 1335) was adjusted to 1 $kg/cm^2$. Then, the inflow valve 1322, the outflow valve 1327, and the auxiliary valve 1329-1 were opened to introduce the gas into the chamber. The auxiliary valve 1329-1 was adjusted until the inner pressure became $5 \times 10^{-4}$ torr (the reading at the pirani gauge 1341). Furthermore, the inner pressure was adjusted to $1 \times 10^{-2}$ torr by the main valve 1331. Thereafter, the shutter 1308 was opened by operation of the shutter bar 1306. The high frequency power source 1343 was turned on to input an alternate current power of 13.56 MHz and 100 W between the target 1305 and the fixing member 1303. After an upper layer was formed for two minutes under the conditions, the high frequency power source 1343 was turned off, subsequently the auxiliary valve 1329-1, the outflow valve 1328 and the inflow valve 1323 were closed, followed by full opening of the main valve 1331. After evacuating the chamber to $10^{-5}$ torr or below, the main valve 1331 was closed to make the inner pressure in the chamber atmospheric through the leak valve 1330, and the substrate was taken out.

In the case of Sample A25, an upper layer was formed under similar conditions and according to similar procedure to that for Sample A24, except that $SiO_2$ target 1305 was changed to a laminate in which graphite was laminated on polycrystalline Si in an area ratio of 1:9.

Using the thus prepared image forming members, A16 through A25, toner images were formed in a similar manner described in Example 1. As the results, there were obtained images excellent in resolution, gradation as well as image density, with respect to both combinations of −6 KV corona charge/positively charged developer and of +6 KV corona charge/negatively charged developer.

TABLE 4

| Sample No. | Upper layer | Starting gas or Target | Flow amount ratio or Area ratio | Preparation method | Power (W) | Layer thickness (Å) |
|---|---|---|---|---|---|---|
| A16 | A | $SiH_4$ (diluted with $H_2$ to 10 vol. %) $C_2H_4$ (diluted with $H_2$ to 10 vol. %) | $SiH_4(10)/H_2:C_2H_4(10)/H_2$ ... 1:9 | Glow | 3 | 120 |
| A17 | B | $SiH_4$ (diluted with $H_2$ to 10 vol. %) $N_2$ | $SiH_4(10)/H_2:N_2$ ... 1:10 | Glow | 3 | 120 |
| A18 | C | $SiH_4$ (diluted with $H_2$ to 10 vol. %) $NH_3$ (diluted with $H_2$ to 10 vol. %) | $SiH_4(10)/H_2:NH_3(10)/H_2$ ... 1:2 | Glow | 3 | 120 |
| A19 | D | $SiF_4$ ($H_2$ content: 10 vol. %) $C_2H_4$ (diluted with $H_2$ to 10 vol. %) | $SiF_4/H_2(10):C_2H_4(10)/H_2$ ... 1:9 | Glow | 60 | 120 |
| A20 | E | $SiF_4$ ($H_2$ content: 10 vol. %) $NH_3$ (diluted with $H_2$ to 10 vol. %) | $SiF_4/H_2(10):NH_3(10)/H_2$ ... 1:20 | Glow | 60 | 120 |
| A21 | F | $SiF_4$ ($H_2$ content: 10 vol. %) $N_2$ | $SiF_4/H_2(10):N_2$ ... 1:50 | Glow | 60 | 120 |
| A22 | G | $Si(CH_3)_4$ (diluted with $H_2$ to 10 vol. %) | — | Glow | 3 | 120 |
| A23 | H | Polycrystalline Si target $N_2$ (diluted with Ar to 50 vol. %) | — | Sputter | 100 | 200 |
| A24 | I | $Si_3N_4$ target $N_2$ (diluted with Ar to 50 vol. %) | — | Sputter | 100 | 200 |
| A25 | J | Polycrystalline Si target Graphite target Ar | C:Si = 9:1 | Sputter | 100 | 200 |

EXAMPLE 9

Figure 14:
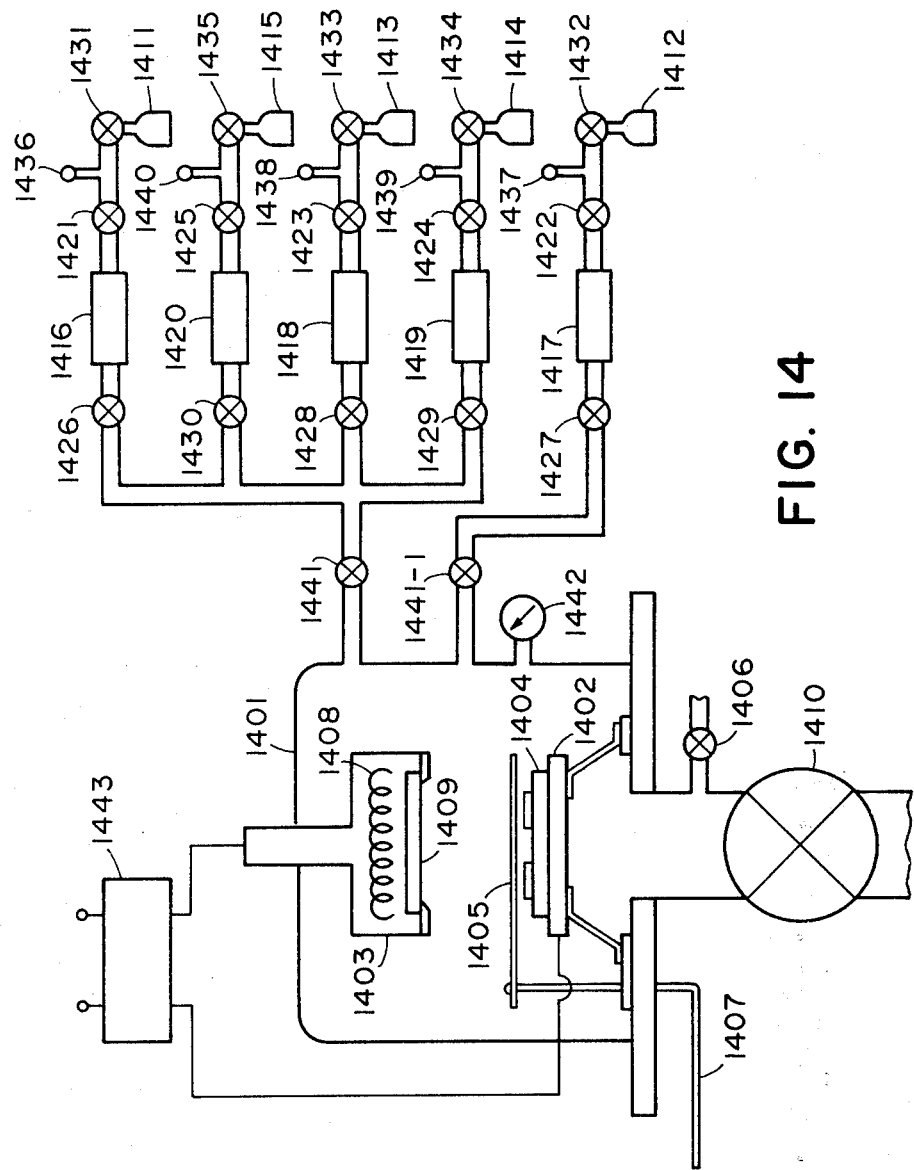

Using a device shown in FIG. 14 placed in a clean room which had been completely shielded, an image forming member for electrography was prepared according to the following procedures.

A substrate 1409 of molybdenum of 10 cm square having a thickness of 0.5 mm, whose surface had been cleaned, was fixed firmly on a fixing member 1403 disposed at a predetermined position in an deposition chamber 1401. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system are closed, the main valve 1410 was opened, and the chamber 1401 was evacuated to about $5 \times 10^{-6}$ torr. Thereafter, the input voltage for heater 1408 was elevated by varying the input voltage while detecting the substrate temperature until the temperature was stabilized at 200° C. This step was followed by opening the auxiliary valves 1441-1, 1441 and the outflow valves 1426, 1427, 1428 and inflow valves 1421, 1422, 1423 to remove sufficiently the gases in the also flow-meters 1416, 1417, 1418, and thereafter the auxiliary valves 1441-1 and 1441, and the valves 1426, 1427, 1428, 1421, 1422, 1423 were closed. The valve 1431 of the bomb 1411 containing $SiH_4$ gas (99.999% purity) diluted with $H_2$ to 10 volume % (hereinafter referred to $SiH_4(10)/H_2$), and a valve 1432 of bomb 1412 containing $O_2$ gas were opened until the reading on the outlet pressure gauge 1436 and 1437 were adjusted to 1 kg/cm², and then the inflow valves 1421 and 1422 were gradually opened, thereby to introducing $SiH_4(10)/H_2$ gas and $O_2$ gas into the flowmeters 1416 and 1417. Then, the auxiliary valve 1441 1441-1 and the outflow valve 1426, 1427 were gradually opened. At this time, the valves 1421 and 1422 were adjusted so that a feed ratio of $SiH_4(10)/H_2:O_2$ might be 10:1. The auxiliary valve 1441 was opened while detecting an inner pressure of the chamber with the Pirani gauge to become $1 \times 10^{-2}$ torr. After the inner pressure was stable, the main valve 1410 was gradually closed to throttle the opening to adjust the inner pressure in the chamber at 0.5 torr. After introducing gas and inner pressure were confirmed to be stabilized, the high frequency power 1443 was turned on, and a shutter 1405, which was also used as an electrode, was closed, the substrate temperature until the temperature was stabilized whereupon the high frequency power input an alternate current of 13.56 MHz, between the electrode 1403 and the shutter 1405 thereby generating flow discharge in the chamber 1401 to provide an input power of 3 W. Under these conditions, in order to deposit a layer of a-$(Si_xO_{1-x})_y:H_{1-y}$ on the substrate, discharge was continued for one minute to form an intermediate layer. The high frequency power source 1443 was turned off to terminate glow discharge.

After closing the outflow valve 1427 was closed, the inflow valve 1423 was opened to introduce $B_2H_6$ gas diluted with $H_2$ to 50 volume % (hereinafter referred to $B_2H_6(50)/H_2$) into flowmeter 1418 from the bomb 1413 through valve 1433 at 1 kg/cm$^2$ of gas pressure (reading on the outlet pressure gauge 1438). By adjusting the outflow valve 1428, the reading of flowmeter 1418 made stable so that a feed rate of $B_2H_6(50)/H_2$ might be 1/50 of $SiH_4(10)/H_2$.

Subsequently, the glow discharge was recommenced, with turning on the high frequency power source 1443 to provide an input power of 10 W, which was higher than before. After glow discharge was continued for 3 hours to form a photoconductive layer, the heater 1408 was turned off with the high frequency power source 1443 being also turned off, the substrate is left to cool to 100° C., whereupon the outflow valves 1426, 1428 and the inflow valves 1421, 1423 were closed, with the main valve 1410 fully opened, thereby to make the inner pressure in the chamber 1401 to $10^{-5}$ torr or below. Then, the main valve 1410 was closed and the inner pressure in the chamber was made atmospheric through the leak valve 1406, and the substrate having formed each layer thereon was taken out. In this case, the total thickness of the layers was about 9μ. The thus prepared image forming member for electrophotography was placed in a charge light-exposure experimental device, and corona charge was effected at ⊕6.0 KV for 0.2 sec., followed immediately by projection of a light image. The light image was projected through a transmission type test chart using a tungsten lamp as light source at an intensity of 1.0 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at an intensity of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography obtained in this Example has the characteristics of a both-polarity image forming member having no dependency on the charge polarity.

EXAMPLE 10

The image forming members shown by Sample Nos. B1 through B8 were prepared under the same conditions and procedures as used in Example 9 except that the sputtering time in forming the intermediate layer on the molybdenum substrate was varied as shown in Table 5 below, and image formation was effected by placing in entirely the same device as in Example 9 to obtain the results as shown in Table 5.

As apparently seen from the results shown in Table 5, it is necessary to form a intermediate layer having a thickness within the range of from 30 Å to 1000 Å to achieve the object of this invention.

TABLE 5

| Sample No. | B1 | B2 | B3 | B4 | B5 | B6 | B7 | B8 |
|---|---|---|---|---|---|---|---|---|
| Time for forming intermediate layer (sec.) | 10 | 30 | 50 | 180 | 420 | 600 | 1000 | 1200 |
| Image quality | | | | | | | | |
| Charge polarity + | Δ | ○ | ⊙ | ⊙ | ⊙ | ○ | Δ | X |
| Charge polarity − | X | Δ | ⊙ | ⊙ | ⊙ | ○ | Δ | X |

Remarks:
Ranks for evaluation:
⊙ excellent;
○ good;
Δ practically usable;
X not good
Deposition speed of intermediate layer: 1 Å/sec.

EXAMPLE 11

The image forming members for electrophotography shown by Sample Nos. B9 through B15 were prepared under the same conditions and procedures as in Example 9 except that the ratio of flow rate for $SiH_4(10)/H_2$ to $O_2$ in preparation of intermediate layer was varied as shown on the Table 6 below, and image formation was effected by placing in the same device as in Example 9 to obtain the results shown in Table 6. For only Samples Nos. B11 through B15, intermediate layers were analyzed by electron microbe method to give the results as shown in Table 7.

As apparently seen from the results shown in Tables 6 and 7, it is desirable that x related to the ratio of Si to O in the intermediate layer is 0.4 to 0.33, in order to achieve the objects of the invention.

TABLE 6

| Sample No. | B9 | B10 | B11 | B12 | B13 | B14 | B15 |
|---|---|---|---|---|---|---|---|
| $SiH_4/H:O_2$ (Feed ratio) | 100:1 | 100:2 | 100:4 | 100:6 | 100:8 | 10:1 | 10:1.5 |
| Copied image quality: | | | | | | | |
| Charge polarity + | X | X | X | Δ | ⊙ | ⊙ | ⊙ |
| Charge polarity − | X | X | X | Δ | ⊙ | ⊙ | ⊙ |

TABLE 7

| | ($Si_xO_{1-x}$) | | | | |
|---|---|---|---|---|---|
| Sample No. | 11 | 12 | 13 | 14 | 15 |
| x | 0.45 | 0.40 | 0.36 | 0.33 | 0.33 |

EXAMPLE 12

After providing an intermediate layer on a molybdenum substrate in a similar to the way described in Example 9, the chamber was evacuated to about $5 \times 10^{-6}$ torr and the substrate was maintained at 200° C.

The auxiliary valve 1441, the outflow valves 1426, 1427, and the inflow valves 1421, 1422 were fully opened to evacuate in the flow meter 1416, 1417. After being closed the auxiliary valves 1441-1, 1441, and valves 1426, 1427, 1421, 1422, the valve 1431 of the bomb 1411 containing $SiH_4(10)/H_2$ gas (99.999% purity) and the valve 1432 of the bomb 1412 containing $O_2$ gas were opened.

Subsequently, with adjusting the pressure in the outlet pressure gauges 1436, 1437 to 1 kg/cm$^2$, the inflow valves 1421, 1422 were gradually opened to introduce SiH$_4$(10)/H$_2$ gas and O$_2$ gas into the flowmeters 1416, 1417 followed successively by opening gradually of the outflow valves 1426, 1427 and further by opening the auxiliary valves 1441 and 1441-1.

Under this state, the inflow valves 1421, and 1422 were adjusted so that the flow rate of SiH$_4$(10)/H$_2$:O$_2$ gas might be 10:1.

While detecting the inner pressure in the chamber 1401, by the Pirani gauge 1442, opening of the auxiliary valves 1421, 1422 were adjusted to 1×10$^{-2}$ torr. After the inner pressure was stabilized under this state, the main valve 1410 was grdually closed to throttle its opening until the inner pressure in the chamber became 0.5 torr.

Confirming stabilization of gas feeding and of inner pressure, the shutter 1405 which was also used as electrode, was closed, followed by turning on the high frequency power source 1443 to input a high frequency power of 13.56 MHz between the electrodes 1403 and 1405, thereby generating glow discharge in the chamber 1401, to provide an input power of 3 W. Glow discharge was continued for 1 minute to form an intermediate layer of a-(Si$_x$O$_{1-x}$)$_y$:H$_{1-y}$ on the substrate and thereafter the high frequency power source 1443 turned off, for intermission of glow discharge. Subsequently, the outflow valve was closed and the flow discharge was rcommenced by turning on the high frequency power source 1443 to provide an input power of 10 W which was higher than before. Glow discharge was continued further 5 hours to form a photoconductive layer, and thereafter the heater 1408 was turned off and also the high frequency power source 1443 was turned off. Upon cooling of the substrate to a temperature to 100° C., the outflow valve 1426 and the inflow valves 1421, 1422 were closed, with full opening of the main valve 1410 to evacuate the chamber 1401 to 10$^{-5}$ torr or less. Thereafter, the main valve 1410 was closed, the the inner pressure in the chamber 1401 to atmospheric through the leak valve 1406, and the substrate having formed respective layers was taken out. In this case, the total thickness of the layers was found to be about 15μ. The thus prepared image forming member for electrophotography was subjected to image formation on a copying paper. As a result, the image formed by ⊖ corona discharge was better in quality and very clear, as compared with that formed by ⊕ corona discharge. The results show that the image forming member prepared in this Examples is dependent on the charge polarity.

EXAMPLE 13

After an intermediate layer was formed for one minute on a molybdenum substrate using conditions and procedures similar to those described Example 9, the high frequency power 1443 was turned off for intermission of glow discharge. Subsequently the outflow valve 1427 was closed. Thereafter, under the gas pressure at 1 kg/cm$^2$ (reading on the outlet pressure gauge 1439) through the valve 1433 from bomb 1414 containing PH$_3$ was diluted with H$_2$ to 25 vol. ppm (hereinafter referred to as PH$_3$(25)/H$_2$, the inflow valve 1424 was opened to introduce PH$_3$(25)/H$_2$ gas into the flow meter 1419 and the outflow valve 1429 was adjusted the outflow valve so that the reading on the flowmeter 1419 may be 1/50 of the flow amount of SiH$_4$(10)/H$_2$, followed by stabilization. Subsequently, the high frequency power source 1443 was turned on to recommence glow discharge. The input power was 10 W, which was made higher than in formation of the intermediate layer. Thus, glow discharge was continued for 4 hours to form a upper layer on the photoconductive layer. Then, the heater 1408 and the high frequency power source 1443 were turned off and the substrate was left to cool. Upon reaching 100° C. or lower of the substrate temperature, the outflow valves 1426, 1429 and the inflow valves 1421, 1424 were closed, with full opening of the main valve 1410 thereby evacuating the chamber to 1×10$^{-5}$ torr or below. Then, the main valve 1410 was closed to return the chamber 1401 to atmospheric through the leak valve 1406 so as to be ready to take out the substrate having formed respective layers. In this case, the total thickness of the layers was found to be about 11μ. The thus prepared image forming member for electrophotography was subjected to image formation on a copying paper similarly as in Example 9. As a result, the image formed by ⊖ corona discharge was better in quality and very clear, as compared with that formed by ⊕ corona discharge. The results show that the image forming member prepared in this Example is dependent on the charge polarity.

EXAMPLE 14

After an intermediate layer was formed for one minute on a molybdenum substrate using conditions and procedures similar to those described Example 9, the high frequencypower source 1443 was turned off for intermission of glow discharge. Under this state, the outflow valve 1427 was closed. Thereafter, under the gas pressure at 1 kg/cm$^2$ (reading on the outlet pressure gauge 1438) the inflow valve 1423 was opened to introduce B$_2$H$_6$(50)/H$_2$ gas to flowmeter 1418 through the valve 1433 of the bomb 1413, and the inflow valve 1423 and the outflow valve 1428 were adjusted to determine the opening of the outflow valve 1428 so that the reading on the flowmeter 1418 might be 1/10 of the flow amount of SiH$_4$(10)/H$_2$, followed by stabilization.

Subsequently, the high frequency power source 1443 turned on, the glow discharged was recommenced. The input voltage applied thereby was 10 W, which made higher than before. Thus, glow discharge was continued for additional 3 hours to form a photoconductive layer on the intermediate layer. The heater 1408 and the high frequency power source 1443 were then turned off, and, upon cooling of the substrate to 100° C., the outflow valves 1426, 1428 and the inflow valves 1421, 1423 were closed, with full opening of the main valve 1410 to evacuate the chamber 1401 to 10$^{-5}$ torr or below, followed by leaking of the chamber 1401 to atmospheric through the leak valve 1406 with closing of the main valve 1410. Under such a state, the substrate having formed layers thereon was taken out. In this case, the total thickness of the layers formed was about 10μ.

The thus prepared image forming member for electrophotography was used for forming the image on a copying paper according to the same procedures under the same conditions as described in Example 9, whereby the image formed by ⊖ corona discharge was more excellent and clear, as compared with that formed by ⊕ corona discharge. From the results, the image forming member prepared in this Example was recognized to have a dependency on the charge polarity, however, was opposite to those in the image forming members obtained in Examples 12 and 13.

EXAMPLE 15

The substrate 1409 of molybdenum was fixed firmly on the fixing member 1403 disposed at a predetermined position in the deposition chamber 1401 in the same manner as in the Example 9. The target was used of high pure $SiO_2$. After confirming closing all valves, the main valve was fully opened to effect evacuation in the chamber 1401 to about $5 \times 10^{-6}$ torr.

The input voltage for the heater 1408 was increased by varying the input voltage while detecting the substrate temperature, until it was constant at 200° C.

Thereafter, the auxiliary valves 1441-1, 1441 and then the outflow valves 1426, 1428, 1430 were opened fully to effect evacuation to vacuum also in the flowmeters 1416, 1418, 1420. Thereupon the auxiliary valves 1441-1, 1441 and the outflow valves 1426, 1428 were closed, and the valve 1435 of the bomb 1415 containing Ar gas (99.999% purity) contained $H_2$ in 30 volume % (hereinafter referred to $Ar/H_2(30)$) was opened and the pressure at the outlet pressure gauge 1440 was adjusted to 1 kg/cm², followed by opening gradually the inflow valve 1424 to let in the $Ar/H_2(30)$ gas into the chamber 1401. Subsequently, the outflow valve 1430 was gradually opened until the indication on the Pirani gauge 1442 become $5 \times 10^{-4}$ torr. After the inner pressure in the chamber was stabilized, the main valve 1410 was gradually closed to throttle its opening until the indication on the Pirani gauge 1442 became $1 \times 10^{-2}$ torr. With the shutter 1405 opened by operating with shutter rod 1407, the flowmeter 1420 was confirmed to be stabilized, whereupon the high frequency power 1443 was turned on to input an alternate current of 13.56 MHz, 100 W between the target 1404 and the fixing member 1403. Under these conditions, a layer was formed while taking matching so that stable discharge may be continued. In this manner, discharge was contitnued for one minute to form an intermediate layer of a thickness of 100 Å. Then, the high frequency power 1443 was once turned off for intermission of the discharge. Subsequently, the outflow valve 1430 was closed and the main valve 1410 fully opened to outgas the gas in the chamber 1401 until it was evacuated to $5 \times 10^{-7}$ torr.

Then, after closing the valve 1435 the auxiliary valve 1441, subsequently the outflow valve 1430 and the inflow valve 1425, were fully opened to effect degassing sufficiently of the flowmeter 1420 to vacuo. After closing the auxiliary valve 1441 and the outflow valve 1430, the valve 1431 of the bomb 1411 containing $SiH_4(10)/H_2$ gas (purity: 99.999%) and the valve 1433 of the bomb 1413 containing $B_2H_6(50)/H_2$ were respectively opened to adjust the pressures at the outlet pressure gauges 1436 and 1438, respectively, at 1 kg/cm², whereupon the inflow valves 1421 and 1423 were gradually opened to introduce $SiH_4(10)/H_2$ gas and $B_2H_6(50)/H_2$ gas into the flowmeters 1416 and 1418, respectively. Subsequently, the outflow valves 1426 and 1428 were gradually opened, followed by opening of the auxiliary valves 1441-1, 1441-2. The inflow valves 1421 and 1423 were adjusted thereby so that the gas feed ratio of $SiH_4(10)/H_2$ to $B_2H_6(50)/H_2$ was 50:1. Then, while carefully reading the Pirani gauge 1442, the opening of the auxiliary valve 1441 was adjusted and the auxiliary valves 1441-1, 1441-2 were opened to the extent until the inner pressure in the chamber 1401 became $1 \times 10^{-2}$ torr. After the inner pressure in the chamber 1401 was stabilized, the main valve 1410 was gradually closed to throttle its opening until the indication on the Pirani gauge 1442 became 0.5 torr. After confirming that the gas feeding and the inner pressure were stable, the shutter 1405 was closed, followed by turning on of the high frequency power source 1443, to input a high frequency power of 13.56 MHz between the electrodes 1403 and 1405, thereby generating glow discharge in the chamber 1401 to provide an input power of 10 W. After glow discharge was continued for 3 hours to form a photoconductive layer, the heater 1408 was turned off with the high frequency power source 1443 being also turned off, the substrate is left to cool to 100° C., whereupon the outflow valves 1426, 1428 and the inflow valves 1421, 1423, 1425 were closed, with the main valve 1410 fully opened, thereby to make the inner pressure in the chamber 1401 to $10^{-5}$ torr or below. Then, the main valve 1410 was closed and the inner pressure in the chamber 1401 was made atmospheric through the leak valve 1406, and the substrate having formed each layer thereon was taken out. In this case, the total thickness of the layers was about 9μ. The thus prepared image forming member for electrophotography was placed in a charge light-exposure experimental device, and corona charge was effected at ⊕6.0 KV for 0.2 sec., followed immediately by projection of a light image. The light image was projected through a transmission type test chart using a tungsten lamp as light source at an intensity of 0.8 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at an intensity of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography obtained in this Example has the characteristics of a both-polarity image forming member having no dependency on the charge polarity.

EXAMPLE 16

An intermediate layer and a photoconductive layer were formed on a substrate of molybdenum under the same conditions and procedures as in Example 9 except that the bomb 1411 containing $SiH_4(10)/H_2$ gas was substituted with a bomb containing $SiH_4$ gas without any dilution, and the bomb 1413 containing $B_2H_6(50)/H_2$ gas was substituted with a bomb containing $B_2H_6$ gas diluted with $H_2$ to 500 volume ppm (hereinafter referred to $B_2H_6(500)/H_2$). After taking out of the chamber 1401, the thus prepared image forming member for electrophotography was used for forming an image on a copying paper according to the same procedures and under the same conditions as described in Example 9. As a result, the image formed by the combination of ⊖5.5 KV corona discharge and positive chargeable toner was obtained more excellent in quality and very clear image.

EXAMPLE 17

After conducting formation of an intermediate layer for one minute and then formation of a photoconductive layer for 5 hours on a molybdenum substrate according to the same procedures under the same conditions as described in Example 9, the high frequency power 1443 was turned off for intermission of the glow discharge. Subsequently, the outflow valve 1428 was closed and the outflow valve 1427 was opened again so that the conditions might be maintained as of forming intermediate layer.

Subsequently, with the shutter 1405 closed, the high frequency power source was turned on again to recommence glow discharge. The input voltage applied was 3 W which was the same as in forming intermediate layer. Thus, glow discharge was continued for additional 2 minutes to form an upper layer on the photoconductive layer. The heater 1408 and the high frequency power source 1443 were turned off and, upon cooling of the substrate to 100° C., the outflow valves 1426, 1427 and the inflow valves 1421, 1422 were closed, with full opening of the main valve 1410 to evacuate the chamber 1401 to $10^{-5}$ torr or below. Then, the chamber 1401 was brought to atmospheric through the leak valve 1406 with closing of the main valve 1410, and the substrate having formed respective layers was taken out.

The thus prepared image forming member for electrophotography was used for forming an image on a copying paper according to the same procedures and under the same conditions as described in Example 9. As a result, the image formed by the both combinations, ⊖6 KV corona discharge/⊕ chargeable toner, and ⊕6 KV corona discharge/⊖ chargeable toner were more excellent in image quality and extremely clear.

EXAMPLE 18

After conducting formation of an intermediate layer for one minute and then formation of a photoconductive layer for 5 hours on a molybdenum substrate according to the same procedures under the same conditions as described in Example 9, various upper layers were provided as shown in Table 8 below.

The upper layers of samples B16, B17 and B18 were prepared under the same conditions and procedures as described in Example 9 except that the condition stated below. In forming sample B16, the bomb 1414 containing $PH_3(25)/H_2$ gas was substituted with a bomb containing $C_2H_4$ diluted with $H_2$ to 10 volume % and flow rate was adjusted so that a ratio of $SiH_4(10)/H_2:C_2H_4(10)/H_2$ might be 1:9. In sample B17, the gas contained in the bomb 1414 above was substituted with a high pure $N_2$ gas (99.999% purity) and a ratio of $SiH_4(10)/H_2:N_2$ was made 1:10. In Sample B18, the gas contained in the bomb 1414 above was substituted with $NH_3$ gas diluted with $H_2$ to 10 volume % (hereinafter referred to $NH_3(10)/H_2$), and ratio of $SiH_4(10)/H_2:NH_3(10)H_2$ was made 1:2.

Similarly, the upper layers of samples B19, B20 and B21 were prepared under the same conditions and procedures as described in Example 9 except that the conditions also stated below.

In sample B19, the bomb 1411 containing $SiH_4(10)/H_2$, and the bomb 1414 containing $PH_3(25)/H_2$ were substituted with a bomb containing $SiF_4$ contained $H_2$ in 10 volume % (hereinafter referred to $SiF_4/H_2(10)$) and a bomb containing $C_2H_4$ diluted with $H_2$ to 10 volume % (hereinafter referred to $C_2H_4(10)/H_2$) respectively, and feed ratio of $SiF_4/H_2(10):C_2H_4(10)/H_2$ was made 1:9.

In sample B20, the bomb 1414 above was substituted with a bomb containing highly pure $N_2$ gas (99.999% purity) with the same substitution of the bomb 1411 as in sample B19, and feed ratio of $SiF_4/H_2(10):N_2$ was made 1:50.

In sample B21, the bomb 1414 above was substituted with a bomb containing $NH_3$ gas diluted with $H_2$ to 10 volume % (hereinafter referred to $NH_3(10)/H_2$) with the same substitution of the bomb 1411, and feed ratio of $SiF_4/H_2(10):NH_3(10)/H_2$ was made 1:20.

And further, informing sample B22, the photoconductive layer was prepared with substitution of the bomb 1414 containing $PH_3(25)/H_2$ with a bomb containing $Si(CH_3)_4$ diluted with $H_2$ to 10 volume % (hereinafter referred to $Si(CH_3)_4(10)/H_2$), and thereafter, the outflow valves 1426, 1428 was closed with fully opening main valve 1410 to evacuate the chamber to $5 \times 10^{-6}$ torr, followed by introducing $Si(CH_3)_4(10)/H_2$ gas into the chamber through the inflow valve 1424 and the outflow valve 1429 whereby the upper layer was prepared under the same conditions and procedures as described in Example 9.

In samples B23 and B24, each photoconductive layer was formed under the conditions shown in Table 8. In sample B25, a photoconductive layer was formed under the following conditions: the target was replaced with the graphite laminated polycrystalline Si having the surface area ratio of Si:C was 1:9; the bomb 1414 containing $PH_3(25)/H_2$ was substituted with a bomb containing Ar.

Then, after evacuating the chamber to $5 \times 10^{-7}$ torr, and all valves were closed, the valve 1434 of the bomb 1414 was opened at 1 kg/cm² (reading on the outlet pressure gauge 1439).

The inflow valve 1424, the outflow valve 1429, and the auxiliary valve 1441 were opened to introduce the gas into the chamber, and the auxiliary valve and the main valve were adjusted so that the inner pressure in the chamber became $1 \times 10^{-2}$ torr (reading on the Pirani gauge 1442). With opening the shutter 1405 by operating shutter rod 1407, the high frequency power source was turned on and an alternate current of 13.56, 100 W was inputted between the target 1404 and the fixing member 1403. Under these conditions, after the upper layer was formed for 2 minutes, the high frequency power source was turned off and the auxiliary valve 1441-1, 1441, the outflow valve 1429, and inflow valve 1424 were closed, followed by full opening of the main valve 1410. After drawing out the gas in the chamber to $10^{-5}$ torr or less, the main valve 1410 was then closed with opening of the leak valve 1406 to leak the deposition chamber to atmospheric, whereupon the substrate having formed respective layers was taken out.

A toner image was formed using with thus prepared image forming member shown as Sample Nos. B16 through B25 under the same conditions and procedures as described in Example 9, whereby the image formed by the Example was more excellent and clear, as compared with that formed by both combinations, i.e., ⊖6 KV corona discharge/⊕ chargeable toner, and ⊕6 KV corona discharge/⊖ chargeable toner.

TABLE 8

| Sample No. | Upper layer | Raw gas or target | Feed ratio or ratio of surface area | Method of prep. | Power (W) | Thick. of layer (Å) |
|---|---|---|---|---|---|---|
| B16 | A | SiH$_4$ (diluted with H$_2$ to 10 vol. %) C$_2$H$_4$ (diluted with H$_2$ to 10 vol. %) | SiH$_4$(10)/H$_2$:C$_2$H$_4$(10)/H$_2$ = 1:9 | Glow | 3 | 120 |
| B17 | B | SiH$_4$ (diluted with H$_2$ to 10 vol. %) | SiH$_4$(10)/H$_2$:N$_2$ = 1:10 | Glow | 3 | 120 |
| B18 | C | SiH$_4$ (diluted with H$_2$ to 10 vol. %) NH$_3$ (diluted with H$_2$ to 10 vol. %) | SiH$_4$(10)/H$_2$:NH$_3$(10)/H$_2$ = 1:2 | Glow | 3 | 120 |
| B19 | D | SiF$_4$ (contained H$_2$ in 10 vol. %) C$_2$H$_4$ (diluted with H$_2$ to 10 vol. %) | SiF$_4$/H$_2$(10):C$_2$H$_4$(10)/H$_2$ = 1:9 | Glow | 60 | 120 |
| B20 | E | SiF$_4$ (contained H$_2$ in 10 vol. %) NH$_3$ (diluted with H$_2$ to 10 vol. %) | SiF$_4$/H$_2$(10):NH$_3$(10)/H$_2$ = 1:20 | Glow | 60 | 120 |
| B21 | F | SiF$_4$ (contained H$_2$ in 10 vol. %) N$_2$ | SiF$_4$/H$_2$(10):N$_2$ = 1:50 | Glow | 60 | 120 |
| B22 | G | Si(CH$_3$)$_4$ (diluted with H$_2$ to 10 vol. %) | — | Glow | 3 | 120 |
| B23 | H | Polycrystalline Si target N$_2$ (diluted with Ar to 50 vol. %) | — | Sputtering | 100 | 200 |
| B24 | I | Si$_3$N$_4$ Target N$_2$ (diluted with Ar to 50 vol. %) | — | Sputtering | 100 | 200 |
| B25 | J | Polycrystalline Si target Graphite target Ar | Si:C = 1:9 (ratio of surface area) | Sputtering | 100 | 200 |

EXAMPLE 19

Using a device shown in FIG. 13 placed in a clean room which had been completely shielded, an image forming member for electrography was prepared according to the following procedures.

A substrate 1302 of molybdenum of 10 cm square having a thickness of 0.5 mm, whose surface had been cleaned, was fixed firmly on a fixing member 1303 disposed at a predetermined position in a deposition chamber 1301. The target 1305 comprised a high purity SiO$_2$. The substrate 1302 was heated with a heater 1304 within the supporting member 1303 with a precision of ±0.5° C. The temperature was measured directly with an alumel-chromel thermocouple at the backside surface of the substrate. Then, after confirming that all the valves in the system were closed, the main valve 1331 was opened, and evacuation was effected once to about 5×10$^{-7}$ torr (during the evacuation, all the other valves in the system are closed). Then the substrate temperature was arisen to stabilize constant temperature at 100° C. by varying an input charge with detecting the substrate temperature. This step was followed by opening the auxiliary valve 1329-1 and 1329-2 and the outflow valves 1324, 1325, 1326, 1328 to remove sufficiently the gases in the flowmeters 1337, 1338, 1339 and 1341 and thereafter the outflow valves 1324, 1325, 1326, 1328 were closed. The valve 1318 of the bomb 1313 containing argon gas (99.999% purity) diluted with oxygen in 20 volume % (hereinafter referred to as O$_2$(20)/Ar) was opened until the reading on the outlet pressure gauge 1336 was adjusted to 1 kg/cm$^2$, and then the inflow valve 1323 was opened, followed by gradual opening of the outflow valve 1328. And also the valve 1315 of the bomb containing SiF$_4$ (99.999% purity) was opened until the reading on outlet pressure gauge 1333 was adjusted to 1 kg/cm$^2$. Then, the inflow valve 1320 and the outflow valve 1325 were opened. A flow rate of SiF$_4$ gas:O$_2$(20)/Ar gas was adjusted in 1:20 by controlling inflow valves 1320 and 1323. The auxiliary valve 1329 was opened until the indication on the Pirani gauge 1342 became 5×10$^{-4}$ torr, which state was maintained until the flow amount was steady. Thereafter, the main valve 1331 was gradually closed to throttle the opening to adjust the inner pressure in the chamber at 1×10$^{-2}$ torr. With the shutter 1308 opened by operating shutter rod 1306, the flowmeter 1338 and 1341 were confirmed to be stabilized, whereupon the high frequency power 1343 was turned on to input an alternate current of 13.56 MHz, 100 W between the target 1305 and the fixing member 1303. Under these conditions, a layer was formed while taking matching so that stable discharge may be continued. In this manner, discharge was continued for one minute to form an intermediate layer of a thickness of 100 Å. Then, the high frequency power 1343 was turned off for intermission of the discharge. Subsequently, the outflow valves 1325 and 1328 were closed and the main valve 1331 fully opened to outgas the gas in the chamber 1301 until it was evacuated to 5×10$^{-7}$ torr. Thereafter, the input voltage for the heater 1304 was elevated by varying the input voltage while detecting the substrate temperature until the temperature was stabilized constantly at 200° C.

After closing the auxiliary valve 1329-1 and 1329-2 the valve 1314 of the bomb 1309 containing SiH$_4$ gas (99.999% purity) diluted with H$_2$ to 10 vol. % [hereinafter referred to as SiH$_4$(10)/H$_2$] and the valve 1316 of the bomb 1311 containing B$_2$H$_6$ (99.999% purity) gas diluted with H$_2$ to 50 vol. ppm [hereinafter referred to as $B_2H_6(50)/H_2$] were respectively opened to adjust the pressures to 1 kg/cm² at the outlet pressure gauges 1332 and 1334, respectively, whereupon the inflow valves 1319 and 1321 were gradually opened to introduce $SiH_4(10)/H_2$ gas and $B_2H_6(50)/H_2$ gas into the flowmeters 1337 and 1339, respectively. Subsequently, the outflow valves 1324 and 1326 were gradually opened, followed by opening of the auxiliary valves 1329-1. The inflow valves 1319 and 1321 were adjusted thereby so that the gas feed ratio of $SiH_4(10)/H_2:B_2H_6(50)/H_2$ was 50:1. Then, while carefully reading the Pirani gauge 1342, the opening of the auxiliary valve 1329 was adjusted and the auxiliary valve 1329 was opened to the extent until the inner pressure in the chamber 1301 became $1 \times 10^{-2}$ torr. After the inner pressure in the chamber 1301 was stabilized, the main valve 1331 was gradually closed to throttle its opening until the indication on the Pirani gauge 1342 became 0.5 torr. After confirming that the gas feeding and the inner pressure were stable, the shutter 1308, which is also used as electrode, was closed by operating a shutter rod 1306, followed by turning on of the high frequency power source 1343 to input a high frequency power of 13.56 MHz between the electrodes 1303 and 1308, thereby generating glow discharge in the chamber 1301 to provide an input power of 10 W. After glow discharge was continued for 3 hours to form a photoconductive layer, the input of heater 1304 was reduced with the high frequency power source 1343 being turned off, the substrate was left to cool to 100° C., whereupon the outflow valves 1324, 1326 and the inflow valves 1319, 1321 were closed, with the main valve 1331 fully opened, thereby to make the inner pressure in the chamber 1301 to $5 \times 10^{-7}$ torr. Then, the main valve 1331 was closed and the inner pressure in the chamber 1301 was made atmospheric through the leak valve 1330 and the substrate having formed each layer thereon was taken out. In this case, the total thickness of the layers was about $9\mu$. The thus prepared image forming member for electrophotography was placed in a charge light-exposure experimental device, and corona charge was effected at ⊕6.0 KV for 0.2 sec., followed immediately by projection of a light image. The light image was projected through a transmission type test chart using a tungsten lamp as light source at an intensity of 0.8 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at an intensity of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography obtained in this Example has the characteristics of a both-polarity image forming member having no dependency on the charge polarity.

EXAMPLE 20

The image forming members shown as Sample Nos. C1 through C8 were prepared under the same conditions and procedures as used in Example 19 except that the sputtering time in forming the intermediate layer on the molybdenum substrate was varied as shown in Table 9 below and image formation was effected by placing in entirely the same device as in Example 19 to obtain the results as shown in Table 9.

As apparently seen from the results shown in Table 9, it is necessary to form a intermediate layer having a thickness within the range of from 30 Å to 1000 Å to achieve the object of this invention.

TABLE 9

| Sample No. | C1 | C2 | C3 | C4 | C5 | C6 | C7 | C8 |
|---|---|---|---|---|---|---|---|---|
| Time for forming intermediate layer (sec.) | 10 | 30 | 50 | 150 | 300 | 500 | 1000 | 1200 |
| Image quality | | | | | | | | |
| Charge polarity + | △ | ○ | ◉ | ◉ | ◉ | ○ | △ | X |
| Charge polarity − | X | △ | ◉ | ◉ | ◉ | ○ | △ | X |

Remarks:
Ranks for evaluation:
◉ excellent;
○ good;
△ practically usable;
X not good;
Deposition speed of intermediate layer: 1 Å/sec.

EXAMPLE 21

The image forming members for electrophotography shown by Sample Nos. C9 through C14 were prepared under the same conditions and procedures as in Example 19 except that the amount of oxygen contained in the bomb 1313 containing $O_2(20)/Ar$ and using for preparing intermediate layer on the substrate were varied as shown in Table 10 below, and image formation was effected by placing in the same device as in Example 19 to obtain the results shown in Table 10. For only Samples Nos. C10 through C14, intermediate layers were analyzed by electron microbe method to give the results as shown in Table 11.

As apparently seen from the results shown in Tables 10 and 11, it is desirable that the ratio x of Si to O in the intermediate layer is 0.33 to 0.40 in order to achieve the objects of the invention.

TABLE 10

| Sample No. | C9 | C10 | C11 | C12 | C13 | C14 |
|---|---|---|---|---|---|---|
| Amount of $O_2$ in $O_2/Ar$ gas bomb (vol. %) | 0 | 5 | 10 | 15 | 20 | 25 |
| Copied image quality | | | | | | |
| Charge polarity + | X | X | △ | ○ | ◉ | ◉ |
| Charge polarity − | X | X | △ | ○ | ◉ | ◉ |

TABLE 11

| | $Si_xC_{1-x}$ | | | | |
|---|---|---|---|---|---|
| Sample No. | C10 | C11 | C12 | C13 | C14 |
| x | 0.44 | 0.40 | 0.37 | 0.33 | 0.33 |

EXAMPLE 22

After preparing an intermediate layer on a substrate of molybdenum under the same conditions and procedures as used in Example 19, a shutter was closed flowed by being closed outflow valves 1325 and 1328, and subsequently, an input charge for heater 1304 was increased and varied while detecting a substrate temperature to stabilize at 200° C.

Then the outflow valve 1324 and inflow valve 1319 were fully opened to effect degassing sufficiently of a flowmeter 1337 to vacuo. After closing the inflow valve 1319 and outflow valve 1324, the valve 1314 of the bomb 1309 containing SiH$_4$(10)/H$_2$ gas (99.999% purity) to adjust the pressure to 1 kg/cm$^2$, whereupon the inflow valve 1319 was gradually opened to introduce SiH$_4$(10)/H$_2$ gas into the flowmeter 1337. Subsequently, the outflow valve 1324 was gradually opened. Then, while carefully reading the Pirani gauge 1324, the opening of the auxiliary valve 1329-1 and 1329-2 were adjusted. After the inner pressure in the chamber 1301 was stabilized, the main valve 1331 was gradually closed to throttle its opening until the indication on the Pirani gauge 1342 become 0.5 torr. After confirming that the gas feeding and the inner pressure were stable, the high frequency power source 1343 was turned on to input a high frequency power of 13.56 MHz between the electrodes 1308 and 1303, thereby generating glow discharge in the chamber 1301 to provide an input power of 10 W. After glow discharge was continued for 3 hours to form a photoconductive layer, the heater 1304 was turned off with the high frequency power source 1343 being turned off, the substrate was left to cool to 100° C., whereupon the outflow valve 1324 and inflow valve were closed, with the main valve 1331 fully opened, thereby to make the inner pressure in the chamber 1301 to $5\times10^{-7}$ torr or below. Then, the main valve 1331 was closed and the inner pressure in the chamber 1301 was made atmospheric through the leak valve 1330, and the substrate was taken out. In this case, the total thickness of the layers was about 9μ. The thus prepared image formation on a copying paper according to the same process as in Example 19. As a result, the image formed by ⊖ corona discharge was better in quality and very clear, as compared with that formed by ⊕ corona discharge. The results show that the image forming member prepared in this Example is dependent on the charge polarity.

EXAMPLE 23

After an intermediate layer was formed for one minute on a molybdenum substrate using conditions and procedures similar to those described Example 19, the deposition chamber 1301 was evacuated to $5\times10^{-7}$ torr, whereupon SiH$_4$(10)/H$_2$ gas was introduced into the deposition chamber according to the same procedures as used in Example 19. Thereafter, under the gas pressure at 1 kg/cm$^2$ (reading on the outlet pressure gauge 1335) through the valve 1317 and the inflow valve 1322 from bomb 1312 containing PH$_3$ gas diluted to 25 vol. ppm (hereinafter referred to as PH$_3$(25)/H$_2$, the inflow valve 1322 and the outflow valve 1327 were adjusted to determine the opening of the outflow valve 1327 so that the reading on the flowmeter 1340 may be 1/50 of the flow amount of SiH$_4$(10)/H$_2$, followed by stabilization.

Subsequently, with the shutter 1308 closed by operating with shutter rod 1306 and the high frequency power source 1308 turned on, the glow discharged was recommenced. The input voltage applied thereby was 10 W. Thus, glow discharge was continued for additional 4 hours to form a photoconductive layer on the intermediate layer. The heater 1304 and the high frequency power source 1343 were then turned off, and, upon cooling of the substrate to 100° C., the outflow valves 1327, 1324 and the inflow valves 1319, 1322 were closed, with full opening of the main valve 1331 to evacuate the chamber 1301 to about $5\times10^{-7}$ torr, followed by leaking of the chamber 1301 to atmospheric through the leak valve 1330 with closing of the main valve 1331. Under such a state, the substrate having formed layers thereon was taken out. In this case, the total thickness of the layers formed was about 11μ.

The thus prepared image forming member for electrophotography was used for forming the image on a copying paper according to the same procedures under the same conditions as described in Example 19, whereby the image formed by ⊖ corona discharge was more excellent and clear, as compared with that formed by ⊕ corona discharge. From the results, the image forming member prepared in this Example was recognized to have a dependency on the charge polarity.

EXAMPLE 24

After an intermediate layer was formed for one minute on a molybdenum substrate according to the same procedures and the same conditions as described in Example 19, the deposition chamber was evacuated to $5\times10^{-7}$ torr and SiH$_4$(10)/H$_2$ gas was introduced into the chamber according to the same procedures as used in Example 19. Then, under the pressure of B$_2$H$_6$(50)/H$_2$ gas from the bomb 1311 through the valve 1316 and the inflow valve 1321 at 1 kg/cm$^2$ (reading on the outlet pressure gauge 1334, the inflow valve 1321 and the outflow valve 1326 were adjusted to determine the opening of the outflow valve 1326 so that the reading on the flowmeter 1339 was 1/10 of the flow amount of SiH$_4$(10)/H$_2$ gas, followed by stabilization.

Subsequently, with the shutter 1308 closed by operating the shutter rod 1306, the high frequency power source 1343 was turned on again to recommence glow discharge. The input voltage applied was 10 W. Thus, glow discharge was continued for additional 4 hours to form a photoconductive layer on the intermediate layer. The heater 1304 and the high frequency power source 1343 were turned off and, upon cooling of the substrate to 100° C., the outflow valves 1324, 1326 and the inflow valves 1319, 1321 were closed, with full opening of the main valve 1331 to evacuate the chamber 1301 to $5\times10^{-7}$ torr. Then, the chamber 1301 was brought to atmospheric through the leak valve 1330 with closing of the main valve 1331, and the substrate having formed respective layers was taken out. In this case, the total thickness of the layers formed was about 10μ.

The thus prepared image forming member for electrophotography was used for forming an image on a copying paper according to the same procedures and under the same conditions as described in Example 19. As a result, the image formed by ⊕ corona discharge was more excellent in image quality and extremely clear, as compared with that formed by ⊖ corona discharge. The results show that the image forming member obtained in this Example has a dependency on charge polarity, which dependency, however, was opposite to those in the image forming members obtained in Examples 22 and 23.

EXAMPLE 25

An intermediate layer and a photoconductive layer were prepared on a substrate of molybdenum according to the same condition and procedure as of Example 19 except that substituting the bomb 1309 containing $SiH_4(10)/H_2$ to a bomb containing $Si_2H_6$ gas without diluting, and the bomb 1311 containing $B_2H_6(50)/H_2$ gas to a bomb containing $B_2H_6$ gas diluted with $H_2$ to 500 volume ppm (hereinafter referred to $B_2H_6(500)/H_2$).

The thus prepared image forming member was taken out of the deposition chambr 1301, and subjected to image formation on a copying paper. As a result, under the combination of ⊕5.5 KV corona discharge and $\beta$ chargeable developer, there was obtained toner image having excellent in quality and high in gradation.

EXAMPLE 26

After conducting formation of an intermediate layer for one minute and formation of photoconductive layer for 5 hours on a molybdenum substrate according to the same procedure under the same condition as described in Example 19, an upper layer shown in Table 12 below was prepared on each photoconductive layer.

In forming sample C16, the bomb 1312 containing $PH_3(25)/H_2$ gas was substituted with a bomb containing $C_2H_4$ gas diluted with $H_2$ to 10 volume % (hereinafter referred to $C_2H_4(10)/H_2$). After forming photoconductive layer, the high frequency power source 1343 was turned off, and the inflow valves 1324 and 1326 were closed, with full opening of the main valve 1331 thereby evacuating the chamber to $5\times10^{-7}$ torr. Then, the inflow valves 1319, 1322 and outflow valves 1324, 1327 were opened to conduct $SiH_4(10)/H_2$ gas into chamber through the inflow valves 1319, 1322, which were adjusted so that the gas ratio of $SiH_4(10)/H_2:C_2H_4(10)/H_2$ was 1:9. Then the auxiliary valve 1329-1 and main valve 1331 were adjusted to the extent until the inner pressure in the chamber become 0.5 torr. After confirming that the gas feeding and inner pressure were stable, the shutter 1308 were closed, followed by turning on of the high frequency power source 1343 to input a high frequency power of 13.56 MHz between the electrodes 1303 and 1308 to provide an input power of 3 W. After glow discharge was continued for 2 minutes, the heater 1304 was turned off with the high frequency power source 1343 being turned off, the substrate was left to cool to 100° C., whereupon the outflow valve 1324, 1327 were closed, with the main valve 1331 fully opened, thereby to make the inner pressure in the chamber to $10^{-5}$ torr or below. Then, the main valve 1331 was closed and the inner pressure in the chamber was made atmospheric through the leak valve 1330, and the substrate was taken out.

In forming sample C17, the bomb 1312 containing $PH_3(25)/H_2$ gas was previously substituted with a bomb containing pure $N_2$ gas (99.999% purity) to adjust the feed ratio of $SiH_4(10)/H_2:N_2$ was 1:10, and an upper layer was prepared according to the same procedure under the same conditions as described for the sample C16.

As for a sample C18, the bomb 1312 containing $PH_3(25)/H_2$ gas was substituted with a bomb containing $NH_3$ diluted with $H_2$ to 10 volume % (hereinafter referred to $NH_3(10)/H_2$) to adjust the feed ratio of $SiH_4(10)/H_2:NH_3(10)/H_2$ was 1:2, and an upper layer was prepared according to the same procedure and the same conditions as described for the sample 16.

For the samples C19, C20 and C21, an upper layer was prepared on each photoconductive layer, which was previously prepared, according to the same procedure under the same condition as of the sample 16 except for the conditions stated below:

After the bomb 1309 containing $SiH_4(10)/H_2$ gas was substituted with a bomb containing $SiF_4$ diluted with 10 volume % of $H_2$ (hereinafter referred to $SiF_4/H_2(10)$), in forming the sample C19, the bomb 1312 containing $SiF_4/H_2(10)$ was further substituted with a bomb containing $C_2H_4$ diluted with $H_2$ to 10 volume % (hereinafter referred to as $C_2H_4(10)/H_2$) and feed ratio of $SiF_4/H_2(10):C_2H_4(10)/H_2$ was adjusted to 1:9; for sample C20, the bomb 1312 containing $PH_3(25)/H_2$ was substituted with a bomb containing high pure $N_2$ gas (99.999% purity) and feed ratio of $SiH_4(10)/H_2:N_2$ was adjusted to 1:50; and for sample C21, the bomb 1321 containing $PH_3(25)/H_2$ was substituted with a bomb containing $NH_3(10)/H_2$ and feed ratio of $SiH_4(10)/H_2:NH_3(10)/H_2$ was adjusted to 1:20; 60 W of alternate power was used for these all samples. For the sample C22, $Si(CH_3)_4$ gas diluted with $H_2$ to 10 volume % was used to prepare an upper layer.

In forming samples C23 C24, the bomb 1312 containing $PH_3(25)/H_2$ gas was previously substituted with a bomb containing $N_2$ with Ar to 50 volume % (hereinafter referred to $N_2(50)/Ar$), after substituting the target with of a polycrystalline Si (99.999% purity) for sample C23 or with of high pure $Si_3N_4$ for sample C24, the photoconductive layer was formed on the substrate. Then after confirming the chamber was evacuated to $5\times10^{-7}$ torr, all valves were closed, and the valve 1317 of bomb 1312 containing $N_2(50)/Ar$ gas until the outlet pressure was adjusted to 1 kg/cm² (reading of the outlet pressure gauge 1335). Subsequently, the inflow valve 1322, the outflow valve 1327 and the auxiliary valves 1329-1 and 1329-2 were opened to introduced gas. While carefully adjusting the inner pressure of the chamber of $5\times10^{-4}$ torr (reading of the Pirani gauge) by controlling the auxiliary valves 1329-1 and 1329-2, and further adjusting the inner pressure to $1\times10^{-2}$ torr with the main valve 1331, a shutter 1308 was opened with operating a shutter rod 1306, followed by turning on of the high frequency power source 1343 to input a high frequency power of 13.56 MHz between the targe 1305 and the fixed member 1303 to provide an input power of 100 W. After glow discharge was continued for 2 minutes to form an upper layer, the high frequency power source 1323 was turned off, whereupon the auxiliary valves 1329-1, 1329-2, the outflow valve 1327, and the inflow valve 1322 were closed, with the main valve 1331 fully opened, thereby to make the inner pressure in the chamber to $5\times10^{-7}$ torr.

Then, the main valve 1331 was closed and inner pressure in the chamber was made atmospheric through the leak valve 1330, and the substrated was taken out.

In forming the sample C25, the upper layer was prepared under the same conditions and procedures as used in forming the sample C24 except that the target was substituted with a plate in which a graphite was laminated on polycrystalline Si so that a ratio of a surface area might be 1:9, and the bomb 1313 containing $O_2(20)/Ar$ gas with a bomb containing Ar gas.

When toner images were formed in similar way to Example 19, using thus prepared image forming members C16 through C25 for electrophotography, there were obtained images excellent in resolving power, gradation as well as image density, with respect to both combinations which are ⊖6 KV charge/⊕ charged developer and ⊕6 KV charge/⊖ charged developer.

gauge 1333 was adjusted to 1 kg/cm², and then the inlet valve 1320 was opened, followed by gradual opening of the outlet valve 1325. At this time, the flow amount ratio of the oxygen gas and argon gas was adjusted to

TABLE 12

| Sample No. | Upper layer | Type of raw gas or target | Feed ratio or ratio of surface area | Method of prep. | Power (W) | Thick. of layer (Å) |
|---|---|---|---|---|---|---|
| C16 | A | $SiH_4$ (diluted with $H_2$ to 10 vol. %) $C_2H_4$ (diluted with $H_2$ to 10 vol. %) | $SiH_4(10)/H_2:C_2H_4(10)/H_2$ = 1:9 | Glow | 3 | 120 |
| C17 | B | $SiH_4$ (diluted with $H_2$ to 10 vol. %) $N_2$ | $SiH_4(10)/H_2:N$ = 1:10 | Glow | 3 | 120 |
| C18 | C | $SiH_2$ (diluted with $H_2$ to 10 vol. %) $NH_3$ (diluted with $H_2$ to 10 vol. %) | $SiH_4(10)/H_2:NH_3(10)/H_2$ = 1:2 | Glow | 3 | 120 |
| C19 | D | $SiF_4$ (cont. $H_2$ in 10 vol. %) $C_2H_4$ (diluted with $H_2$ to 10 vol. %) | $SiF_4/H_2(10):C_2H_4(10)/H_2$ = 1:9 | Glow | 60 | 120 |
| C20 | E | $SiF_4$ (cont. $H_2$ in 10 vol. %) $NH_3$ (dil. with $H_2$ to 10 vol. %) | $SiF_4/H_2(10):NH_3(10)/H_2$ = 1:20 | Glow | 60 | 120 |
| C21 | F | $SiF_4$ (cont. $H_2$ in 10 vol. %) $N_2$ | $SiF_4/H_2(10):N_2$ = 1:50 | Glow | 60 | 120 |
| C22 | G | $Si(CH_3)_4$ (dil. with $H_2$ to 10 vol. %) | — | Glow | 3 | 120 |
| C23 | H | Polycryst. Si Target $N_2$ (dil. with Ar to 50 vol. %) | — | Sputtering | 100 | 200 |
| C24 | I | $Si_3N_4$ Target $N_2$ (dil. with Ar to 50 vol. %) | — | Sputtering | 100 | 200 |
| C25 | J | Polycryst. Si Target Graphite Target Ar | Si:C = 1:9 (area ratio) | Sputtering | 100 | 200 |

EXAMPLE 27

Using a device shown in FIG. 13 placed in a clean room which had been completely shielded, an image forming member for electrography was prepared according to the following procedures.

A substrate 1302 of molybdenum of 10 cm square having a thickness of 0.5 mm, whose surface had been cleaned, was fixed firmly on a fixing member 1303 disposed at a predetermined position in an deposition chamber 1301. The target for sputtering was high purity $SiO_2$ (99.999%) target 1305. The substrate 1302 was heated by a heater 1304 within the fixing member 1303 with a precision of ±0.5° C. The temperature was measured directly at the backside of the substrate by an alumel-chromel thermocouple. Then, after confirming that all the valves in the system are closed, the main valve 1313 was opened, and evacuation was effected once to about $5 \times 10^{-7}$ torr (during the evacuation, all the other valves in the system are closed). Thereafter, the input voltage for the heater 1304 was elevated by varying the input voltage while detecting the substrate temperature until the temperature was stabilized constantly at 100° C. This step was followed by opening the auxiliary valves 1329-1, 1329-2 and the outflow valves 1324, 1325, 1326 and 1328 to remove sufficiently the gases in the flowmeters 1337, 1338, 1339 and 1341, and thereafter the outflow valves 1324, 1325, 1826, and 1328 were closed. The valve 1318 of the bomb 1313 containing argon gas (purity: 99.999%) was opened until the reading on the outlet pressure gauge 1336 was adjusted to 1 kg/cm², and then the inflow valve 1323 was opened, followed by gradual opening of the outflow valve 1328. On the other hand, the valve 1315 of the bomb 1310 containing oxygen gas (purity: 99.999%) was opened until the reading on the outlet pressure gauge 1333 was adjusted to 1 kg/cm², and then the inlet valve 1320 was opened, followed by gradual opening of the outlet valve 1325. At this time, the flow amount ratio of the oxygen gas and argon gas was adjusted to 3:7 by using the inflow valves 1320 and 1323.

The openings of the auxiliary valves 1329-1 and 1329-2 were adjusted until the indication on the Pirani gauge 1342 became $5 \times 10^{-4}$ torr, which state was maintained until the flow amount was steady. Thereafter, the main valve 1331 was gradually closed to narrow the opening to adjust the inner pressure in the chamber at $1 \times 10^{-2}$ torr. With the shutter 1308 opened by operation of the shutter bar 1306, the flowmeters 1338 and 1341 were confirmed to be stabilized, whereupon the high frequency power source 1343 was turned on to input an alternate current of 13.56 MHz, 100 W between the target 1305 and the fixing member 1303. Under these conditions, a layer was formed while taking matching so that stable discharge may be continued. In this manner, discharge was continued for one minute to form an intermediate layer of a thickness of 100 Å. Then, the high frequency power source 1343 was turned off intermission of the discharge. Subsequently, the outflow valves 1325 and 1328 were closed and the main valve 1313 fully opened to outgas the gas in the chamber 1301 until it was evacuated to $5 \times 10^{-7}$ torr. Thereafter, the input voltage for the heater 1304 was elevated by varying the input voltage while detecting the substrate temperature until the temperature was stabilized constantly at 200° C.

Then, valves 1315 and 1318 were closed, thereafter the auxiliary valves 1329-1 and 1329-2, subsequently the outflow valves 1325, 1328 and the inflow valves 1320, 1323 were opened fully to effect degassing sufficiently of the flowmeters 1338 and 1341 to vacuo. After closing the outflow valves 1325 and 1328, the valve 1314 of the bomb 1309 containing $SiF_4$ gas (purity: 99.999%) with $H_2$ content of 10 vol. % [hereinafter referred to as SiF$_4$/H$_2$(10)] and the valve 1316 of the bomb 1311 containing B$_2$H$_6$ gas diluted with H$_2$ to 500 vol. ppm [hereinafter referred to as B$_2$H$_6$(500)/H$_2$] were opened to adjust the pressures at the outlet pressure gauges 1332 and 1334, respectively, at 1 kg/cm$^2$, whereupon the inflow valves 1319 and 1321 were gradually opened to introduce SiF$_4$/H$_2$(10) gas and B$_2$H$_6$(500)/H$_2$ gas into the flowmeters 1337 and 1339, respectively. Subsequently, the outflow valves 1324 and 1326 were gradually opened. The inflow valves 1319 and 1321 were adjusted thereby so that the gas flow amount ratio of SiF$_4$/H$_2$(10) to B$_2$H$_6$(50)/H$_2$ was 70:1. Then, while carefully reading the pirani gauge 1342, the opening of the auxiliary valves 1329 was adjusted and the auxiliary valve 1329 was opened to the extent until the inner pressure in the chamber 1301 became 1×10$^{-2}$ torr. After the inner pressure in the chamber 1301 was stabilized, the main valve 1313 was gradually closed to narrow its opening until the indication on the pirani gauge 1324 became 0.5 torr. After confirming that the gas feeding and the inner pressure were stable, the shutter 1308 (serving also as an electrode) was closed by operation of the shutter bar 1306, followed by turning on of the high frequency power source 1343, to input a high frequency power of 13.56 MHz between the electrode 1303 and the shutter 1308, thereby generating glow discharge in the chamber 1301 to provide an input power of 60 W. After glow discharge was continued for 3 hours to form a photoconductive layer, the heater 1304 was decreased and the high frequency power source 1343 being turned off, the substrate is left to cool to 100° C., whereupon the outflow valves 1324, 1326 and the inflow valves 1319, 1321 were closed, with the main valve 1331 fully opened, thereby to make the inner pressure in the chamber 1301 to 5×10$^{-7}$ torr. Thereafter, valves 1315, 1318, and the outflow valves 1325 and 1328 were re-opened, and the shutter 1308 was opened by operation of the shutter bar 1306 to make the conditions same as those in preparation of the intermediate layer. Subsequently, the high frequency power source was turned on to recommence glow discharge. The input power was 100 W similarly to that in preparation of the intermediate layer. Under these conditions, the glow discharge was continued for two minutes to form an upper layer on the photoconductive layer. Thereafter, the heater 1304 was turned off with the high frequency power source 1343 being also turned off. Then, the outflow valves 1325, 1328, and the inflow valves 1320, 1323 were closed, with the main valve 1331 fully opened, thereby to make the inner pressure in the chamber to less than 10$^{-5}$ torr. Then, the main valve 1331 was closed and the inner pressure in the chamber was made atmospheric through the leak valve 1330, and the substrate having formed each layer thereon was taken out.

In this case, the total thickness of the layers was about 9μ. The thus prepared image forming member was placed in a charge light-exposure experimental device, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the image forming member to obtain a good toner image on the image forming member. When the toner image on the image forming member for electrophotography was copied on a copying paper by corona charging at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography obtained in this Example has the characteristics of a both-polarity image forming member having no dependency on the charge polarity.

EXAMPLE 28

The image forming members shown by Sample Nos. D1 through D8 were prepared under the same conditions and procedures as used in Example 27 except that the sputtering time in forming the intermediate layer on the molybdenum substrate was varied as shown below in Table 13, and image formation was effected by placing in entirely the same device as in Example 27 to obtain the results as shown in Table 13.

TABLE 13

| Sample No. | D1 | D2 | D3 | D4 | D5 | D6 | D7 | D8 |
|---|---|---|---|---|---|---|---|---|
| Time for formation of intermediate layer (sec.) | 10 | 30 | 50 | 150 | 300 | 500 | 1000 | 1200 |
| Image quality | | | | | | | | |
| Charge polarity + | △ | ○ | ⊚ | ⊚ | ⊚ | ○ | △ | X |
| Charge polarity − | X | △ | ⊚ | ⊚ | ⊚ | ○ | △ | X |

Ranks for evaluation:
⊚ excellent
○ good
△ practically usable
X not good
Deposition speed of intermediate layer: 1 Å/sec.

As apparently seen from the results shown in Table 13, it is necessary to form a intermediate layer having a thickness within the range of from 30 Å to 1000 Å to achieve the object of this invention.

EXAMPLE 29

The image forming members as shown by Sample Nos. D9 through D15 were prepared under the same conditions and procedures as described in Example 27 except that the feed gas ratio of Ar gas to O$_2$ gas was varied as shown below in Table 14, and image formation was effected by placing in the same device as in Example 27 to obtain the results shown in Table 14. For only Sample Nos. D11 through D15, intermediate layers were analyzed by electron microbe method to give the results as shown in Table 15.

As apparently seen from the results in Tables 14 and 15, it is necessary to form an intermediate layer wherein the ratio of Si to O in Si$_x$O$_{1-x}$ constituting the intermediate layer ranges from 0.33 to 0.4 for attain the objects of the present invention.

TABLE 14

| Sample No. | D9 | D10 | D11 | D12 | D13 | D14 | D15 |
|---|---|---|---|---|---|---|---|
| Ar:O$_2$ (flow amount ratio) | 10:0 | 9.9:0.1 | 9.5:0.5 | 9:1 | 8:2 | 7:3 | 5:5 |
| Copied image quality: | | | | | | | |
| Charge polarity + | X | X | X | Δ | ○ | ⊙ | ⊙ |
| Charge polarity − | X | X | X | Δ | ○ | ⊙ | ⊙ |

TABLE 15

| | Si$_x$O$_{1-x}$ | | | | |
|---|---|---|---|---|---|
| Sample No. | D11 | D12 | D13 | D14 | D15 |
| x | | 0.44 | 0.40 | 0.37 | 0.33 | 0.33 |

EXAMPLE 30

After an intermediate layer comprising a-Si$_x$O$_{1-x}$ was provided on a molybdenum substrate according to the same procedures as used in Example 27, the outflow valves 1325, 1328, and the shutter 1308 were closed. Then, the input voltage for the heater 1304 was increased by varying the input voltage while detecting the substrate temperature, until it was constant at 200° C.

Thereafter, the outflow valve 1324 and the inflow valve 1319 were opened fully to effect evacuation to vacuum also in the flowmeter 1337.

After closing the inflow valve 1319 and the outflow valve 1324, the valve 1314 of the bomb 1309 containing SiF$_4$/H$_2$(10) was opened and the pressure at the outlet pressure gauge 1332 was adjusted to 1 kg/cm$^2$, followed by opening gradually the inflow valve 1319 to introduce the SiF$_4$/H$_2$(10) gas into the flowmeter 1337. Subsequently, the outflow valve 1324 was opened gradually. Next, while reading carefully the pirani gauge 1342, the opening of the auxiliary valves 1329-1 and 1329-2 were adjusted and it was opened until the inner pressure in the chamber 1301 became 1×10$^{-2}$ torr. After the inner pressure in the chamber 1301 was stabilized, the main valve 1331 was gradually closed to narrow its opening until the indication on the pirani gauge 1342 became 0.5 torr. Confirming stabilization of gas feeding and of inner pressure, the shutter 1308 was closed by operation of the shutter bar 1306, followed by turning on the high frequency power source 1343 to input a high frequency power of 13.56 MHz between the electrode 1303 and the shutter 1308, thereby exciting glow discharge in the chamber 1301, to provide an input power of 60 W. Glow discharge was continued for 3 hours to form a photoconductive layer, and thereafter the heater 1304 was decreased, and also the high frequency power source 1343 turned off. Upon cooling of the substrate to a temperature to 100° C., the outflow valve 1324 and the inflow valve 1319 were closed, with full opening of the main valve 1331 to evacuate the chamber 1301 to 5×10$^{-7}$ torr or less. Thereafter, the outflow valves 1325 and 1328 were opened again, and the shutter opened. Next an upper layer was formed in a similar manner to that in formation of the intermediate layer. The thus prepared substrate was taken out from the chamber 1301. In this case, the total thickness of the layers was found to be about 9μ. The thus prepared image forming member was subjected to image formation on a copying paper in the same manner as described in Example 27. As a result, the image formed by ⊖ corona discharge was better in quality and very clear, as compared with that formed by ⊕ corona discharge. The results show that the image forming member prepared in this Examples is dependent on the charging polarity.

EXAMPLE 31

After an intermediate layer was formed for one minute on a molybdenum substrate using conditions and procedures similar to those of Example 27, the input voltage for the heater 1304 was increased by varying the input voltage while detecting the substrate temperature, until it was constant at 200° C. The deposition chamber was evacuated to 5×10$^{-7}$ torr, whereupon SiF$_4$/H$_2$(10) gas was introduced into the deposition chamber according to the same procedures as used in Example 27. Thereafter, under the gas pressure at 1 kg/cm$^2$ (reading on the outlet pressure gauge 1335) through the inflow valve 1322 from bomb 1312 containing PF$_5$ gas diluted to 250 vol. ppm with H$_2$ [hereinafter referred to as PF$_5$(250)/H$_2$], the inflow valve 1322 and the outflow valve 1327 were adjusted to determine the opening of the outflow valve 1327 so that the reading on the flowmeter 1340 might be 1/60 of the flow amount of SiF$_4$/H$_2$(10), followed by stabilization.

Subsequently, with the shutter 1308 closed of operation of the shutter bar 1306 and the high frequency power source 1343 turned on again, the glow discharge was recommenced. The input voltage applied thereby was 60 W. Thus, glow discharge was continued for additional 4 hours to form a photoconductive layer on the intermediate layer. The input power of the heater 1304 was decreased and the high frequency power source 1343 were then turned off, and, upon cooling or the substrate to 100° C., the outflow valves 1327 and 1324, and the inflow valves 1319 and 1322 were closed, with full opening of the main valve 1331 to evacuate the chamber 1301 to about 5×10$^{-7}$ torr.

Thereafter, the outflow valves 1325 and 1328, and the shutter were re-opened, and an upper layer was formed in similar conditions and manner to those described in Example 27. Then the high frequency power source 1343 and the heater 1304 were turned off, and the outflow valves 1325 and 1328 were closed, with full opening of the main valve 1331 to evacuate the chamber 1301 to 10$^{-5}$ torr, followed by leaking of the chamber 1301 to atmospheric through the leak valve 1330 with closing of the main valve 1331. Under such a state, the substrate having formed layers thereon was taken out. In this case, the total thickness of the layers formed was about 11μ.

The thus prepared image forming member was used for forming the image on a copying paper according to the same procedures under the same conditions as used in Example 27, wereby the image formed by ⊖ corona discharge was more excellent and clear, as compared with that formed by ⊕ corona discharge. From the results, the image forming member prepared in this Example was recognized to have a dependency on the charging polarity.

EXAMPLE 32

After an intermediate layer was formed for one minute on a molybdenum substrate according to the same procedures and under the same conditions as those in Example 27, the input voltage for the heater 1304 was increased by varying the input voltage while detecting the substrate temperature, until it was constant at 200° C. The deposition chamber was evacuated to $5\times10^{-7}$ torr and SiF$_4$/H$_2$(10) gas was introduced into the chamber 1301 according to the same procedures as those in Example 27. Then, under the pressure of B$_2$H$_6$(500)/2 gas from the bomb 1311 through the inflow valve 1321 at 1 kg/cm$^2$ (reading on the outlet pressure gauge 1334), the inflow valve 1321 and the outflow valve 1326 were adjusted to determine the opening of the outflow valve 1326 so that the reading on the flowmeter 1339 might be 1/15 of the flow amount of SiF$_4$/H$_2$(10) gas, followed by stabilization.

Subsequently, with the shutter 1308 closed by using the shutter bar 1306, the high frequency power source 1343 was turned on again to recommence glow discharge. The input voltage applied was 10 W. Thus, glow discharge was continued for additional 4 hours to form a photoconductive layer on the intermediate layer. The input power of the heater 1304 was decreased the high frequency power source 1343 was turned off and, upon cooling of the substrate to 100° C., the outflow valves 1324 and 1326, and the inflow valves 1319 and 1321 were closed, with full opening of the main valve 1331 to evacuate the chamber to about $5\times10^{-7}$ torr. Thereafter, the outflow valves 1325 and 1328, and the shutter 1308 were opened again, and an upper layer was formed in similar procedure to those described in Example 27. Then, the chamber was evacuated. Then, the chamber 1301 was brought to atmospheric through the leak valve 1330 with closing of the main valve 1331, and the substrate was taken out. In this case, the total thickness of the layers formed was about 10μ.

The thus prepared image forming member was used for forming an image on a copying paper according to the same procedures and under the same conditions as those in Example 27. As a result, the image formed by $\oplus$ corona discharge was more excellent in image quality and extremely clear, as compared with that formed by $\ominus$ corona discharge. The results show that the image forming member obtained in this Example has a dependency on charging polarity, however the dependency was opposite to those in the image forming members obtained in Examples 30 and 31.

EXAMPLE 33

Previously, the bomb 1309 of SiF$_4$/H$_2$(10) was replaced with a bomb containing SiF$_4$ diluted to 5 vol. % with Ar [hereinafter referred to as SiF$_4$(5)/Ar].

Then, after providing an intermediate layer on a molybdenum substrate in a similar way to describe in Example 27 and degassing the deposition chamber 1301. After gas in the chamber 1301 was degassed, the main valve and the auxiliary valves 1329-1, 1329-2 were closed with opening of the leak valve 1330 the deposition chamber 1301 was leaked to atmospheric and the SiO$_2$ target 1305 was replaced with high purity polycrystalline silicon target. Then, with the leak valve 1330 closed, the chamber was evacuated to about $5\times10^{-7}$ torr, and the auxiliary valves 1329-1, 1329-2 and the outflow valve 1324 were opened to degas sufficiently the flowmeter 1337, followed by closing of the outflow valve 1324 and the auxiliary valves 1329-1 and 1329-2.

The substrate 1302 was maintained at 200° C. by inputting power source for the heater 1304. And, by opening the valve 1314 of the bomb 1309 of SiF$_4$(5)/Ar gas, the outlet pressure was adjusted to 1 kg/cm$^2$ by the outlet pressure gauge 1332. Subsequently, the inflow valve 1319 was gradually opened to introduce SiF$_4$(5)-/Ar gas into the flowmeter 1337, followed successively by opening gradually of the outflow valve 1324 and further by opening the auxiliary valves 1329-1 and 1329-2.

While detecting the inner pressure in the chamber 1301 by the pirani gauge 1342, the outflow valve 1324 was adjusted to introduce the gas to $5\times10^{-4}$ torr. After the flow amount was stabilized under this state, the main valve 1331 was gradually closed to narrow its opening until the inner pressure in the chamber became $1\times10^{-2}$ torr. After confirming stabilization of the flowmeter 1337, the high frequency power source 1343 was turned on and an alternate current of 13.56 MHz, 100 W was inputted between the target 1305 and the fixing member 1303. Matching was taken so that stable discharge could be continued under these conditions to form a layer. After a photoconductive layer was formed by continuing discharge for 3 hours in such a manner, the high frequency power source 1343 was turned off and the source for the heater 1304 also turned off. After the substrate temperature was lowered to 100° C. or lower, the outflow valve 1324 and the inflow valve 1319 were closed, followed by full opening of the main valve 1331. After the inner pressure in the chamber was brought to $5\times10^{-7}$ torr or less, the outflow valves 1325 and 1328, and the shutter 1308 were opened again, an upper layer was formed in a similar manner to that in formation of the intermediate layer except that the flow amount ratio of O$_2$ gas to Ar gas was 6:4. The thus prepared image forming member was taken out from the chamber 1301. In this case, the total thickness of the layers formed was about 9μ.

The thus prepared image forming member was used for forming the images on a copying paper according to the same procedures as used in Example 27, whereby the image formed by $\ominus$ corona discharge was better in quality and very clear, as compared with that formed by $\oplus$ corona discharge. The results show that the image forming member prepared in this Examples is dependent on the charge polarity.

EXAMPLE 34

After the bomb 1313 of Ar gas was replaced with a bomb of Ar gas containing O$_2$ gas of 30 vol. % (hereinafter referred to as O$_2$(30)/Ar), formation of an intermediate layer was carried out for one minute on each of ten molybdenum substrate according to similar procedures and under similar conditions to those described in Example 27, and formation of a photoconductive layer was carried out for five hours on each above-mentioned intermediate layer. Thereafter, each upper layer shown in Table 16 was formed on each above-mentioned photoconductive layer.

In the case of Sample D16, the bomb 1312 of PF$_5$(250)/H$_2$ was replaced with a bomb of C$_2$H$_4$(10)/H$_2$, and the bomb 1310 of O$_2$ gas replaced with a bomb of SiH$_4$ gas (purity: 99.999%) diluted with H$_2$ to 10 vol. % (hereinafter referred to as SiH$_4$(10)/H$_2$). After forming an intermediate layer and a photoconductive layer, the high frequency power source 1343 was turned off, followed by closing the inflow valves 1324 and 1326. The main valve 1331 was fully opened to evacuate the system to $5\times10^{-7}$ torr. Thereafter, the valves 1315, 1317, the inflow valves 1320, 1322, and the outflow valves 1325, 1327 were opened to introduce SiH$_4$(10)/H$_2$ gas and C$_2$H$_4$(10)/H$_2$ gas into the chamber. The inflow valves 1320 and 1322 was adjusted thereby so that the flow amount ratio of SiH$_4$(10)/H$_2$ gas to C$_2$H$_4$(10)/H$_2$ gas could be 1:9. Subsequently, the inner pressure in the chamber was adjusted to 0.5 torr by using the auxiliary valves 1329-1, 1329-2 and the main valve 1331. After confirming stabilization of the flow amounts and the inner pressure in the chamber and closing of the shutter 1308, the high frequency power source 1343 was turned on to input a high frequency power of 13.56 MHz, 3 W between the electrode 1303 and the shutter 1308. After glow discharge was continued for two minutes, the high frequency power source 1343 and the heater 1304 were turned off. After the substrate temperature was brought to 100° C. or below, the outflow valves 1325 and 1327 were closed, and the main valve 1331 was fully opened to evacuate the chamber to 10$^{-5}$ torr or less. Subsequently, the main valve 1331 was closed, and the inner pressure in the chamber was made atmospheric to take out the substrate.

In the case of Sample D17, the bomb 1315 of O$_2$ gas was replaced with a bomb of SiH$_4$(10)/H$_2$, and the bomb 1312 of PF$_5$(250)/H$_2$ replaced with a bomb of high purity N$_2$ gas (purity: 99.999%). The flow amount ratio of SiH$_4$(10)/H$_2$ to N$_2$ was 1:10.

In the case of Sample D18, the bomb 1315 of O$_2$ gas was replaced with a bomb of SiH$_4$(10)/H$_2$, and the bomb 1312 of PF$_5$(250)/H$_2$ replaced with a bomb of NH$_3$ gas diluted with H$_2$ to 10 vol. % (hereinafter referred to as NH$_3$(10)/H$_2$). In the cases of Samples D17 and D18, each upper layer was formed under the same conditions and in the same procedures as those for Sample D16 except that the flow amount ratio of SiH$_4$(10)/H$_2$ to NH$_3$(10)/H$_2$ was 1:2.

In the case of Sample D19, the bomb 1312 of PF$_5$(250)/H$_2$ was replaced with a bomb of C$_2$H$_4$(10)/H$_2$, and the flow amount ratio of SiF$_4$/H$_2$(10) to C$_2$H$_4$(10)/H$_2$ was 1:9.

In the case of D20, the bomb 1312 of PF$_5$(250)/H$_2$ was replaced with a bomb of high purity N$_2$ gas (purity: 99.999%), and the flow amount ratio of SiF$_4$/H$_2$(10) to N$_2$ gas was 1:50.

In the case of Sample D21, the bomb 1312 of PF$_5$(250)/H$_2$ was replaced with a bomb of NH$_3$(10)/H$_2$, and the flow amount ratio of SiF$_4$/H$_2$(10) to NH$_3$(10)/H$_2$ was 1:20.

In the cases of Samples D19, D20 and D21, each upper layer was formed under the same conditions and in the same manner as used in Sample D16, except that an alternative current input power was 60 W and for the above-mentioned conditions.

In the case of Sample D22, the bomb 1312 of PF$_5$(250)/H$_2$ gas was previously replaced with a bomb of Si(CH$_3$)$_4$(10)/H$_2$. After formation of a photoconductive layer, the outflow valve 1324 and 1326 were closed, and the main valve 1331 was fully opened to evacuate the chamber to 5×10$^{-7}$ torr. Thereafter, Si(CH$_3$)$_4$(10)/H$_2$ was introduced into the chamber through the inflow valve 1322 and the outflow valve 1327. The inner pressure in the chamber was adjusted to 0.5 torr by using the auxiliary valves 1329-1, 1329-2, and the main valve 1331. After confirming stabilization of the flow amount and the inner pressure in the chamber, the high frequency power source 1343 was turned on to input a high frequency power of 13.56 MHz, 3 W between the electrodes 1303 and 1308. The glow discharge was continued for two minutes. After the heater 1304 was turned off with the high frequency power source 1343 being turned off, the substrate was left to 100° C., whereupon the outflow valve 1327 was closed, with the main valve 1331 fully opened, thereby to make the inner pressure in the chamber to less than 10$^{-5}$ torr. Then, the main valve 1331 was closed and the inner pressure in the chamber was made atmospheric through the leak valve 1330, and the substrate was taken out.

In the cases of Samples D23 and D24, the bomb 1312 of PF$_5$(250)/H$_2$ was replaced with a bomb of N$_2$(50)/Ar. Further, in the case of Sample D23, polycrystalline Si (purity: 99.999%) was used for target. In the case of Sample D24, high purity Si$_3$N$_4$ was used for target. In each case, after forming a photoconductive layer, the inner pressure in the device was evacuated to 5×10$^{-7}$ torr, all valves were closed. Thereafter, the valve 1317 of the bomb 1312 of N$_2$(50)Ar was opened until the outlet pressure (the reading at the outlet pressure gauge 1335) was adjusted to 1 kg/cm$^2$. Then, the inflow valve 1322, the outflow valve 1327, and the auxiliary valve 1329-1, 1329-2 were opened to introduce gases into the chamber. The auxiliary valves 1329-1 and 1329-2 were adjusted until the inner pressure became 5×10$^{-4}$ torr (the reading at the pirani gauge 1341). Furthermore, the inner pressure was adjusted to 1×10$^{-2}$ torr by the main valve 1331. Thereafter, the shutter 1308 was opened by operation of the shutter bar 1306. The high frequency power source 1343 was turned on to input an alternative current power of 13.56 MHz, 100 W between the target 1305 and the fixing member 1303. After an upper layer was formed for two minutes under the conditions, the high frequency power source 1343 was turned off, subsequently the auxiliary valves 1329-1, 1329-2, the outflow valve 1328, the inflow valve 1323 were closed, followed by fully opening the main valve 1331. After evacuating the chamber to 10$^{-5}$ torr or below, the main valve 1331 was closed to make the inner pressure in the chamber atmospheric through the leak valve 1330, and the substrate was taken out.

In the case of Sample D25, an upper layer was formed under the same conditions and in the same manner as used for Sample D24, except that SiO$_2$ target 1305 was changed to a laminate in which graphite was laminated on polycrystalline Si in an area ratio of 1:9.

Using the thus prepared image forming members, D16 through D25, toner images were formed in the same manner described in Example 27. As the results, there were obtained images excellent in resolution, gradation, and image density, with respect to both combinations of −6 KV corona charge/positively charged developer and of +6 KV corona charge/negatively charged developer.

TABLE 16

| Sample No. | Upper layer | Starting gas or Target | Flow amount ratio or Area ratio | Preparation method | Power (W) | Layer thickness (Å) |
|---|---|---|---|---|---|---|
| D16 | A | SiH$_4$ (diluted with H$_2$ to 10 vol. %) C$_2$H$_4$ (diluted with H$_2$ to 10 vol. %) | SiH$_4$(10)/H$_2$: C$_2$H$_4$(10)/H$_2$ ... 1:9 | Glow | 3 | 120 |
| D17 | B | SiH$_4$ (diluted with H$_2$ | SiH$_4$(10)/H$_2$:N$_2$ | Glow | 3 | 120 |

TABLE 16-continued

| Sample No. | Upper layer | Starting gas or Target | Flow amount ratio or Area ratio | Preparation method | Power (W) | Layer thickness (Å) |
|---|---|---|---|---|---|---|
| | %) | $N_2$ to 10 vol. %) | ... 1:10 | | | |
| D18 | C | $SiH_4$ (diluted with $H_2$ to 10 vol. %) $NH_3$ (diluted with $H_2$ to 10 vol. %) | $SiH_4(10)/H_2$: $NH_3(10)/H_2$ ... 1:2 | Glow | 3 | 120 |
| D19 | D | $SiF_4$ ($H_2$ content: 10 vol. %) $C_2H_4$ (diluted with $H_2$ to 10 vol. %) | $SiF_4/H_2(10)$: $C_2H_4(10)/H_2$ ... 1:9 | Glow | 60 | 120 |
| D20 | E | $SiF_4$ ($H_2$ content: 10 vol. %) $NH_3$ (diluted with $H_2$ to 10 vol. %) | $SiF_4/H_2(10)$: $NH_3(10)/H_2$ ... 1:20 | Glow | 60 | 120 |
| D21 | F | $SiF_4$ ($H_2$ content: 10 vol. %) $N_2$ | $SiF_4/H_2(10):N_2$ ... 1:50 | Glow | 60 | 120 |
| D22 | G | $Si(CH_3)_4$ (diluted with $H_2$ to 10 vol. %) | — | Glow | 3 | 120 |
| D23 | H | Polycrystalline Si target $N_2$ (diluted with Ar to 50 vol. %) | — | Sputtering | 100 | 200 |
| D24 | I | $Si_3N_4$ target $N_2$ (diluted with Ar to 50 vol. %) | — | Sputtering | 100 | 200 |
| D25 | J | Polycrystalline Si target Graphite target | C:Si = 9:1 | Sputtering | 100 | 200 |

EXAMPLE 35

Figure 15:
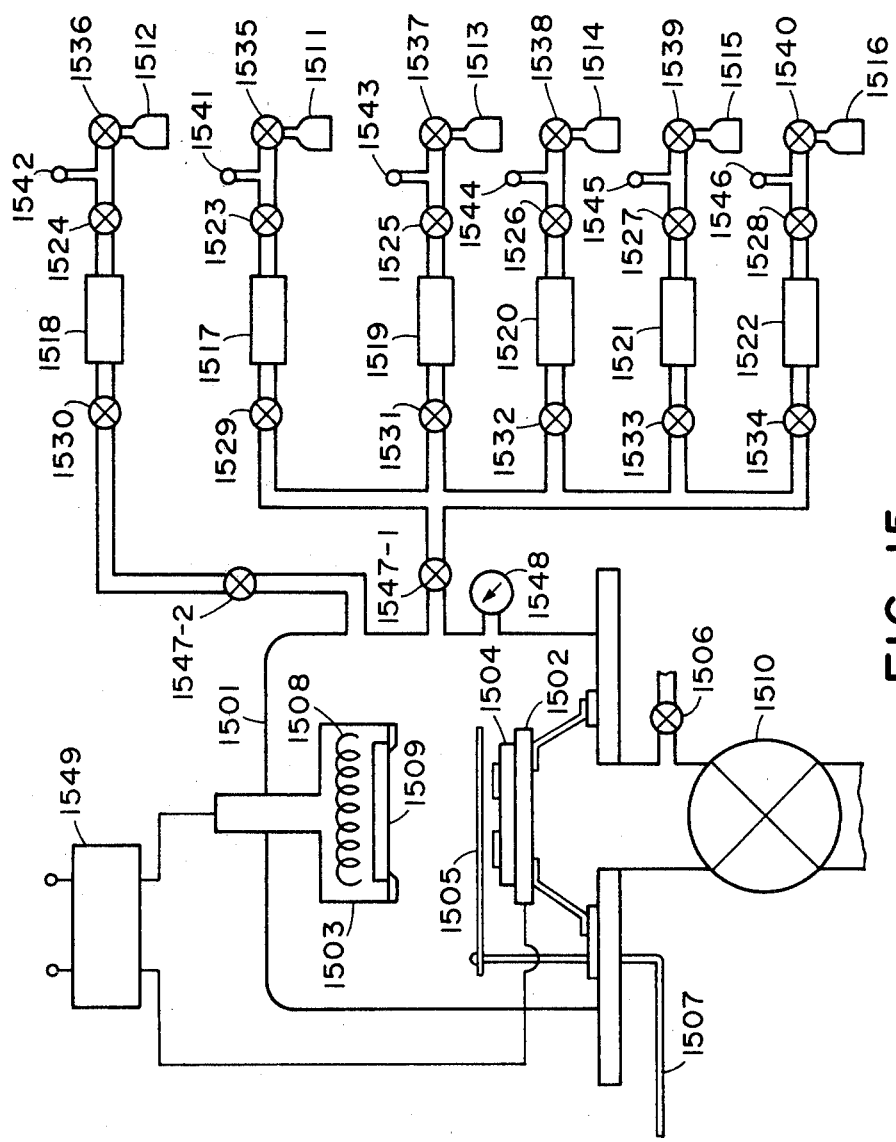

Using a device as shown in FIG. 15 placed in a clean room which had beem completely shielded, an image forming member for electrography was prepared according to the following procedures.

A substrate 1509 of molybdenum of 10 cm square having a thickness of 0.5 mm, whose surface had been cleaned, was fixed firmly on a fixing member 1503 disposed at a predetermined position in glow discharge deposition chamber 1501. The substrate 1509 was heated by a heater 1508 within the fixing member 1503 with a precision of ±0.5° C. The temperature was measured directly at the backside of the substrate by an alumel-chromel thermocouple. Then, after confirming that all the valves in the system are closed, the main valve 1510 was opened to discharge the gas in the chamber 1501 until it was evacuated to about $5 \times 10^{-6}$ torr. Thereafter, the input voltage for the heater 1508 was elevated by varying the input voltage while detecting the substrate temperature until the temperature was stabilized constantly at 200° C.

Then, the auxiliary valves 1547-1 and 1547-2, subsequently the outflow valves 1529, 1530, 1531, 1534 and the inflow valves 1523, 1524, 1525, 1528, were opened fully to effect degassing sufficiently in the flowmeters 1517, 1518, 1519, 1522 to vacuo. After closing the auxiliary valves 1547-1, 1547-2 and the valves 1529, 1530, 1531, 1534, 1523, 1524, 1525, 1528, the valve 1535 of the bomb 1511 containing $SiH_4$ gas (purity: 99.999%) diluted with $H_2$ to 10 vol.% [hereinafter referred to as $SiH_4(10)/H_2$] and the valve 1536 of the bomb 1512 containing oxygen gas were respectively opened to adjust the pressures at the output pressure gauges 1541 and 1542, respectively, at 1 kg/cm², whereupon the inflow valves 1523 and 1524 were gradually opened to introduce $SiH_4(10)/H_2$ gas and oxygen gas into the flowmeters 1517 and 1518, respectively. Subsequently, the outflow valves 1529 and 1530 were gradually opened, followed by opening of the auxiliary valves 1547-1 and 1547-2. The inflow valves 1523 and 1524 were adjusted thereby so that the gas feed ratio of $SiH_4(10)/H_2$ to oxygen was 10:1. Then, while carefully reading the pirani gauge 1548, the opening of the auxiliary valves 1547-1 and 1547-2 were adjusted and the auxiliary valves 1547-1 and, 1547-2 were opened to the extent until the inner pressure in the chamber 1501 became $1 \times 10^{-2}$ torr. After the inner pressure in the chamber 1501 was stabilized, the main valve 1510 was gradually closed to narrow its opening until the indication of the pirani gauge 1548 became 0.5 torr. After confirming that the gas feeding and the inner pressure were stable, the shutter 1505 (serving also as an electrode) was closed, followed by turning on of the high frequency power source 1549, to input a high frequency power of 13.56 MHz between the electrode 1503 and the shutter 1505, thereby generating glow discharge in the chamber 1501 to provide an input power of 3 W. In order to form a-$(Si_xO_{1-x}):H_{1-y}$ under the above conditions, the same condition were maintained for one minute to form an intermediate layer. Then, the high frequency power 1549 was turned off for intermission of glow discharge, and the outflow valves 1529 and 1530 were closed.

Next, the valve 1540 of the bomb 1516 containing $SiF_4$ gas (purity: 99.999%) with $H_2$ content of 10 vol. % [hereinafter referred to as $SiF_4/H_2(10)$] and the valve 1537 of the bomb 1513 containing $B_2H_6$ gas diluted with $H_2$ to 500 vol. ppm [hereinafter referred to as $B_2H_6(500)/H_2$] were respectively opened to adjust the pressures at the output pressure gauges 1546 and 1543, respectively at 1 kg/cm², whereupon the inflow valves 1525 and 1528 were opened to introduce $SiF_4/H_2$ gas and $B_2H_6(500)/H_2$ gas into the flowmeters 1519 and 1522, respectively. Subsequently, the outflow valves 1531 and 1534 were gradually opened followed by opening of the auxiliary valve 1509. The outflow valves 1531 and 1534 were adjusted to determine the openings of the outflow valves 1531 and 1534 so that the reading on the flowmeter 1519 might be 1/70 of the flow amount of $SiF_4/H_2(10)$ followed by stabilization.

Subsequently, the high frequency power source 1549 was returned on the generate glow discharge. An input power was 60 W which was higher than that for the intermediate layer. After glow discharge was continued for 3 hours to form a photoconductive layer, the heater 1508 was turned off with the high frequency power source 1549 being also turned off, the substrate was left to cool to 100° C., whereupon the outflow valves 1531, 1534 and the inflow valves 1523, 1524, 1525, 1528 were closed, with the main valve 1510 fully opened, thereby to make the inner pressure in the chamber 1501 to $10^{-5}$ torr or less. Then, the main valve 1510 was closed and the inner pressure in the chamber 1501 was made atmospheric through the leak valve 1506, and the substrate having formed each layer thereon was taken out. In this case, the total thickness of the layers was about $9\mu$. The thus prepared image forming member was placed in a charge and light-exposure experimental device, and corona charge was effected at +6.0 KV for 0.2 sec., followed immediately by projection of a light image. The light image was projected through a transmission type test chart using a tungsten lamp as light source at a dosage of 1.0 lux. sec.

Immediately thereafter, a negatively charged developer (containing toner and carrier) was cascaded on the surface of the member to obtain a good toner image on the image forming member. When the toner image on the image forming member was copied on a copying paper by corona charge of +5.0 KV, there was obtained a clear image of high density which was excellent in resolution as well as in gradation reproducibility.

Next, the above image forming member was subjected to corona charge by means of a charging light-exposure experimental device at −5.5 KV for 0.2 sec., followed immediately image exposure to light at a dosage of 0.8 lux.sec., and thereafter immediately positively charged developer was cascaded on the surface of the member. Then, by copying on a copying paper and fixing, there was obtained a very clear and sharp image.

As apparently seen from the above result, in combination with the previous result, the image forming member for electrophotography obtained in the present Example has the characteristics of a both-polarity image forming member having no dependency on the charge polarity.

EXAMPLE 36

The image forming members shown by Sample Nos. E1 through E8 were prepared under the same conditions and procedures as described in Example 35 except that the sputtering time in forming the intermediate layer on the molybdenum substrate was varied as shown below in Table 17, and image formation was effected by placing in entirely the same device as described in Example 35 to obtain the results as shown in Table 17.

TABLE 17

| Sample No. | E1 | E2 | E3 | E4 | E5 | E6 | E7 | E8 |
|---|---|---|---|---|---|---|---|---|
| Time for formation of intermediate layer (sec.) | 10 | 30 | 50 | 180 | 420 | 600 | 1000 | 1200 |
| Image quality: | | | | | | | | |
| Charge polarity ⊕ | Δ | ○ | ◉ | ◉ | ◉ | ○ | Δ | X |
| Charge polarity ⊖ | X | Δ | ◉ | ◉ | ◉ | ○ | Δ | X |

Ranks for evaluation:
◉ excellent
○ good
Δ practically usable
X not good
Film deposition speed of intermediate layer: 1 Å/sec.

As apparently seen from the results shown in Table 17, it is necessary to form a intermediate layer having a thickness within the range of from 30 Å to 1000 Å.

EXAMPLE 37

The image forming members as shown by Sample Nos. E9 through E15 were prepared under the same conditions and procedures as described in Example 35 except that the gas flow amount ratio of $SiH_4(10)/H_2$ to $O_2$ was varied as shown below in Table 18, and image formation was effected by placing in the same device as in Example 35 to obtain the results shown in Table 18. For only Sample Nos. E11 through E15, intermediate layers were analyzed by electron microbe method to give the results as shown in Table 19.

As apparently seen from the results in Tables 18 and 19, it is desirable to form an intermediate layer in which the ratio of Si to O, x is within the range of from 0.33 to 0.40.

TABLE 18

| Sample No. | E9 | E10 | E11 | E12 | E13 | E14 | E15 |
|---|---|---|---|---|---|---|---|
| $SiH_4(10)/H_2:O_2$ (gas flow amount ratio) | 100:1 | 100:2 | 100:4 | 100:6 | 100:8 | 10:1 | 10:1.5 |
| Copied image quality: | | | | | | | |
| Charge polarity ⊕ | X | X | X | Δ | ◉ | ◉ | ◉ |
| Charge polarity ⊖ | X | X | X | Δ | ◉ | ◉ | ◉ |

TABLE 19

| | $Si_xO_{1-x}$ | | | | |
|---|---|---|---|---|---|
| Sample No. | E11 | E12 | E13 | E14 | E15 |
| x | 0.45 | 0.40 | 0.36 | 0.33 | 0.33 |

EXAMPLE 38

A substrate of molybdenum was fixed in the same manner as described in Example 35. Subsequently, an intermediate layer was formed in the same procedures as described in Example 35. Thereafter, the valves 1535 and 1536 were closed. Then the auxiliary valves 1547-1, 1547-2 and then the outflow valves 1529, 1530 and the inflow valves 1523, 1524 were fully opened to effect degassing sufficiently in the flowmeters 1517 and 1518. After closing the auxiliary valves 1547-1 and 1547-2, and the valves 1529, 1530, 1523 and 1524 were closed, the valve 1540 of the bomb 1516 containing $SiF_4/H_2(10)$ was opened and the pressure at the outlet pressure gauge 1546 was adjusted to 1 kg/cm², followed by opening gradually the inflow valve 1528 to introduce the $SiF_4/H_2(10)$ gas into the flowmeter 1522.

Subsequently, the outflow valve 1534 gradually opened. Next, while reading carefully the pirani gauge 1541, the opening of the auxiliary valves 1547-1 and 1547-2 were adjusted and it was opened until the inner pressure in the chamber 1501 became $1\times10^{-2}$ torr. After the inner pressure in the chamber was stabilized, the main valve 1510 was gradually closed to narrow its opening until the indication on the pirani gauge 1541 became 0.5 torr. Confirming stabilization of gas feeding and of inner pressure, the shutter 1505 (serving as an electrode) was closed, followed by turning on the high frequency power source 1549 to input a high frequency power of 13.56 MHz between the electrode 1503 and the shutter 1505, thereby generating glow discharge in the chamber 1501, to provide an input power of 60 W. Glow discharge was further continued for 5 hours to form a photoconductive layer, and thereafter the heater 1508 was turned off, and also the high frequency power source 1549 turned off. Upon cooling of the substrate to a temperature to 100° C., the outflow valve 1534 and the inflow valve 1528 were closed, with full opening of the main valve 1510 to evacuate the chamber 1501 to $10^{-5}$ torr or less. Thereafter, the main valve 1510 was closed, and the inner pressure in the chamber 1501 was made to atmospheric through the leak valve 1506, and the substrate having formed respective layers was taken out. In this case, the total thickness of the layers was found to be about 15μ. The thus prepared image forming member was subjected to image formation on a copying paper under the same conditions and procedures as described in Example 35. As a result, the image formed by $\ominus$ corona discharge was better in quality and very clear as compared with that formed by $\oplus$ corona discharge. The results show that the image forming member prepared in this Examples is dependent on the charge polarity.

EXAMPLE 39

After conducting formation of an intermediate layer for one minute on a molybdenum substrate according to the same procedures under the same conditions as described in Example 35. Thereafter, the high frequency power source 1549 was turned off for intermission of glow discharge. Under this state, the outflow valves 1529, 1530 were closed, and the valve 1540 of the bomb 1516 of SiF$_4$/H$_2$(10) and the valve 1538 of the bomb 1514 containing PF$_5$ gas diluted to 250 vol. ppm with H$_2$ [hereinafter referred to as PF$_5$(250)/H$_2$] were opened. Then, the inflow valves 1528 and 1526 were opened to introduce SiF$_4$/H$_2$(10) and PF(250)/H$_2$ into the flowmeters 1522 and 1520. The outflow valves 1534 and 1532 were adjusted to determine the openings of the outflow valves 1534 and 1532 so that the reading on the flowmeter 1520 may be 1/60 of the flow amount of SiF$_4$/H$_2$(10) gas followed by stabilization.

Subsequently, the high frequency power source was turned on to recommence glow discharge. The input power was 60 W, which was higher than that in formation of the intermediate layer. After glow discharge was continued for additional 4 hours to form a photoconductive layer, the heater 1508 was turned off with the high frequency power source 1549 being also turned off, the substrate was left to cool to 100° C., whereupon the outflow valves 1534, 1532 and the inflow valves 1523, 1524, 1526, 1528 were closed, with the main valve 1510 fully opened, thereby to make the inner pressure in the chamber 1501 to $10^{-5}$ torr or less. Then, the main valve 1510 was closed and the inner pressure in the chamber 1501 was made atmospheric through the leak valve 1506, and the substrate having formed each layer thereon was taken out. In this case, the total thickness of the layers was about 11μ.

The thus prepared image forming member was subjected to image formation on a copying paper according to the same procedures under the same conditions as described in Example 35. As a result, the image formed by $\ominus$ corona discharge was better in quality and very clear, as compared with that formed by $\oplus$ corona discharge. The results show that the image forming member prepared in this Examples is dependent on the charge polarity.

EXAMPLE 40

The intermediate layer and the photoconductive layer were formed on the molybdenum substrate under the same condition according to the same procedures as described in Example 35, except that, after formation of the intermediate layer on the molybdenum substrate, the feed gas ratio of B$_2$H$_6$(500)/H$_2$ gas to SiF$_4$/H$_2$(10) gas was changed to 1:15 in forming the photoconductive layer.

The thus prepared image forming member for electrophotography was subjected to image formation on a copying paper under the same conditions and procedures as in Example 35. As a result, the image formed by $\oplus$ corona discharge was better in quality and very clear, as compared with that formed by $\ominus$ corona discharge. This result shows that the image forming member prepared in this Example is dependent on the charge polarity. But the charge polarity dependency was opposite to those of the image forming members obtained in Examples 38 and 39.

EXAMPLE 41

A molybdenum plate 1509 was fixed firmly on a fixing member 1503 disposed at a predetermined position in a deposition chamber 1501 in a similar manner to that described in Example 35. The target 1504 was used high purity SiO$_2$. After confirming that all the valves in the system were closed, the main valve 1510 was fully opened, and the chamber 1501 was evacuated to about $5\times10^{-6}$ torr. Thereafter, the input voltage for the heater 1508 was elevated by varying the input voltage while detecting the substrate temperature until the temperature was stabilized constantly at 200° C. This step was followed by opening the auxiliary valves 1547-1, 1547-2 and the outflow valves 1529, 1531, 1533 and 1534 to remove sufficiently the gases in the flowmeters 1517, 1519, 1521 and 1522, and thereafter the outflow valves 1529, 1531, 1533, 1534 and the auxiliary valves 1547-1, 1547-2 were closed. The valve 1539 of the bomb 1515 containing argon gas (purity: 99.999%) with H$_2$ content of 30 vol. % (hereinafter referred to as Ar/H$_2$(30) was opened until the reading on the outlet pressure gauge 1545 was adjusted to 1 kg/cm$^2$, and then the inlet valve 1527 was opened, followed by introduction of Ar/H$_2$(30) into the flowmeter 1521. The auxiliary valves 1547-1, 1547-2 and the outflow valve 1533 were gradually opened until the indication on the pirani gauge 1548 became $5\times10^{-4}$ torr, which state was maintained until the flow amount was steady. Thereafter, the main valve 1510 was gradually closed to narrow the opening to adjust the inner pressure in the chamber at $1\times10^{-2}$ torr. With the shutter 1505 opened by operation of the shutter bar 1507, the flowmeter 1521 was confirmed to be stabilized, whereupon the high frequency power was turned on to input an alternate current of 13.56 MHz, 100 W between the target 1504 and the fixing member 1503. Under these conditions, a layer was formed while taking matching so that stable discharging may be continued. In this manner, discharge was continued for one minute to form an intermediate layer of a thickness of 60 Å. Then, the high frequency power source 1549 was turned off for intermission of discharge. Subsequently, the outflow valve 1533 was closed and the main valve 1510 fully opened to discharge the gas in the chamber 1501 until it was evacuated to $5 \times 10^{-7}$ torr.

Then, the valve 1539 was closed, and the auxiliary valves 1547-1 and 1547-2, subsequently the outflow valve 1533 and the inflow valve 1527, were opened fully to effect degassing sufficiently in the flowmeter 1521 to vacuo. After closing the auxiliary valves 1547-1 and 1547-2, the valve 1540 of the bomb 1516 containing $SiF_4/H_2(10)$ and the valve 1537 of the bomb 1513 containing $B_2H_6(500)/H_2$ were respectively opened to adjust the pressures at the outlet pressure gauges 1546 and 1543, respectively, at 1 kg/cm$^2$, whereupon the inflow valves 1528 and 1525 were gradually opened to permit $SiF_4/H_2(10)$ gas and $B_2H_6(500)/H_2$ gas to flow into the flowmeters 1522 and 1519, respectively. Subsequently, the outflow valves 1534 and 1531 were gradually opened, followed by opening of the auxiliary valves 1547-1 and 1547-2. The inflow valves 1528 and 1525 were adjusted thereby so that the gas feed ratio of $SiF_4/H_2(10)$ to $B_2H_6(500)/H_2$ was 70:1. Then, while carefully reading the pirani gauge 1548, the opening of the auxiliary valves 1547-1 and 1547-2 were adjusted and the auxiliary valves 1547-1 and 1547-2 were opened to the extent until the inner pressure in the chamber 1501 became $1 \times 10^{-2}$ torr. After the inner pressure in the chamber 1501 was stabilized, the main valve 1510 was gradually closed to narrow its opening until the indication on the pirani gauge 1548 became 0.5 torr. After confirming that the gas feeding and the inner pressure were stable, the shutter 1505 was closed, followed by turning on the high frequency power source 1549, to input a high frequency power of 13.56 MHz between the electrodes 1503 and 1505, thereby generating glow discharge in the chamber 1501 to provide an input power of 60 W. After glow discharge was continued for 3 hours to form a photoconductive layer, the heater 1508 was turned off with the high frequency power source 1549 being also turned off, the substrate is left to cool to 100° C. whereupon the outflow valves 1531, 1534 and the inflow valves 1525, 1527 and 1528 were closed, with the main valve 1510 fully opened, thereby to make the inner pressure in the chamber 1501 to less than $10^{-5}$ torr. Then, the main valve 1510 was closed and the inner pressure in the chamber was made atmospheric through the leak valve 1506, and the substrate having formed each layer thereon was taken out. In this case, the entire thickness of the layers was about 9μ. The thus prepared image forming member was placed in an experimental device for charge and exposure to light, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member. When the toner image on the image forming member for electrography was copied on a copying paper by corona charge at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear image.

As apparently seen from the above results, in combination with the previous result, the image forming member for electrophotography obtained in the present Example has the characteristics of a both-polarity image forming member having no dependency on the charged polarity.

EXAMPLE 42

In place of the substrate of molybdenum, Corning 7059 glass (1 mm thick, 4×4 cm, polished on both surface) with cleaned surfaces, having on one surface ITO in thickness of 1000 Å deposited by the electron beam vapor deposition method, was placed on the support 1503 in the same device as used in Example 35 (FIG. 15) with the ITO-deposited surface as under surface.

An intermediate layer and a photoconductive layer were formed on the ITO deposited surface according to the same procedure and under the same conditions as described in Example 35 except for the above-mentioned substrate. The thus prepared image forming member was placed in an experimental device for charging and exposure to light, and corona charge was effected at ⊕6.0 KV for 0.2 sec., followed immediately by projection of a light image. The light image was irradiated through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member was copied on a copying paper by corona charge of ⊕5.0 KV, there was obtained a clear image of high density which was excellent in resolving power as well as in gradation reproducibility.

Similar clear and sharp images were also obtained when the corona charge polarity was charged to ⊖ and the polarity of the developer to ⊕.

EXAMPLE 43

After conducting formation of an intermediate layer for one minute and then formation of a photoconductive layer for 5 hours on a molybdenum substrate according to the same procedures under the same conditions as in Example 35, the high frequency power source 1549 was turned off for intermission of glow discharge. Under this state, the outflow valves 1531 and 1534 were closed and the outflow valves 1529 and 1530 were opened again, thus creating the same conditions as in formation of the intermediate layer. Subsequently, the high frequency power source was turned on to recommence glow discharge. The input power was 3 W, which was also the same as in formation of the intermediate layer. Thus, glow discharge was continued for 2 minutes to form a upper layer on the photoconductive layer. Then, the heater 1508 and the high frequency power source 1549, were turned off and the substrate was left to cool. Upon reaching 100° C. of the substrate temperature, the outflow valves 1529, 1530 and the inflow valves 1523, 1524, 1525, 1528 were closed, with full opening of the main valve 1510, thereby evacuating the chamber 1501 to $1\times10^{-5}$ torr or below. Then, the main valve 1510 was closed to return the chamber 1501 to atmospheric through the leak valve 1506 so as to be ready to take out the substrate having formed respective layers.

Using the thus prepared image forming member, toner images were formed similarly to that described in Example 35. As the results, there were obtained images excellent in resolution, gradation and image density, with respect to both combinations of ⊖6 KV charge/positively charged developer and of ⊕6 KV charge/negatively charged developer.

EXAMPLE 44

After the SiF$_4$/H$_2$(10) gas bomb 1516 had been replaced with a bomb containing SiF$_4$ (purity: 99.999%) with Ar content of 5 vol.% [hereinafter referred to as SiF$_4$/Ar(5)], an intermediate layer was provided on a molybdenum substrate in a similar way to described in Example 35, followed by degassing the gas from the chamber 1501. Then, the valve 1540 of the SiF$_4$/Ar(5) bomb 1516 was opened to adjust the outlet pressure to 1 kg/cm$^2$ by the outlet pressure gauge 1546. Subsequently, the inflow valve 1528 was gradually opened to let in the SiF$_4$/Ar(5) gas into the flowmeter 1522, followed by gradual opening of the outflow valve 1534 and then the auxiliary valves 1547-1 and 1547-2.

The outflow valve 1534 was adjusted by detecting the inner pressure in the chamber 1501 by the pirani gauge 1548 to $10^{-2}$ torr. After the flow amount was stabilized under this state, the main valve 1510 was gradually closed to narrow the opening until the inner pressure in the chamber became $0.5\times10^{-2}$ torr.

After confirming closing of the shutter 1505 and stabilization of flowmeter 1522, the high frequency power source 1549 was turned on to input an alternate current of 13.56 MHz, 60 W, between the shutter 1505 and the fixing member 1503. Matching was taken so that stable glow discharge was continued under these conditions to form a layer. After glow discharge was continued for 3 hours, the heater 1508 was turned off with the high frequency power source 1549 being also turned off, the substrate was left to cool to 100° C., whereupon the outflow valve 1534 and the auxiliary valves 1547-1 and 1547-2 were closed, with the main valve 1510 fully opened, thereby to draw out gas in the chamber. Then, the main valve 1510 was closed and the inner pressure in the chamber was made atmospheric with opening the leak valve 1506, and the substrate having formed each layer thereon was taken out.

The thus prepared image forming member was used for forming the image on a copying paper according to the same procedures under the same conditions as described in Example 35, wherein the image formed by ⊖ corona discharge was more excellent and clear, as compared with that formed by ⊕ corona discharge. From the results, the image forming member prepared in this Example was recognized to have a dependency on the charge polarity.

EXAMPLE 45

Formation of an intermediate layer was carried out for one minute on each of ten molybdenum substrate according to similar procedures and under similar conditions to those described in Example 35, and formation of a photoconductive layer was carried out for five hours on each above mentioned intermediate layer. Thereafter, each upper layer shown in Table 20 was formed on each above-mentioned photoconductive layer.

In the case of Sample F16, the gas bomb 1514 of PF$_5$(250)/H$_2$ was previously replaced with a gas bomb of C$_2$H$_4$(10)/H$_2$, and the gas flow amount ratio of SiH$_4$(10)/H$_2$ to C$_2$H$_4$(10)/H$_2$ was 1:9.

In the case of Sample F17, the gas bomb 1514 of PF$_5$(250)/H$_2$ was previously replaced with a gas bomb of high purity nitrogen gas (purity: 99.999%), and the gas flow amount ratio of SiH$_4$(10)/H$_2$ to the nitrogen gas was 1:10.

In the case of Sample F18, the gas bomb 1514 of PH$_5$(250)/H$_2$ was previously replaced with a gas bomb of NH$_3$(10)/H$_2$, and the gas flow amount ratio of SiH$_4$(10)/H$_2$ to NH$_3$(10)/H$_2$ was 1:2.

In the cases of Samples F16, F17 and F18, and upper layer was formed under the same conditions and according to the same procedure as described in Example 44 except for the above-mentioned conditions.

In the case of Sample F19, the gas bomb 1514 of PF$_5$(250)/H$_2$ was previously replaced with a gas bomb of C$_2$H$_4$(10)/H$_2$, and the flow amount ratio of SiF$_4$/H$_2$(10) to C$_2$H$_4$(10)/H$_2$ was 1:9.

In the case of Sample F20, the gas bomb 1514 of PF$_5$(250)/H$_2$ was previously replaced with a gas bomb of high purity nitrogen gas (purity: 99.999%), and the flow amount ratio of SiF$_4$/H$_2$(10) to the nitrogen gas was 1:50.

In the case of Sample F21, the gas bomb 1514 of PF$_5$(250)/H$_2$ was previously replaced with a gas bomb of NH$_3$(10)/H$_2$, and the flow amount ratio of SiF$_4$/H$_2$(10) to NH$_3$(10)/H$_2$ was 1:20.

In the cases of Samples F19, F20 and F21, each upper layer was formed under the same conditions and according to the same procedure as described in Example 44 except for the above-mentioned conditions.

Further, in the case of Sample F22, the gas bomb 1514 of PF$_5$(250)/H$_2$ was previously replaced with a gas bomb of Si(CH$_3$)$_4$(10)/H$_2$, after formation of a photoconductive layer, the outflow valve 1534 was closed, and the main valve 1510 was fully opened to evacuated the inner pressure in the chamber to $5\times10^{-6}$ torr. Thereafter, Si(CH$_3$)$_4$(10)/H$_2$ was introduced into the chamber through the inflow valve 1526 and the outflow valve 1532. An upper layer was formed under the same conditions and according to the same procedures as described in Example 44 except for the above-mentioned conditions and procedures.

In the cases of Samples F23 and F24, each target was previously replaced with polycrystalline Si (purity: 99.999%) and SiN$_4$, respectively. Further, the gas bomb 1514 of PF$_5$(250)/H$_2$ was replaced with a gas bomb of N$_2$(50)/Ar.

In the case of Sample F25, the target was replaced with one in which graphite was provided on polycrystalline Si so that the area ratio might be 1:9, and the gas bomb 1514 of PF$_5$(250)/H$_2$ was replaced with a gas bomb of Ar.

In the cases of Samples F23, F24 and F25, after formation of each photoconductive layer, the inner pressure in the system was evacuated to $5 \times 10^{-7}$ torr. After all valves was closed, the valve 1538 of the bomb 1514 was opened so that the outlet pressure might be 1 kg/cm². Thereafter, the inflow valve 1526, the outflow valve 1532, and the auxiliary valves 1547-1, 1547-2 were opened to introduced gases into the chamber. The inner pressure in the chamber was brought to $5 \times 10^{-4}$ torr (the reading at the pirani gauge 1548) by adjusting the auxiliary valves 1547-1 and 1547-2. Further, the inner pressure was controlled by the main valve 1510 to $1 \times 10^{-2}$ torr, thereafter the shutter 1505 was opened by operation of the shutter bar 1507. The high frequency power source 1549 was turned on to input an alternative current power of 13.56 MHz, 100 W between the target 1504 and the fixing member 1503. Under this state, formation of an upper layer was carried out for two minutes. Thereafter, the high frequency power source was turned off, and the auxiliary valves 1547-1, 1547-2, the outflow valve 1532, and the inflow valve 1526 were closed followed by full opening of the main valve. After the inner pressure in the chamber was evacuated to $10^{-5}$ torr or less, the main valve was closed, and the inner pressure in the chamber was made atmospheric through the leak valve 1506. Then, the substrate was taken out.

Using the thus prepared image forming members F16–F25, toner images were formed in the same manner as described in Example 35. As the results, there were obtained images excellent in resolution, gradation and image density, with respect to both combination of $\ominus 6$ KV corona charge-positively charged developer and of $\oplus 6$ KV corona charge/negatively charged developer.

TABLE 20

| Sample No. | Upper layer | Starting gas or target | Flow amount ratio or area ratio | Preparation method | Power (W) | Layer thickness (Å) |
|---|---|---|---|---|---|---|
| F16 | A | SiH$_4$ (diluted with H$_2$ to 10 vol. %)<br>C$_2$H$_4$ (diluted with H$_2$ to 10 vol. %) | SiH$_4$(10)/H$_2$:<br>C$_2$H$_4$(10)/H$_2$<br>... 1:9 | Glow | 3 | 120 |
| F17 | B | SiH$_4$ (diluted with H$_2$ to 10 vol. %)<br>N$_2$ | SiH$_4$(10)/H$_2$:N$_2$<br>... 1:10 | Glow | 3 | 120 |
| F18 | C | SiH$_4$ (diluted with H$_2$ to 10 vol. %)<br>NH$_3$ (diluted with H$_2$ to 10 vol. %) | SiH$_4$(10)/H$_2$:<br>NH$_3$(10)/H$_2$<br>... 1:2 | Glow | 3 | 120 |
| F19 | D | SiF$_4$ (H$_2$ content: 10 vol. %)<br>C$_2$H$_4$ (diluted with H$_2$ to 10 vol. %) | SiF$_4$/H$_2$(10):<br>C$_2$H$_4$(10)/H$_2$<br>... 1:9 | Glow | 60 | 120 |
| F20 | E | SiF$_4$ (H$_2$ content: 10 vol. %)<br>NH$_3$ (diluted with H$_2$ to 10 vol. %) | SiF$_4$/H$_2$(10):<br>NH$_3$(10)/H$_2$<br>... 1:20 | Glow | 60 | 120 |
| A21 | F | SiF$_4$ (H$_2$ content: 10 vol. %)<br>N$_2$ | SiF$_4$/H$_2$(10):N$_2$<br>... 1:50 | Glow | 60 | 120 |
| F22 | G | Si(CH$_3$)$_4$ (diluted with H$_2$ to 10 vol. %) | — | Glow | 3 | 120 |
| F23 | H | Polycrystalline Si target<br>N$_2$ (diluted with Ar to 50 vol. %) | — | Sputtering | 100 | 200 |
| F24 | I | Si$_3$N$_4$ target<br>N$_2$ (diluted with Ar to 50 vol. %) | — | Sputtering | 100 | 200 |
| F25 | J | Polycrystalline Si target<br>Graphite target<br>Ar | C:Si = 9:1 | Sputtering | 100 | 200 |

EXAMPLE 46

Using a device shown in FIG. 13 placed in a clean room which had been completely shielded, an image forming member for electrography was prepared according to the following procedures.

A substrate 1302 of molybdenum of 10 cm square having a thickness of 0.5 mm, whose surface had been cleaned, was fixed firmly on a fixing member 1303 disposed at a predetermined position in a deposition chamber 1301. The targets 1305 was formed by high purity SiO$_2$. The substrate 1302 was heated by a heater 1304 within the fixing member 1303 with a precision of ±0.5° C. The temperature was measured directly at the backside of the substrate by an alumel-chromel thermocouple. Then, after confirming that all the valves in the system were closed, the main valve 1331 was fully opened, and evacuation was effected once to $5 \times 10^{-7}$ torr (during the evacuation, all the other valves in the system are closed). Thereafter, the input voltage for the heater 1304 was elevated by varying the input voltage while detecting the substrate temperature until the temperature was stabilized constantly at 100° C. This step was followed by opening the auxiliary valves 1329-1, 1329-2, and the outflow valves 1324, 1325, 1326 and 1328 to remove sufficiently the gases in the flowmeters 1337, 1338, 1339 and 1341, and thereafter the outflow valves 1324, 1325, 1326 and 1328 were closed. The valve 1318 of the bomb 1313 of argon gas (purity: 99.999%) containing oxygen of 20 vol.% (hereinafter referred to as O$_2$(20)/Ar) was opened until the reading on the outlet pressure gauge 1336 was adjusted to 1 kg/cm$^2$, and then the inlet valve 1323 was opened, followed by gradual opening of the outflow valve 1328. On the other hand, the valve 1315 of the bomb 1310 of SiF$_4$ containing H$_2$ of 10 vol.% (hereinafter referred to as SiF$_4$/H$_2$(10)) was opened until the reading on the outlet pressure gauge 1333 was adjusted to 1 kg/cm$^2$, and then the inlet valve 1320 was opened, followed by gradual opening of the outlet valve 1325. At this time, the flow amount ratio of SiF$_4$/H$_2$(10) to O$_2$(20)/Ar was adjusted to 1:20 by using the inflow valves 1320 and 1323.

The auxiliary valves 1329-1 and 1329-2 were opened until the indication of the pirani gauge 1342 became 5×10$^{-4}$ torr, which state was maintained until the flow amount was steady. Thereafter, the main valve 1331 was gradually closed to narrow the opening to adjust the inner pressure in the chamber at 1×10$^{-2}$ torr. With the shutter 1308 opened by operation of the shutter bar 1306, the flowmeters 1338 and 1341 were confirmed to be stabilized, whereupon the high frequency power source 1343 was turned on to input an alternate current of 13.56 MHz, 100 W between the target 1305 and the fixing member 1303. Under these conditions, a layer was formed while taking matching so that stable discharging may be continued. In this manner, discharge was continued for one minute to form an intermediate layer of a thickness of 600 Å. Then, the high frequency power source 1343 was turned off for intermission of discharge. Subsequently, the outflow valves 1325 and 1328 was closed and the main valve 1331 fully opened to discharge the gas in the chamber 1301 until it was evacuated to 5×10$^{-7}$ torr. Thereafter, the input voltage for the heater 1304 was elevated by varying the input voltage while detecting the substrate temperature until the temperature was stabilized constantly at 200° C.

After closing the auxiliary valves 1329-1 and 1329-2, the valve 1316 of the bomb 1311 containing B$_2$H$_6$ gas diluted with H$_2$ to 500 vol. ppm [hereinafter referred to as B$_2$H$_6$(500)/H$_2$] was opened to adjust the pressure at the outlet pressure gauge 1334 to 1 kg/cm$^2$, whereupon the inflow valve 1321 was gradually opened to introduce B$_2$H$_6$(500)/H$_2$ gas to flow into the flowmeter 1339. Subsequently, the auxiliary valves 1329-1, 1329-2 and the outflow valves 1325, 1326 were gradually opened. The inflow valves 1320 and 1321 were adjusted thereby so that the gas flow amount ratio of SiF$_4$/H$_2$(10) to B$_2$H$_6$(500)/H$_2$ was 70:1. Then, while carefully reading the pirani gauge 1342, the opening of the auxiliary valves 1329-1 and 1329-2 were adjusted and the auxiliary valves 1329-1 and 1329-2 were opened to the extent until the inner pressure in the chamber 1301 became 1×10$^{-2}$ torr. After the inner pressure in the chamber 1301 was stabilized, the main valve 1331 was gradually closed to narrow its opening until the indication on the pirani gauge 1342 became 0.5 torr. After confirming that the gas feeding and the inner pressure were stable, the shutter 1308 (serving also as an electrode) was closed by operation of the shutter bar 1306, followed by turning on the high frequency power source 1343, to input a high frequency power of 13.56 MHz between the electrodes 1303 and 1308, thereby generating glow discharge in the chamber 1301 to provide an input power of 60 W. After glow discharge was continued for 3 hours to form a photoconductive layer, the heater 1304 was turned off with the high frequency power source 1343 being also turned off, the substrate was left to cool to 100° C., whereupon the outflow valves 1325, 1326 and the inflow valves 1320, 1321 and 1323 were closed, with the main valve 1331 fully opened, thereby to make the inner pressure in the chamber 1301 to less than 10$^{-5}$ torr. Then, the main valve 1331 was closed and the inner pressure in the chamber was made atmospheric through the leak valve 1330, and the substrate having formed each layer thereon was taken out. In this case, the entire thickness of the layers was about 9μ. The thus prepared image forming member was placed in an experimental device for charge and exposure to light, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member. When the toner image on the image forming member was copied on a copying paper by corona charge at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear image.

As apparently seen from the above results, in combination with the previous result, the image forming member for electrophotography obtained in the present Example has the characteristics of a both-polarity image forming member having no dependency on the charged polarity.

EXAMPLE 47

The image forming members shown by Sample Nos. F1 through F8 were prepared under the same conditions and procedures as in Example 46 except that the sputtering time in forming the intermediate layer on the molybdenum substrate was varied as shown below in Table 21, and image formation was effected by placing in entirely the same device as in Example 46 to obtain the results as shown in Table 1.

TABLE 21

| Sample No. | F1 | F2 | F3 | F4 | F5 | F6 | F7 | F8 |
|---|---|---|---|---|---|---|---|---|
| Time for formation of intermediate layer (sec.) | 10 | 30 | 50 | 150 | 300 | 500 | 1000 | 1200 |
| Image quality: | | | | | | | | |
| Charge polarity ⊕ | Δ | ○ | ⊚ | ⊚ | ⊚ | ○ | Δ | X |
| Charge polarity ⊖ | X | Δ | ⊚ | ⊚ | ⊚ | ○ | Δ | X |

Ranks for evaluation:
⊚ excellent
○ good
Δ practically usable
X not good
Deposition speed of intermediate layer: 1 Å/sec.

As apparently seen from the results shown in Table 21, it is necessary to form the intermediate layer constituted of a-SiC to a thickness within the range of from 30 Å to 1000 Å.

EXAMPLE 48

The image forming members for electrophotography as shown by Sample Nos. F9 through F14 were prepared under the same conditions and procedures as described in Example 46 except that oxygen content of $O_2(20)/Ar$ gas in the bomb 1313, which was used for forming an intermediate layer, was varied as shown below in Table 22, and image formation was effected by placing in the same device as in Example 46 to obtain the results shown in Table 22. For only Sample Nos. F10 through F14, intermediate layers were analyzed by electron microbe method to give the results as shown in Table 23.

As apparently seen from the results in Tables 22 and 23, it is necessary to form an intermediate layer, in which the ratio of Si to O ranges from 0.33 to 0.40, for attain the objects of the present invention.

TABLE 22

| Sample No. | F9 | F10 | F11 | F12 | F13 | F14 |
|---|---|---|---|---|---|---|
| $O_2$ content in a bomb of $O_2$/Ar gas | 0 | 5 | 10 | 15 | 20 | 25 |
| Copied image quality: | | | | | | |
| Charge polarity ⊕ | X | X | Δ | ○ | ⊚ | ⊚ |
| Charge polarity ⊖ | X | X | Δ | ○ | ⊚ | ⊚ |

TABLE 23

| | $Si_xO_{1-x}$ | | | | |
| Sample No. | 10 | 11 | 12 | 13 | 14 |
|---|---|---|---|---|---|
| x | 0.44 | 0.40 | 0.37 | 0.33 | 0.33 |

EXAMPLE 49

After an intermediate layer was provided on a molybdenum substrate according to the same procedures as used in Example 46, the high frequency power source 1343 was turned off, and the outflow valve 1328 was closed, followed by closing of the shutter 1308. The input voltage for the heater 1304 was increased by varying the input voltage while detecting the substrate temperature, until it was constant at 200° C.

Thereafter, the outflow valve 1325 and the inflow valve 1320 were opened fully to effect evacuation to vacuum also in the flowmeter 1338. After closing the inflow valve 1320 and the outflow valve 1325, the valve 1315 of the bomb 1310 containing $SiF_4/H_2(10)$ was opened and the pressure at the outlet pressure gauge 1333 was adjusted to 1 kg/cm², followed by opening gradually the inflow valve 1320 to introduce the $SiF_4/H_2(10)$ gas into the flowmeter 1338. Subsequently, the outflow valve 1325 was opened gradually and then the auxiliary valve 1329-1 gradually opened. Next, while reading carefully the pirani gauge 1342, the opening of the auxiliary valve 1329-1 was adjusted and it was opened until the inner pressure in the chamber 1301 became $1 \times 10^{-2}$ torr. After the inner pressure in the chamber 1301 was stabilized, the main valve 1331 was gradually closed to narrow its opening until the indication on the pirani gauge 1342 became 0.5 torr. Confirming stabilization of gas feeding and of inner pressure, the shutter 1308 was closed by operation of the shutter bar 1306, followed by turning on the high frequency power source 1343 to input a high frequency power of 13.56 MHz between the electrodes 1308 and 1303, thereby exciting glow discharge in the chamber 1301, to provide an input power of 60 W. Glow discharge was continued for 3 hours to form a photoconductive layer, and thereafter the heater 1304 was turned off, and also the high frequency power source 1343 turned off. Upon cooling of the substrate to a temperature to 100° C., the outflow valve 1325 and the inflow valve 1320 were closed, with full opening of the main valve 1331 to evacuate the chamber 1301 to $5 \times 10^{-7}$ torr or less. Thereafter, the main valve 1331 was closed, and the inner pressure in the chamber 1301 was brought to atmospheric through the leak valve 1330, and the substrate having formed respective layers was taken out. In this case, the total thickness of the layers was found to be about 9μ. The thus prepared image forming member was subjected to image formation on a copying paper in a similar way to that described in Example 46. As a result, the image formed by ⊖ corona discharge was better in quality and very clear, as compared with that formed by ⊕ corona discharge. The results show that the image forming member prepared in this Examples is dependent on the charging polarity.

EXAMPLE 50

After an intermediate layer was formed for one minute on a molybdenum substrate using conditions and procedures similar to those of Example 46, the deposition chamber was evacuated to $5 \times 10^{-7}$ torr, whereupon $SiF_4/H_2(10)$ gas alone was introduced into the deposition chamber according to the same procedures as used in Example 46. Thereafter, under the gas pressure at 1 kg/cm² (reading on the outlet pressure gauge 1335) through the valve 1317 and the inflow valve 1322 from bomb 1312 containing $PF_5$ gas diluted to 250 vol. ppm [hereinafter referred to as $PF_5(250)/H_2$], the inflow valve 1322 and the outflow valve 1327 were adjusted to determine the opening of the outflow valve 1327 so that the reading on the flowmeter 1340 may be 1/60 of the flow amount of $SiF_4/H_2(10)$, followed by stabilization.

Subsequently, with the shutter 1308 closed by using the shutter bar 1306 and the high frequency power source 1343 turned on, the glow discharge was recommenced. The input voltage applied thereby was 60 W. Thus, glow discharge was continued for additional 4 hours to form a photoconductive layer. The input power of the heater 1304 was decreased and the high frequency power source 1343 was then turned off, and, upon cooling of the substrate to 100° C., the outflow valves 1327 and 1325, and the inflow valves 1322 and 1320 were closed, with full opening of the main valve 1331 to evacuate the chamber 1301 to about $5 \times 10^{-7}$ torr, followed by leaking of the chamber 1301 to atmospheric through the leak valve 1330 with closing of the main valve 1331. Under such a state, the substrate having formed layers thereon was taken out. In this case, the total thickness of the layers formed was about 11μ.

The thus prepared image forming member for electrophotography was used for forming the image on a copying paper according to the same procedures under the same conditions as used in Example 46, whereby the image formed by ⊖ corona discharge was more excellent and clear, as compared with that formed by ⊕ corona discharge. From the results, the image forming member prepared in this Example was recognized to have a dependency on the charging polarity.

EXAMPLE 51

After an intermediate layer was formed for one minute on a molybdenum substrate using conditions and procedures similar to Example 46, the deposition chamber was evacuated to $5 \times 10^{-7}$ torr, whereupon $SiF_4/H_2(10)$ gas alone was introduced into the deposition chamber according to the same procedures as in Example 46. Thereafter, under the gas pressure at 1 kg/cm$^2$ (reading on the outlet pressure gauge 1334) through the valve 1316 and the inflow valve 1321 from $B_2H_6(500)/H_2$ bomb 1311, the inflow valve 1321 and the outflow valve 1326 were adjusted to determine the opening of the outflow valve 1326 so that the reading on the flowmeter 1339 may be 1/15 of the flow amount of $SiF_4/H_2(10)$, followed by stabilization.

Subsequently, with the shutter 1308 closed by operation of the shutter bar 1306 and the high frequency power source 1343 turned on, the glow discharge was recommenced. The input voltage applied thereby was 60 W. Thus, glow discharge was continued for additional 4 hours to form a photoconductive layer on the intermediate layer. The input power of the heater 1304 was decreased and the high frequency power source 1343 was then turned off, and, upon cooling of the substrate to 100° C., the outflow valves 1325, 1326 and the inflow valves 1320, 1321 were closed, with full opening of the main valve 1331 to evacuate the chamber 1301 to about $5 \times 10^{-7}$ torr, followed by leaking of the chamber 1301 to atmospheric through the leak valve 1330 with closing of the main valve 1331. Under such a state, the substrate having formed layers thereon was taken out. In this case, the total thickness of the layers formed was about 10$\mu$.

The thus prepared image forming member was used for forming the image on a copying paper according to the same procedures under the same conditions as in Example 46, whereby the image formed by $\oplus$ corona discharge was more excellent and clear, as compared with that formed by $\ominus$ corona discharge. From the results, the image forming member prepared in this Example was recognized to have a dependency on the charge polarity, however the dependency was opposite to those in the image forming members obtained in Examples 49 and 50.

EXAMPLE 52

Example 49 was repeated except that a bomb 1309 containing $SiF_4$ gas (purity: 99.999%) with Ar content of 5 vol. % (hereinafter referred to as $SiF_4/Ar(5)$) was used in place of the bomb 1310 of $SiF_4/H_2(10)$, thereby to form an intermediate layer and a photoconductive layer on a molybdenum substrate. Then, taking out from the deposition chamber 1301, the image forming member prepared was subjected to the test for image formation by placing in the same experimental device for charging and exposure to light similarly to that of in Example 49. As a result, in case of the combination of $\ominus$5.5 KV corona discharge with a $\oplus$ charged developer, a toner image of very high quality with high contrast was obtained.

EXAMPLE 53

Formation of an intermediate layer was carried out for one minute on each of ten molybdenum substrates according to similar procedures and similar conditions to those described in Example 46, and formation of a photoconductive layer was carried out for five hours on each above-mentioned intermediate layer. Thereafter, each upper layer shown in Table 4 was formed on each above-mentioned photoconductive layer.

In the case of Sample F16, the bomb 1309 containing $SiF_4/Ar(5)$ gas was previously replaced with a bomb containing $SiF_4$ gas diluted with $H_2$ to 10 vol.% (hereinafter referred to as $SiF_4(10)/H_2$), and the bomb 1312 containing $PF_5(250)/H_2$ gas was replaced by a bomb containing $C_2H_4(10)/H_2$ gas. After forming a photoconductive layer, the high frequency power source 1343 was turned off, followed by closing the inflow valves 1325 and 1326. The main valve 1331 was fully opened to evacuate the device to $5 \times 10^{-7}$ torr. Thereafter, the inflow valves 1319, 1322, and the outflow valves 1324, 1327 were opened to introduce $SiH_4(10)/H_2$ gas and $C_2H_4(10)/H_2$ gas into the chamber. The flow amount ratio of $SiH_4(10)/H_2$ gas to $C_2H_4(10)/H_2$ was adjusted to 1:9 by the inflow valves 1319 and 1322. Subsequently, the inner pressure in the chamber was adjusted to 0.5 torr by using the auxiliary valve 1329-1 and the main valve 1331. After confirming that the flow amount and the inner pressure in the chamber were stable and that the shutter was closed, the high frequency power source 1343 was turned on to input a high frequency power of 13.56 MHz, 3 W between the electrodes 1303 and 1308. After glow discharge was continued for two minutes, the high frequency power source 1343 and the heater 1304 were turned off. After the substrate was left to cool to 100° C., the outflow valves 1324 and 1327 were closed, and the main valve 1331 was fully opened to evacuate the chamber to $1 \times 10^{-5}$ torr or below. Subsequently, the main valve 1331 was closed, followed by leaking of the chamber to atmospheric pressure through the leak valve 1330, and the substrate was taken out.

In the case of Sample F17, the bomb 1309 containing $SiF_4/Ar(5)$ was previously replaced with a bomb containing $SiF_4/H_2(10)$, and the bomb 1312 containing $PF_5(250)/H_2$ was previously replaced with a bomb containing high purity $N_2$ gas (purity: 99.999%). And the flow amount ratio of $SiH_4(10)/H_2$ to $N_2$ gas was 1:10.

In the case of Sample F18, the bomb 1309 containing $SiH_4/Ar(5)$ was previously replaced with a bomb containing $SiH_4(10)/H_2$, and the bomb 1312 containing $PF_5(250)/H_2$ was replaced with a bomb containing $NH_3(10)/H_2$. And the flow amount ratio of $SiH_4(10)/H_2$ to $NH_3(10)/H_2$ was set to 1:2.

In the cases of Samples F17 and F18, the procedures for Sample F16 were repeated, except for the above-mentioned conditions, to form each upper layer.

In the case of Sample F19, the bomb 1312 containing $PF_5(250)/H_2$ was previously replaced with a bomb containing $C_2H_4(10)/H_2$ to set the flow amount ratio of $SiF_4/H_2(10)$ to $C_2H_4(10)/H_2$ to 1:9.

In the case of Sample F20, the bomb 1312 containing $PF_5(250)/H_2$ gas was replaced with a bomb containing high purity $N_2$ gas (purity: 99.999%), and the flow amount ratio of $SiF_4/H_2(10)$ to $N_2$ was set to 1:50.

In the case of Sample F21, the bomb 1312 containing $PF_5(250)/H_2$ was replaced with a bomb containing $H_3(10)/H_2$, and the flow amount ratio of $SiF_4/H_2(10)$ to $NH_3(10)/H_2$ was set to 1:20.

In the cases of Samples F19, F20 and F21, each upper layer was formed under the same conditions and according to the similar procedures as used in Example F16 except that an applied alternative current power was 60 W.

In the case of Sample F22, the bomb 1312 containing PF$_5$(250)/H$_2$ was replaced with a bomb containing Si(CH$_3$)$_4$(10)/H$_2$ gas. After forming a photoconductive layer, the outflow valves 1325 and 1326 were closed. Then, the main valve 1331 was fully opened to evacuate the chamber to 5×10$^{-7}$ torr. Thereafter, Si(CH$_3$)$_4$(10)/H$_2$ was introduced into the chamber by opening the inflow valve 1322 and the outflow valve 1327. The inner pressure in the chamber was adjusted to 0.5 torr by the auxiliary valves 1329-1, 1329-2, and the main valve 1331. After confirming stabilization of the flow amount and the inner pressure in the chamber, the high frequency power source 1343 was turned on to input a high frequency power of 13.56 MHz, 3 W between the electrode 1303 and the shutter 1308. After glow discharge was continued for two minutes, the high frequency power source 1343 and the heater 1304 were turned off. After the substrate temperature lowered to 100° C. or below, the inflow valves 1320, 1321, 1322, and the outflow valve 1327 were closed, and the main valve 1331 was fully opened to evacuate the chamber to 5×10$^{-7}$ torr. Subsequently, the main valve 1331 was closed, the inner pressure in the chamber was made atmospheric to take out the substrate.

In the cases of Samples F23 and F24, the bomb containing PF$_5$(250)/H$_2$ gas was previously replaced with a bomb containing N$_2$(50)/Ar gas. Further, in the case of Sample F23, polycrystalline Si (purity: 99.999%) was used as a target. In the case of Sample F24, high purity Si$_3$N$_4$ was used as a target. In each case, after forming a photoconductive layer, the device was evacuated to 5×10$^{-7}$ torr. After closing all valves, the valve 1317 of the bomb 1312 containing N$_2$(50)/Ar gas was opened to bring the outlet pressure to 1 kg/cm$^2$ (the reading at the outlet pressure gauge 1335). Thereafter, the inflow valve 1322, the outflow valve 1327 and the auxiliary valve 1329-1, were opened to introduce a gas into the chamber. The inner pressure in the chamber was adjusted to 5×10$^{-4}$ torr by adjusting the auxiliary valve 1329-1 (the reading at the pirani gauge 1341). Further, the inner pressure in the chamber was adjusted to 1×10$^{-2}$ torr. Thereafter, the shutter 1308 was opened by operation of the shutter bar 1306, and the high frequency power source 1343 was turned on to input an alternative current power of 13.56 MHz, 100 W between the target 1305 and the fixing member 1303. In this state, an upper layer was formed for two minutes. Thereafter, the high frequency power source 1343 was turned off, and the auxiliary valve 1329-1, the outflow valve 1327, and the inflow valve 1322 were closed, followed by opening fully the main valve 1331. After the chamber was evacuated to 5×10$^{-7}$ torr, the main valve 1331 was closed, and the inner pressure in the chamber was made atmospheric through the leak valve 1330 to take out the substrate.

In the case of Sample F25, the target of SiO$_2$ was replaced with a target of a laminate in which graphite was laminated on polycrystalline Si so that the area ratio might be 1:9. And the bomb containing O$_2$(20)/Ar was replaced with a bomb containing Ar. An upper layer was formed under the same conditions and according to the same procedures as used for Sample F24 except for the above-mentioned conditions.

Using the thus prepared image forming members, F16 through F25, toner images were formed in a similar manner described in Example 46. As the results, there were obtained images excellent in resolution, gradation and image density, with respect to both combinations of ⊖6 KV corona charge/positively charged developer and of ⊕6 KV corona charge/negatively charged developer.

TABLE 24

| Sample No. | Upper layer | Starting gas or Target | Flow amount ratio or area ratio | Preparation method | Power (W) | Layer thickness (Å) |
|---|---|---|---|---|---|---|
| F16 | A | SiH$_4$ (diluted with H$_2$ to 10 vol. %) C$_2$H$_4$ (diluted with H$_2$ to 10 vol. %) | SiH$_4$(10)/H$_2$: C$_2$H$_4$(10)/H$_2$ ... 1:9 | Glow | 3 | 120 |
| F17 | B | SiH$_4$ (diluted with H$_2$ to 10 vol. %) N$_2$ | SiH$_4$(10)/H$_2$:N$_2$ ... 1:10 | Glow | 3 | 120 |
| F18 | C | SiH$_4$ (diluted with H$_2$ to 10 vol. %) NH$_3$ (diluted with H$_2$ to 10 vol. %) | SiH$_4$(10)/H$_2$: NH$_3$(10)/H$_2$ ... 1:2 | Glow | 3 | 120 |
| F19 | D | SiF$_4$ (H$_2$ content: 10 vol. %) C$_2$H$_4$ (diluted with H$_2$ to 10 vol. %) | SiF$_4$/H$_2$(10): C$_2$H$_4$(10)/H$_2$ ... 1:9 | Glow | 60 | 120 |
| F20 | E | SiF$_4$ (H$_2$ content: 10 vol. %) NH$_3$ (diluted with H$_2$ to 10 vol. %) | SiF$_4$/H$_2$(10): NH$_3$(10)/H$_2$ ... 1:20 | Glow | 60 | 120 |
| F21 | F | SiF$_4$ (H$_2$ content: 10 vol. %) N$_2$ | SiF$_4$/H$_2$(10):N$_2$ ... 1:50 | Glow | 60 | 120 |
| F22 | G | Si(CH$_3$)$_4$ (diluted with H$_2$ to 10 vol. %) | — | Glow | 3 | 120 |
| F23 | H | Polycrystalline Si target N$_2$ (diluted with Ar to 50 vol. %) | — | Sputtering | 100 | 200 |
| F24 | I | Si$_3$N$_4$ target N$_2$ (diluted with Ar to 50 vol. %) | — | Sputtering | 100 | 200 |
| F25 | J | Polycrystalline target Graphite target | C:Si = 9:1 | Sputtering | 100 | 200 |

TABLE 24-continued

| | | | Preparation conditions | | | |
|---|---|---|---|---|---|---|
| Sample No. | Upper layer | Starting gas or Target | Flow amount ratio or area ratio | Preparation method | Power (W) | Layer thickness (A) |
| | | Ar | | | | |

What we claim is:

1. A photoconductive member comprising:
a support, a photoconductive layer constituted of an amorphous material containing silicon atoms as matrix and containing hydrogen atoms or halogen atoms, and an intermediate layer provided between them, side intermediate layer having a function to bar penetration of carriers from the said of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and oxygen atoms as constituents.

2. A photoconductive member according to claim 1, wherein said amorphous material constituting the intermediate layer contains oxygen atoms in the range of 60-67 atomic percent.

3. A photoconductive member according to claim 1, wherein said amorphous material constituting the intermediate layer further contains hydrogen atoms as a constituent.

4. A photoconductive member according to claim 3, wherein said amorphous material contains hydrogen atoms in the range of 2-35 atomic percent.

5. A photoconductive member according to claim 1, wherein said amorphous material constituting the intermediate layer contains oxygen atoms in the range of 39-66 atomic percent and further hydrogen atoms 2-35 atomic percent as a constituent.

6. A photoconductive member according to claim 1, wherein said amorphous material constituting the intermediate layer further contains halogen atoms as a constituent.

7. A photoconductive member according to claim 6, wherein said amorphous material contains halogen atoms in the range of 1-20 atomic percent.

8. A photoconductive member according to claim 1, wherein said amorphous material constituting the intermediate layer further contains hydrogen atoms and halogen atoms as constituents.

9. A photoconductive member according to claim 8, wherein said amorphous material contains halogen atoms in the range of 1-20 atomic percent and hydrogen atoms up to 19 atomic percent.

10. A photoconductive member according to claim 1, wherein said intermediate layer is electrically insulative.

11. A photoconductive member according to claim 1, wherein said photoconductive layer has resistance of at least $5 \times 10^9$ Ωcm.

12. A photoconductive member according to claim 1, wherein said photoconductive layer is 1-100 microns in thickness.

13. A photoconductive member according to claim 1, wherein said photoconductive layer contains hydrogen atoms in the range of 1-40 atomic percent.

14. A photoconductive member according to claim 1, wherein said photoconductive layer contains halogen atoms in the range of 1-40 atomic percent.

15. A photoconductive member according to claim 1, wherein said photoconductive layer contains hydrogen atoms and halogen atoms in the range of 1-40 atomic percent in total.

16. A photoconductive member according to claim 1, wherein said photoconductive layer contains n-type impurity.

17. A photoconductive member according to claim 16, wherein said n-type impurity is an element in Group V A of the periodic table.

18. A photoconductive member according to claim 17, wherein said element in Group V A of the periodic table is selected from N, P, As, Sb and Bi.

19. A photoconductive member according to claim 16, wherein said photoconductive layer contains n-type impurity in the range of $10^{-8}$–$10^{-3}$ atomic ratio based on silicon atoms.

20. A photoconductive member according to claim 1, wherein said photoconductive layer contains p-type impurity.

21. A photoconductive member according to claim 20, wherein said p-type impurity is an element in Group III A of the periodic table.

22. A photoconductive member according to claim 21, wherein said element in Group III A is selected from B, Al, Ga, In and Tl.

23. A photoconductive member according to claim 20, wherein said photoconductive layer contains p-type impurity in the range of $10^{-6}$–$10^{-3}$ atomic ratio based on silicon atoms.

24. A photoconductive member according to claim 1, wherein an upper layer is provided on the upper surface of said photoconductive layer.

25. A photoconductive member according to claim 24, wherein said upper layer is composed of an amorphous material containing silicon atoms as matrix.

26. A photoconductive member according to claim 25, wherein said amorphous material further contains as constitution element at least one selected from the group consisting of carbon, oxygen and nitrogen atoms.

27. A photoconductive member according to claim 25 or 26, wherein said amorphous material further contains hydrogen atoms or halogen atoms as a constituent.

28. A photoconductive member according to claim 26, wherein said amorphous material contains carbon atoms in the range of 60-90 atomic percent.

29. A photoconductive member according to claim 25, wherein said upper layer contains oxygen atoms in the range of 39-66 atomic percent and hydrogen atoms in the range of 2-35 atomic percent.

30. A photoconductive member according to claim 25, wherein said upper layer contains oxygen atoms in the range of 48-66 atomic percent, halogen atoms in the range of 1-20 atomic percent and hydrogen atoms up to 19 atomic percent.

31. A photoconductive member according to claim 24, wherein said upper layer is 30-1000 Å in thickness.

32. A photoconductive member according to claim 24, wherein said upper layer is composed of inorganic insulating materials.

33. A photoconductive member according to claim 24, wherein said upper layer is composed of organic insulating materials.

34. A photoconductive member according to claim 24, wherein said upper layer is non-photoconductive with respect to visible rays.

35. A photoconductive member according to claim 24, wherein said upper layer is electrically insulative.

36. A photoconductive member according to claim 1 or 24, wherein said photoconductive member further comprises a surface protecting layer of 0.5–70 microns in thickness.

37. A photoconductive member according to claim 1, wherein said intermediate layer contains oxygen atoms in the range of 48–66 atomic percent, and further halogen atoms in the range of 1–20 atomic percent and hydrogen atoms up to 19 atomic percent.

38. A photoconductive member according to claim 1, wherein halogen atom is selected from F, Cl and Br.

39. A photoconductive member having a support, a photoconductive layer constituted of an amorphous material containing silicon atoms as matrix and containing hydrogen atoms or halogen atoms as a constituent, and an intermediate layer provided between said support and said photoconductive layer, characterized in that said intermediate layer is constituted of an amorphous material containing silicon atoms and oxygen atoms as constitution elements wherein said intermediate layer is non-photoconductive in the visible light region and is from 30–1000 A° in thickness.

40. A photoconductive member according to claim 39, wherein said amorphous material constituting the intermediate layer contains oxygen atoms in the range of 60–67 atomic percent.

41. A photoconductive member according to claim 39, wherein said amorphous material constituting the intermediate layer further contains hydrogen atoms as a constituent.

42. A photoconductive member according to claim 41, wherein said amorphous material contains hydrogen atoms in the range of 2–35 atomic percent.

43. A photoconductive member according to claim 39, wherein said amorphous material constituting the intermediate layer contains oxygen atoms in the range of 39–66 atomic percent and further hydrogen atoms 2–35 atomic percent as a constituent.

44. A photoconductive member according to claim 39, wherein said amorphous material constituting the intermediate layer further contains halogen atoms as a constituent.

45. A photoconductive member according to claim 44, wherein said amorphous material contains halogen atoms in the range of 1–20 atomic percent.

46. A photoconductive member according to claim 39, wherein said amorphous material constituting the intermediate layer further contains hydrogen atoms and halogen atoms as constituents.

47. A photoconductive member according to claim 46, wherein said amorphous material contains halogen atoms in the range of 1–20 atomic percent and hydrogen atoms up to 19 atomic percent.

48. A photoconductive member according to claim 39, wherein said intermediate layer is electrically insulative.

49. A photoconductive member according to claim 39, wherein said photoconductive layer has resistance of at least $5 \times 10^9$ $\Omega$cm.

50. A photoconductive member according to claim 39, wherein said photoconductive layer is 1–100 microns in thickness.

51. A photoconductive member according to claim 39, wherein said photoconductive layer contains hydrogen atoms in the range of 1–40 atomic percent.

52. A photoconductive member according to claim 39, wherein said photoconductive layer contains halogen atoms in the range of 1–40 atomic percent.

53. A photoconductive member according to claim 39, wherein said photoconductive layer contains hydrogen atoms and halogen atoms in the range of 1–40 atomic percent in total.

54. A photoconductive member according to claim 39, wherein said photoconductive layer contains n-type impurity.

55. A photoconductive member according to claim 54, wherein said n-type impurity is an element in Group V A of the periodic table.

56. A photoconductive member according to claim 55, wherein said element in Group V A of the periodic table is selected from N, P, As, Sb and Bi.

57. A photoconductive member according to claim 54, wherein said photoconductive layer contains n-type impurity in the range of $10^{-8}$–$10^{-3}$ atomic ratio based on silicon atoms.

58. A photoconductive member according to claim 39, wherein said photoconductive layer contains p-type impurity.

59. A photoconductive member according to claim 58, wherein said p-type impurity is an element in Group III A of the periodic table.

60. A photoconductive member according to claim 59, wherein said element in Group III A is selected from B, Al, Ga, In and Tl.

61. A photoconductive member according to claim 58, wherein said photoconductive layer contains p-type impurity in the range of $10^{-6}$–$10^{-3}$ atomic ratio based on silicon atoms.

62. A photoconductive member according to claim 39, wherein an upper layer is provided on the upper surface of said photoconductive layer.

63. A photoconductive member according to claim 62, wherein said upper layer is composed of an amorphous material containing silicon atoms as matrix.

64. A photoconductive member according to claim 63, wherein said amorphous material further contains as constitution element at least one selected from the group consisting of carbon, oxygen and nitrogen atoms.

65. A photoconductive member according to claim 63 or 64, wherein said amorphous material further contains hydrogen atoms or halogen atoms as a constituent.

66. A photoconductive member according to claim 64, wherein said amorphous material contains carbon atoms in the range of 60–90 atomic percent.

67. A photoconductive member according to claim 63, wherein said upper layer contains oxygen atoms in the range of 39–66 atomic percent and hydrogen atoms in the range of 2–35 atomic percent.

68. A photoconductive member according to claim 63, wherein said upper layer contains oxygen atoms in the range of 48–66 atomic percent, halogen atoms in the range of 1–20 atomic percent and hydrogen atoms up to 19 atomic percent.

69. A photoconductive member according to claim 62, wherein said upper layer is 30–1000 Å in thickness.

70. A photoconductive member according to claim 62, wherein said upper layer is composed of inorganic insulating materials.

71. A photoconductive member according to claim 62, wherein said upper layer is composed of organic insulating materials.

72. A photoconductive member according to claim 62, wherein said upper layer is non-photoconductive with respect to visible rays.

73. A photoconductive member according to claim 62, wherein said upper layer is electrically insulative.

74. A photoconductive member according to claim 39 or 62, wherein said photoconductive member further comprises a surface protecting layer of 0.5–70 microns in thickness.

75. A photoconductive member according to claim 39, wherein said intermediate layer contains oxygen atoms in the range of 48–66 atomic percent, and further halogen atoms in the range of 1–20 atomic percent and hydrogen atoms up to 19 atomic percent.

76. A photoconductive member having a support, a photoconductive layer constituted of an amorphous material containing silicon atoms as matrix and containing hydrogen atoms or halogen atoms as a constituent, and a non-photoconductive layer in the visible light region consituted of an amorphous material containing silicon atoms and oxygen atoms as constitution elements in contact with said photoconductive layer wherein the non-photoconductive layer is from 30–1000 Å° in thickness.

77. A photoconductive member according to claim 76, wherein the amount of oxygen atoms in said amorphous material containing oxygen atoms ranges from 60–67 atomic percent.

78. A photoconductive member according to claim 76, wherein said amorphous material containing oxygen atoms further contains hydrogen atoms as a constituent.

79. A photoconductive member according to claim 78, wherein said amorphous material contains hydrogen atoms in the range of 2–35 atomic percent.

80. A photoconductive member according to claim 76, wherein said layer contains oxygen atoms in the range of 39–66 atomic percent and hydrogen atoms from 2–35 atomic percent.

81. A photoconductive member according to claim 76, wherein said amorphous material containing oxygen atoms further contains halogen atoms as a constituent.

82. A photoconductive member according to claim 81, wherein said amorphous material contains halogen atoms in the range of 1–20 atomic percent.

83. A photoconductive member according to claim 76, wherein said amorphous material containing oxygen atoms further contains hydrogen atoms and halogen atoms as constituents.

84. A photoconductive member according to claim 83, wherein said amorphous material contains halogen atoms in the range of 1–20 atomic percent and hydrogen atoms up to 19 atomic percent.

85. A photoconductive member according to claim 76, wherein said layer containing silicon atoms and oxygen atoms is electrically insulative.

86. A photoconductive member according to claim 76, wherein said photoconductive layer has resistance of at least $5 \times 10^9$ Ωcm.

87. A photoconductive member according to claim 76, wherein said photoconductive layer is 1–100 microns in thickness.

88. A photoconductive member according to claim 76, wherein said photoconductive layer contains hydrogen atoms in the range of 1–40 atomic percent.

89. A photoconductive member according to claim 76, wherein said photoconductive layer contains halogen atoms in the range of 1–40 atomic percent.

90. A photoconductive member according to claim 76, wherein said photoconductive layer contains hydrogen atoms and halogen atoms in the range of 1–40 atomic percent in total.

91. A photoconductive member according to claim 76, wherein said photoconductive layer contains n-type impurity.

92. A photoconductive member according to claim 91, wherein said n-type impurity is an element in Group V A of the periodic table.

93. A photoconductive member according to claim 92, wherein said element in Group V A of the periodic table is selected from N, P, As, Sb and Bi.

94. A photoconductive member according to claim 91, wherein said photoconductive layer contains n-type impurity in the atomic ratio of $10^{-8}$–$10^{-3}$.

95. A photoconductive member according to claim 76, wherein said photoconductive layer contains p-type impurity.

96. A photoconductive member according to claim 95, wherein said p-type impurity is an element in Group III A of the periodic table.

97. A photoconductive member according to claim 96, wherein said element in Group III A is selected from B, Al, Ga, In, and Tl.

98. A photoconductive member according to claim 95, wherein said photoconductive layer contains p-type impurity in the atomic ratio of $10^{-6}$–$10^{-3}$.

* * * * *

UNITED STATES PATENT AND TRADEMARK OFFICE
CERTIFICATE OF CORRECTION

PATENT NO. : 4,409,308

DATED : October 11, 1983

INVENTOR(S) : Shimizu, et al.

It is certified that error appears in the above-identified patent and that said Letters Patent is hereby corrected as shown below:

Title Page, item [73] Assignee: change "Kabuskiki" to --Kabushiki--.
Col. 19, line 38, change "a-si:X..." to --a-Si:X...--.
Col. 20, line 30, change "in" to --at--.
Col. 20, line 60, after "alone" change "a" to --as--.
Col. 21, line 37, change "dishcarge" to --discharge--.
Col. 21, line 67, change "elements" to --element--.
Col. 24, line 53, change "material" to --materials--.
Col. 25, line 44, change "gage" to --gauge--.
Col. 25, line 65, change "100 A" to --100 Å--.
Col. 25, line 68, change "was" to --were--.
Col. 28, line 10, change "attain" to --attaining--.
Col. 29, line 39, after "for" insert --an--.
Col. 29, line 55, after "atmospheric" insert --pressure--.
Col. 30, line 21, after "for" insert --an--.
Col. 30, line 32, after "atmospheric" insert --pressure--.
Col. 32, lines 40-41, change "Thereafer" to --Thereafter--.
Col. 37, line 30, change "rcommenced" to --recommenced--.

UNITED STATES PATENT AND TRADEMARK OFFICE
CERTIFICATE OF CORRECTION

PATENT NO. : 4,409,308

DATED : October 11, 1983

INVENTOR(S) : Shimizu, et al.

It is certified that error appears in the above-identified patent and that said Letters Patent is hereby corrected as shown below:

```
Col. 37, line 41, after "1401" insert --brought--.
Col. 38, line 30, after "described" insert --in--.
Col. 38, line 31, change "frequencypower" to --frequency power--.
Col. 38, line 44, change "discharged" to --discharge--.
Col. 38, line 47, after "for" insert --an--.
Col. 38, line 55, after "atmospheric" insert --pressure--.
Col. 41, line 20, after "for" insert --an--.
Col. 41, line 28, after "atmospheric" insert --pressure--.
Col. 42, line 58, after "atmospheric" insert --pressure--.
Col. 44, line 54, change "100 A." to --100 Å.--.
Col. 48, line 3, after "for" insert --an--.
Col. 48, line 11, after "atmospheric" insert --pressure--.
Col. 48, line 53, after "atmospheric" insert --pressure--.
Col. 49, line 10, after "to" (second occurrence) insert --as--.
Col. 49, line 13, change "chambr" to --chamber--.
Col. 49, line 17, delete "having".
Col. 50, line 23, change "these all" to --all these--.
Col. 50, line 47, change "targe" to --target--.
Col. 50, line 58, change "substrated" --substrate--.
```

UNITED STATES PATENT AND TRADEMARK OFFICE
CERTIFICATE OF CORRECTION

PATENT NO. : 4,409,308  
DATED : October 11, 1983  
INVENTOR(S) : Shimizu, et al.

Page 3 of 3

It is certified that error appears in the above-identified patent and that said Letters Patent is hereby corrected as shown below:

```
Col. 56, line 31, after "for" insert --an--.
Col. 57, line 17, after "for" insert --an--.
Col. 57, line 29, after "atmospheric" insert --pressure--.
Col. 57, line 55, after "atmospheric" insert --pressure--.
Col. 65, line 60, after "for" insert --an--.
Col. 70, line 51, change "evacuated" to --evacuate--.
Col. 75, line 20, change "attain" to --attaining--.
Claim 1, lines 25 & 26, after "as constituents" insert
-- wherein said intermediate layer is non-photoconductive in
the visible light region and is from 30-1000 Å in thickness--.
```

Signed and Sealed this

Twenty-fourth Day of April 1984

[SEAL]

Attest:

Attesting Officer

GERALD J. MOSSINGHOFF  
Commissioner of Patents and Trademarks